(12) United States Patent
Namiki et al.

(10) Patent No.: US 8,980,534 B2
(45) Date of Patent: Mar. 17, 2015

(54) METHOD FOR FORMING FINE PATTERN, AND COATING AGENT FOR PATTERN FINING

(71) Applicant: Tokyo Ohka Kogyo Co., Ltd., Kawasaki-shi (JP)

(72) Inventors: Takumi Namiki, Kawasaki (JP); Yuriko Shirai, Kawasaki (JP); Mai Sugawara, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/739,232

(22) Filed: Jan. 11, 2013

(65) Prior Publication Data

US 2013/0183626 A1    Jul. 18, 2013

(30) Foreign Application Priority Data

Jan. 13, 2012  (JP) ................. 2012-005227

(51) Int. Cl.
*G03F 7/26* (2006.01)
*G03F 7/20* (2006.01)
*G03F 7/40* (2006.01)

(52) U.S. Cl.
CPC ... *G03F 7/20* (2013.01); *G03F 7/40* (2013.01)
USPC ......................................... 430/324; 430/325

(58) Field of Classification Search
CPC ....................................................... G03F 7/40
USPC ................................. 430/322, 324, 325, 330
See application file for complete search history.

(56) References Cited

U.S. PATENT DOCUMENTS

| | | | |
|---|---|---|---|
| 2008/0020328 A1* | 1/2008 | Sugeta et al. ................. | 430/327 |
| 2009/0269706 A1 | 10/2009 | Mimura et al. | |
| 2011/0183071 A1* | 7/2011 | Watanabe et al. ............. | 427/282 |
| 2012/0219919 A1* | 8/2012 | Thiyagarajan et al. ....... | 430/331 |

FOREIGN PATENT DOCUMENTS

JP    2008-292975 A    12/2008

* cited by examiner

*Primary Examiner* — Kathleen Duda
(74) *Attorney, Agent, or Firm* — Knobbe Martens Olson & Bear LLP

(57) ABSTRACT

A method for forming a fine pattern, including forming a resist film by applying, on a substrate, a resist composition containing a base material having a solubility, in a developer liquid including an organic solvent, that decreases according to an action of an acid, a compound which generates an acid upon irradiation, and an organic solvent; exposing the resist film; forming a resist pattern using the developer liquid; applying, on the resist pattern, a coating agent for pattern fining including a resin and an organic solvent; and heating the resist pattern on which a coating film is formed.

4 Claims, 1 Drawing Sheet

METHOD FOR FORMING FINE PATTERN, AND COATING AGENT FOR PATTERN FINING

This application claims priority under 35 U.S.C. §119(a)-(d) to Japanese Patent Application No. 2012-005227, filed Jan. 13, 2012, the entire content of which is incorporated herein by reference.

BACKGROUND OF THE INVENTION

1. Field of the Invention

The present invention relates to a method for forming a fine pattern and a coating agent for pattern fining.

2. Related Art

Methods for forming fine patterns by using resist have been used in the manufacture of various products. Particularly, further fining of resist patterns is requested in semiconductor elements, along with an enhancement of semiconductor performance, and thus, investigations are being conducted in various aspects.

As a method for forming such a fine resist pattern, there has been proposed a new negative type developing process which uses a combination of a positive type chemically amplified resist composition, that is a chemically amplified resist composition which acquires increased solubility in alkali developer liquids when exposed, and a developer liquid containing an organic solvent (see, for example, Patent Document 1). A positive type chemically amplified resist composition acquires increased solubility in alkali developer liquids when exposed, but at this time, the solubility in organic solvents is relatively decreased. Therefore, in a negative type developing process, unexposed areas of a resist film are dissolved and removed by an organic developer liquid, and thus a resist pattern is formed. Thus, it is believed that negative type developing processes are advantageous in the formation of trench patterns or hole patterns as compared with conventional positive type developing processes.

For such reasons, there has been a demand for a method for forming a finer resist pattern while advantages of a negative type developing process are maintained.

Furthermore, as a method for further fining a resist pattern formed by using a resist composition, a method of fining a resist pattern including forming a coating film by coating a commercially available coating agent such as SAFIER (registered trade mark) (manufactured by TOKYO OHKA KOGYO Co., Ltd.) on a resist pattern formed by a positive type developing process using a positive type photoresist and heating the resist pattern with a coating film formed thereon to shrink the coating film is known.

Patent Document 1: Japanese Unexamined Patent Application, Publication No. 2008-292975

SUMMARY OF THE INVENTION

However, when the resist pattern is formed by a negative type developing process as described in Japanese Unexamined Patent Application, Publication No. 2008-292975, there has been a case in which favorable fining of a resist pattern cannot be achieved even if a commercially available coating agent such as SAFIER (registered trade mark) (manufactured by TOKYO OHKA KOGYO Co., Ltd.) is used.

The present invention was achieved in view of such circumstances of the related art, and it is an object of the present invention to provide a method for forming a fine pattern, which enables favorable fining of a resist pattern formed by a negative type developing process.

The inventors of the present invention found that the problems described above can be solved according to a method for forming a fine pattern which includes:

a resist film forming step of forming a resist film by applying, on a substrate, a resist composition containing (A) a base material having a solubility, in a developer liquid including an organic solvent, that decreases according to an action of an acid, (B) a compound which generates an acid when irradiated with actinic rays or radiation, and ($C^1$) an organic solvent;

an exposure step of exposing the resist film;

a developing step of developing the exposed resist film by using the developer liquid to form a resist pattern;

a coating film forming step of forming a coating film by applying, on the resist pattern, a coating agent for pattern fining including (D) a resin and ($C^2$) a solvent composed of an organic solvent only; and a pattern narrowing step of narrowing the resist pattern by heating the resist pattern having a coating film formed thereon. Accordingly, the inventors completed the present invention. Specifically, the present invention provides the followings.

According to a first aspect of the present invention, there is provided a method for forming a fine pattern, the method including:

a resist film forming step of forming a resist film by applying, on a substrate, a resist composition containing (A) a base material having a solubility, in a developer liquid including an organic solvent, that decreases according to an action of an acid, (B) a compound which generates an acid when irradiated with actinic rays or radiation, and ($C^1$) an organic solvent;

an exposure step of exposing the resist film;

a developing step of developing the exposed resist film by using the developer liquid to form a resist pattern;

a coating film forming step of forming a coating film by applying, on the resist pattern, a coating agent for pattern fining including (D) a resin and ($C^2$) a solvent composed of an organic solvent only; and a pattern narrowing step of narrowing the resist pattern by heating the resist pattern having a coating film formed thereon.

According to a second aspect of the present invention, there is provided a coating agent for pattern fining, which is used in the method for forming a fine pattern according to the first aspect, and contains (D) a resin and ($C^2$) an organic solvent.

According to the present invention, a method for forming a fine pattern, which is capable of fining favorably a resist pattern formed by a negative type developing process, can be provided.

DETAILED DESCRIPTION OF THE INVENTION

Figure 1A:
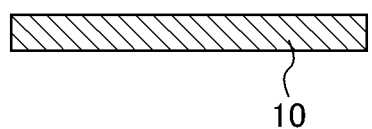
FIG. 1A is a view showing the substrate.

The method for forming a fine pattern of the present invention includes a resist film forming step, an exposure step, a developing step, and a coating film forming step, which are respectively predetermined, and may also include a coating film removing step according to necessity. The various steps will be described below in order.

Resist Film Forming Step

In the resist film forming step, a resist composition containing (A) a base material having a solubility, in a developer liquid containing an organic solvent, that decreases according to an action of an acid (hereinafter, also referred to as "component (A)"); (B) a compound which generates an acid when irradiated with actinic rays or radiation (hereinafter, also referred to as "component (B)"); and ($C^1$) an organic solvent (hereinafter, also referred to as "component ($C^1$)") is applied on a substrate, and thereby a resist film is formed.

The resist composition and a method for forming a resist film that are used in the resist film forming step will be described below in order.

Resist Composition

The component (A), component (B) and component ($C^1$) that are essentially included in the resist composition, and optional components will be described below in order.

[Component (A)]

In regard to the component (A), the "base material component" means an organic compound having a film forming ability. As the base material component, an organic compound having a molecular weight of 500 or greater is usually used. When the molecular weight is 500 or greater, the compound acquires a sufficient film forming ability, and can also easily form a resist pattern at a nanometer level. "Organic compounds having a molecular weight of 500 or greater" are roughly classified into non-polymers and polymers. As the non-polymers, usually, compounds having a molecular weight of greater than or equal to 500 and less than 4000 are used. Hereinafter, the term "low molecular weight compound" refers to a non-polymer having a molecular weight of greater than or equal to 500 and less than 4000. As the polymers, usually, compounds having a molecular weight of 1000 or greater are used. The term "polymer compound" as used in the present specification and the claims refers to a polymer having a molecular weight of 1000 or greater. In the case of a polymer compound, the "molecular weight" is defined as the weight average molecular weight measured by gel permeation chromatography (GPC) and calculated relative to polystyrene standards.

There are no particular limitations on the component (A) as long as the component has a solubility, in a developer liquid containing an organic solvent, that decreases according to an action of an acid. As a suitable compound for the component (A), a material which includes a resin (A1) having an "acid-degradable group" that is obtained by protecting a hydrophilic group of a resin having a hydrophilic group (a hydroxyl group, a carboxyl group, or the like) with an acid-dissociable protective group, is used. Examples of the resin having a hydrophilic group include a novolac resin; a resin having a constituent unit derived from hydroxystyrene (a PHS-based resin), such as polyhydroxystyrene (PHS) or a hydroxystyrene-styrene copolymer; and an acrylic resin having a constituent unit derived from an acrylic acid ester.

Here, in the present specification and the claims, the "acid-degradable group" is a group having acid-degradability, by which at least a portion of the bonds in the structure of an acid-degradable group can be cleaved according to an action of an acid (the acid generated from the component (B) upon exposure).

The "constituent unit derived from hydroxystyrene" means a constituent unit that is formed as a result of cleavage of an ethylenic double bond of hydroxystyrene.

The term "hydroxystyrene" includes hydroxystyrene in which a hydrogen atom is bonded to the carbon atom at the α-position (carbon atom to which a phenyl group is bonded), as well as a compound in which a substituent (an atom or a group other than a hydrogen atom) is bonded to the carbon atom at the α-position, and derivatives thereof. Specific examples thereof include compounds which retain at least a benzene ring and a hydroxyl group bonded to the benzene ring, and in which, for example, the hydrogen atom bonded to the α-position of hydroxystyrene is substituted by a substituent such as an alkyl group having 1 to 5 carbon atoms, a halogenated alkyl group having 1 to 5 carbon atoms, or a hydroxyalkyl group, and an alkyl group having 1 to 5 carbon atoms is further bonded to the benzene ring to which the hydroxyl group of hydroxystyrene is bonded, or one or two hydroxyl groups are bonded to the benzene ring to which the hydroxyl group of hydroxystyrene is bonded (in this case, the total number of hydroxyl groups is 2 to 3).

The "constituent unit derived from an acrylic acid ester" means a constituent unit that is formed as a result of cleavage of an ethylenic double bond of an acrylic acid ester. The term "acrylic acid ester" includes an acrylic acid ester in which a hydrogen atom is bonded to the carbon atom at the α-position (carbon atom to which a carbonyl group of acrylic acid is bonded), as well as a compound in which a substituent (an atom or a group other than a hydrogen atom) is bonded to the carbon atom at the α-position. Examples of the substituent that is bonded to the carbon atom at the α-position include an alkyl group having 1 to 5 carbon atoms, a halogenated alkyl group having 1 to 5 carbon atoms, and a hydroxyalkyl group. Meanwhile, the carbon atom at the α-position of an acrylic acid ester is, unless stated otherwise, the carbon atom to which the carbonyl group of acrylic acid is bonded.

With regard to the hydroxystyrene or the acrylic acid ester, the alkyl group as a substituent at the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group, and a neopentyl group.

Furthermore, the halogenated alkyl group as a substituent at the α-position may be, specifically, a group in which a portion or all of the hydrogen atoms of the "alkyl group as a substituent at the α-position" are substituted by halogen atoms. Examples of the halogen atoms include a fluorine atom, a chlorine atom, a bromine atom, and an iodine atom, and in particular, a fluorine atom is preferred.

Furthermore, the hydroxyalkyl group as a substituent at the a-position may be, specifically, a group in which a portion or all of the hydrogen atoms of the "alkyl group as a substituent at the α-position" are substituted by hydroxyl groups. The number of hydroxyl groups in the hydroxyalkyl group is preferably 1 to 5, and most preferably 1.

The group that is bonded to the α-position of the hydroxystyrene or the acrylic acid ester is preferably a hydrogen atom, an alkyl group having 1 to 5 carbon atoms, or a halogenated alkyl group having 1 to 5 carbon atoms; more preferably a hydrogen atom, an alkyl group having 1 to 5 carbon atoms, or a fluorinated alkyl group having 1 to 5 carbon atoms; and particularly preferably a hydrogen atom or a methyl group.

In regard to the component (A1), an acrylic acid ester-derived resin (resin (a)) will be described below.

(Resin (a) (Acrylic Acid Ester-Derived Resin))

The resin (a) includes a constituent unit (a1) derived from an acrylic acid ester containing an acid-degradable group. Also, the resin (a) preferably further includes, in addition to the constituent unit (a1), a constituent unit (a0) derived from an acrylic acid ester, which contains a —$SO_2$— moiety-containing cyclic group; and a constituent unit (a2) derived from an acrylic acid ester, which contains a lactone-containing cyclic group. It is preferable that the resin (a) further include a constituent unit (a3) derived from an acrylic acid ester containing a polar group-containing aliphatic hydrocarbon group. Furthermore, the resin (a) may also include a constituent unit (a4) derived from hydroxystyrene or a derivative thereof, and a constituent unit (a5) derived from styrene or a derivative thereof. Meanwhile, the resin (a) may include, in addition to the constituent units (a1) to (a5), various constituent units that are included in the acrylic acid ester-derived resin for conventionally used resist compositions, to the extent that the purpose of the present invention is not impaired.

[Constituent Unit (a1)]

The constituent unit (a1) is a constituent unit derived from an acrylic acid ester containing an acid-degradable group. The acid-degradable group in the constituent unit (a1) decreases the solubility of the resin (a), which is soluble in a developer liquid containing an organic solvent, in a developer liquid containing an organic solvent, when the acid-degradable group is degraded according to an action of the acid generated from the component (B) upon exposure and is converted to a hydrophilic group.

The acid-dissociable group that forms the acid-degradable group in the constituent unit (a1) can be appropriately selected from the groups that have been hitherto suggested as acid-dissociable groups for the base resins used for chemically amplified resist applications. Generally, widely known examples include a group which forms a cyclic or linear tertiary alkyl ester with the carboxy group of (meth)acrylic acid or the like; and an acetal type acid-dissociable group such as an alkoxyalkyl group.

The term "tertiary alkyl ester" indicates a structure in which the hydrogen atom of a carboxy group is substituted by a linear or cyclic alkyl group to form an ester, and a tertiary carbon atom of the linear or cyclic alkyl group is bonded to the terminal oxygen atom of the carbonyloxy group (—C(=O)—O—). When this tertiary alkyl ester is subjected to the action of an acid, the bond between the oxygen atom and the tertiary carbon atom is cut off.

Meanwhile, the linear or cyclic alkyl group may have a substituent.

Hereinafter, a group which is a tertiary alkyl ester of a carboxylic acid and is acid-dissociable will be referred to, for convenience, as "tertiary alkyl ester type acid-dissociable group".

Examples of the tertiary alkyl ester type acid-dissociable group include an acid-dissociable group containing a branched aliphatic group, and an acid-dissociable group containing an aliphatic cyclic group.

Here, the term "branched aliphatic" means that a group has a branched structure which does not have aromaticity. The structure of an "acid-dissociable group containing a branched aliphatic group" is not limited to groups composed of carbon and hydrogen (hydrocarbon groups), but the relevant group is preferably a hydrocarbon group. Furthermore, the "hydrocarbon group" may be either saturated or unsaturated, but it is usually preferable that the hydrocarbon group be saturated.

Examples of the branched aliphatic acid-dissociable group include groups represented by the formula: —$C(R^{a1})(R^{a2})(R^{a3})$. In the formula, $R^{a1}$ to $R^{a3}$ each independently represent a linear alkyl group having 1 to 5 carbon atoms. The number of carbon atoms of the group represented by the formula: —$C(R^{a1})(R^{a2})(R^{a3})$ is preferably 4 to 8. Specific examples of the group represented by —$C(R^{a1})(R^{a2})(R^{a3})$ include a tert-butyl group, a 2-methylbutan-2-yl group, a 2-methylpentan-2-yl group, and a 3-methylpentan-3-yl group, and a tert-butyl group is particularly preferred.

The term "aliphatic cyclic group" indicates that the group is a monocyclic group or a polycyclic group, both of which do not have aromaticity. The aliphatic cyclic group in the "acid-dissociable group containing an aliphatic cyclic group" may have a substituent or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms and substituted with a fluorine atom, and an oxygen atom (=O).

The structure of the basic ring obtained by eliminating substituents from an aliphatic cyclic group is not limited to a group composed of carbon and hydrogen (hydrocarbon group), but it is preferable that the ring be a hydrocarbon group. Furthermore, the hydrocarbon group may be either saturated or unsaturated, but it is usually preferable that the hydrocarbon group be saturated. The aliphatic cyclic group is preferably a polycyclic group.

Examples of the aliphatic cyclic group include a group obtainable by eliminating one or more hydrogen atoms from a monocycloalkane which may or may not be substituted with an alkyl group having 1 to 5 carbon atoms, a fluorine atom or a fluorinated alkyl group; and a group obtainable by eliminating one or more hydrogen atoms from a polycycloalkane such as a bicycloalkane, a tricycloalkane or a tetracycloalkane. More specific examples include a group obtainable by eliminating one or more hydrogen atoms from a monocycloalkane such as cyclopentane or cyclohexane; and a group obtainable by eliminating one or more hydrogen atoms from a polycycloalkane such as adamantane, norbornane, isobornane, tricyclodecane and tetracyclododecane. Furthermore, the aliphatic cyclic group may also be a group in which a portion of the carbon atoms that constitute the ring of a group obtainable by eliminating one or more hydrogen atoms from such a monocycloalkane, or the ring of a group obtainable by eliminating one or more hydrogen atoms from a polycycloalkane, are substituted by etheric oxygen atoms (—O—).

Examples of the acid-dissociable group containing an aliphatic cyclic group include:

(i) a group in which, on the ring skeleton of a monovalent aliphatic cyclic group, a substituent (an atom or a group other than a hydrogen atom) is bonded to a carbon atom which is bonded to an atom that is adjacent to the acid-dissociable group (for example, —O— in —C(=O)—O—), and thereby a tertiary carbon atom is formed; and (ii) a group having a monovalent aliphatic cyclic group and a branched alkylene having a tertiary carbon atom bonded to the monovalent aliphatic cyclic group.

In the group of the item (i), the substituent that is bonded to a carbon atom which is bonded to an atom that is adjacent to the acid-dissociable group on the ring skeleton of an aliphatic cyclic group may be, for example, an alkyl group. Examples of the alkyl group include groups such as $Ra^{a4}$ in the following formulae (1-1) to (1-9).

Specific examples of the group of the item (i) include, for example, groups represented by the following formulae (1-1) to (1-9). Furthermore, specific examples of the group of the item (ii) include, for example, groups represented by the following formulae (2-1) to (2-6).

(1-1)
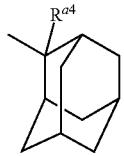

(1-2)
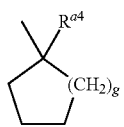

(1-3)
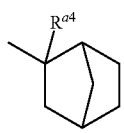

(1-4)
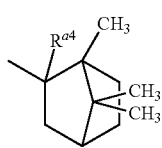

(1-5)
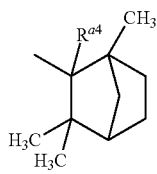

(1-6)
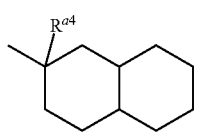

(1-7)
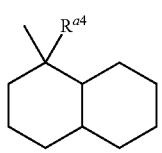

(1-8)
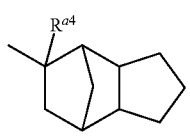

(1-9)
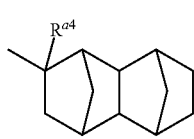

wherein in the formulae (1-1) to (1-9), $R^{a4}$ represents an alkyl group; and g represents an integer from 0 to 8.

(2-1)
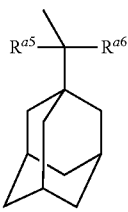

(2-2)
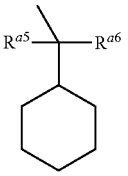

(2-3)
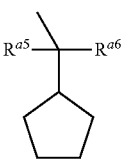

(2-4)
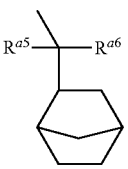

(2-5)
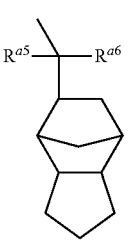

(2-6)
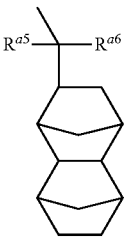

wherein in the formulae (2-1) to (2-6), $R^{a5}$ and $R^{a6}$ each independently represent an alkyl group.

The alkyl group of $R^{a4}$ is preferably a linear or branched alkyl group. The number of carbon atoms of the linear alkyl group is preferably 1 to 5, more preferably 1 to 4, and particularly preferably 1 or 2. Specific examples of the linear alkyl group include a methyl group, an ethyl group, an n-propyl group, an n-butyl group, and an n-pentyl group. Among these, a methyl group, an ethyl group, or an n-butyl group is preferred, and a methyl group or an ethyl group is more preferred.

The number of carbon atoms of the branched alkyl group is preferably 3 to 10, and more preferably 3 to 5. Specific examples of the branched alkyl group include an isopropyl group, an isobutyl group, a tert-butyl group, an isopentyl group, and a neopentyl group, and an isopropyl group is more preferred.

g is preferably an integer from 0 to 3, more preferably an integer from 1 to 3, and even more preferably 1 or 2.

Examples of the alkyl group for $R^{a5}$ and $R^{a6}$ are the same as the examples of alkyl group listed for $R^{a4}$.

In regard to the formulae (1-1) to (1-9) and (2-1) to (2-6), a portion of the carbon atoms that constitute the ring may be substituted by etheric oxygen atoms (—O—). Furthermore, in the formulae (1-1) to (1-9) and (2-1) to (2-6), the hydrogen atoms bonded to the carbon atoms that constitute the ring may be substituted by substituents. Examples of the substituents include an alkyl group having 1 to 5 carbon atoms, a fluorine atom, and a fluorinated alkyl group.

The "acetal type acid-dissociable group" is generally bonded to an oxygen atom by substituting the terminal hydrogen atom of a hydrophilic group containing oxygen, such as a carboxy group or a hydroxyl group. When an acid is generated by exposure, under the action of this acid, the bond between the acetal type acid-dissociable group and the oxygen atom to which the acetal type acid-dissociable group is bonded is cut off. The acetal type acid-dissociable group may be a group represented by the following formula (p1):

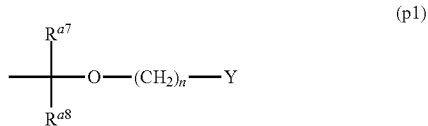

(p1)

wherein in the formula (p1), $R^{a7}$ and $R^{a8}$ each independently represent a hydrogen atom or an alkyl group having 1 to 5 carbon atoms; n represents an integer from 0 to 3; and Y represents an alkyl group having 1 to 5 carbon atoms or an aliphatic cyclic group.

In regard to the formula (p1), n is preferably an integer from 0 to 2, more preferably 0 or 1, and most preferably 0. Examples of the alkyl group for $R^{a7}$ and $R^{a8}$ include the same examples of the alkyl group described as the substituent at the α-position in the explanation on the acrylic acid ester, and a methyl group or an ethyl group is preferred, while a methyl group is most preferred.

At least one of $R^{a7}$ and $R^{a8}$ is preferably a hydrogen atom. That is, it is preferable that the acid-dissociable group (p1) be a group represented by the following formula (p1-1):

(p1-1)

wherein in the formula (p1-1), $R^{a7}$, n and Y respectively have the same meanings as $R^{a7}$, n and Y defined for the formula (p1).

Examples of the alkyl group for Y include the same examples of the alkyl group described as the substituent at the α-position in the explanation on the acrylic acid ester.

The aliphatic cyclic group of Y can be appropriately selected for use among the large number of monocyclic or polycyclic aliphatic cyclic groups that have been conventionally suggested for the applications in ArF resists and the like.

Examples thereof include the same aliphatic cyclic groups as those for the "acid-dissociable group containing an aliphatic cyclic group".

Furthermore, the acetal type acid-dissociable group may also be a group represented by the following formula (p2):

(p2)

wherein in the formula (p2), $R^{a8}$ and $R^{a9}$ each independently represent a linear or branched alkyl group, or a hydrogen atom; $R^{a10}$ represents a linear, branched or cyclic alkyl group; or $R^{a8}$ and $R^{a10}$ each independently represent a linear or branched alkylene group, and an end of $R^{a8}$ and an end of $R^{a10}$ may be bonded to form a ring.

Regarding $R^{a8}$ and $R^{a9}$, the number of carbon atoms of the alkyl group is preferably 1 to 15. When $R^{a8}$ and $R^{a9}$ are each an alkyl group, the alkyl group may be linear or branched. The alkyl group is preferably an ethyl group or a methyl group; and more preferably a methyl group. Particularly, it is preferable that any one of $R^{a8}$ and $R^{a9}$ be a hydrogen atom, and the other be a methyl group.

$R^{a10}$ represents a linear, branched or cyclic alkyl group, and the number of carbon atoms is preferably 1 to 15. When $R^{a10}$ is a linear or branched alkyl group, the number of carbon atoms is preferably 1 to 5. $R^{a10}$ is more preferably an ethyl group or a methyl group, and particularly preferably an ethyl group.

When $R^{a10}$ is cyclic, the number of carbon atoms is preferably 4 to 15, more preferably 4 to 12, and particularly preferably 5 to 10. Specific examples of $R^{a10}$ in the case where $R^{a10}$ is a cyclic alkyl group include a monocycloalkane which may or may not be substituted with a fluorine atom or a fluorinated alkyl group; and a group obtained by eliminating one or more hydrogen atoms from a polycycloalkane such as a bicycloalkane, a tricycloalkane, and a tetracycloalkane. Specific examples include groups obtainable by eliminating one or more hydrogen atoms each from monocycloalkanes such as cyclopentane and cyclohexane, or from polycycloalkanes such as adamantane, norbornane, isobornane, tricyclodecane, and tetracyclododecane. Among them, a group obtainable by eliminating one or more hydrogen atoms from adamantane is preferred.

Furthermore, in the formula (p2), $R^{a8}$ and $R^{a10}$ each independently represent a linear or branched alkylene group (preferably an alkylene group having 1 to 5 carbon atoms), and an end of $R^{a10}$ and an end of $R^{a8}$ may be bonded to each other.

In this case, a cyclic group is formed by $R^{a8}$, $R^{a10}$, the oxygen atom to which $R^{a10}$ is bonded, and the carbon atom to which an oxygen atom and $R^{a8}$ are bonded. The cyclic group is preferably a 4-membered to 7-membered ring, and more preferably a 4-membered to 6-membered ring. Specific examples of the cyclic group include a tetrahydropyranyl group and a tetrahydrofuranyl group.

More specific examples of the constituent unit (a1) include a constituent unit represented by the following formula (a1-0-1), and a constituent unit represented by the following formula (a1-0-2):

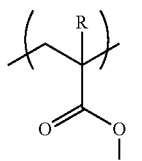

(a1-0-1)

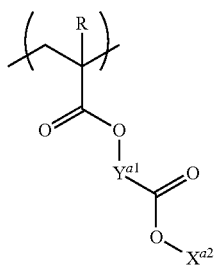

(a1-0-2)

wherein in the formulae (a1-0-1) and (a1-0-2), R represents a hydrogen atom, an alkyl group having 1 to 5 carbon atoms, or a halogenated alkyl group having 1 to 5 carbon atoms; $X^{a1}$ represents an acid-dissociable group; $Y^{a1}$ represents a divalent linking group; and $X^{a2}$ represents an acid-dissociable group.

In regard to the formula (a1-0-1), examples of the alkyl group and the halogenated alkyl group of R respectively include the same examples of the alkyl group and halogenated alkyl group described as the substituent at the α-position in the explanation on the acrylic acid ester. R is preferably a hydrogen atom, an alkyl group having 1 to 5 carbon atoms, or a fluorinated alkyl group having 1 to 5 carbon atoms; and more preferably a hydrogen atom or a methyl group.

$X^{a1}$ is not particularly limited as long as it is an acid-dissociable group, and examples thereof include the tertiary alkyl ester type acid-dissociable group and acetal type acid-dissociable group described above. A tertiary alkyl ester type acid-dissociable group is preferred.

In regard to the formula (a1-0-2), R has the same meaning as described above. $X^{a2}$ is the same as $X^{a1}$ in the formula (a1-0-1). The divalent linking group for $Y^{a1}$ is not particularly limited, and examples thereof include an alkylene group, a divalent aliphatic cyclic group, a divalent aromatic cyclic group, and a divalent linking group containing a heteroatom.

When $Y^{a1}$ is an alkylene group, the number of carbon atoms is preferably 1 to 10, more preferably 1 to 6, particularly preferably 1 to 4, and most preferably 1 to 3.

When $Y^{a1}$ is a divalent aliphatic cyclic group, examples of the aliphatic cyclic group include the same aliphatic cyclic groups as those for the "acid-dissociable group containing an aliphatic cyclic group," except that the divalent groups are groups obtainable by eliminating two or more hydrogen atoms. Particularly preferred examples of the aliphatic cyclic group for $Y^{a1}$ include groups obtainable by eliminating two or more hydrogen atoms each from cyclopentane, cyclohexane, norbornane, isobornane, adamantane, tricyclodecane, and tetracyclododecane.

When $Y^{a1}$ is a divalent aromatic cyclic group, examples of the aromatic cyclic group include a group obtainable by eliminating two hydrogen atoms from an aromatic hydrocarbon ring which may be substituted. The number of carbon atoms of the aromatic hydrocarbon ring is preferably 6 to 15. Examples of the aromatic hydrocarbon ring include a benzene ring, a naphthalene ring, a phenanthrene ring, and an anthracene ring. Among these, a benzene ring or a naphthalene ring is particularly preferred.

Examples of the substituent which may be carried by the aromatic hydrocarbon ring include a halogen atom, an alkyl group, an alkoxy group, a halogenated lower alkyl group, and an oxygen atom (=O). Examples of the halogen atom include a fluorine atom, a chlorine atom, an iodine atom, and a bromine atom.

When $Y^{a1}$ is a divalent linking group containing a heteroatom, examples of the divalent linking group containing a heteroatom include —O—, —C(=O)—O—, —C(=O)—, —O—C(=O)—O—, —C(=O)—NH—, —NH— (wherein H may be substituted by a substituent such as an alkyl group or an acyl group), —S—, —S(=O)$_2$—, —S(=O)$_2$—O—, a group represented by the formula: -A-O-B-, and groups represented by the formulae: -[A-C(=O)—O]$_{m'}$-B- and -A-O—C(=O)-B-. Here, in the formulae -A-O-B-, -[A-C(=O)—O]$_{m'}$-B-, and -A-O—C(=O)-B-, A and B each independently represent a divalent hydrocarbon group which may be substituted; —O— represents an oxygen atom; and m' represents an integer from 0 to 3.

When $Y^{a1}$ is —NH—, this H may be substituted by a substituent such as an alkyl group or an acyl group. The number of carbon atoms of the substituent (an alkyl group, an acyl group or the like) is preferably 1 to 10, more preferably 1 to 8, and particularly preferably 1 to 5.

When $Y^{a1}$ is -A-O-B-, -[A-C(=O)—O]$_{m'}$-B-, or -A-O—C(=O)-B-, A and B each independently represent a divalent hydrocarbon group which may be substituted. The phrase that a hydrocarbon group "has(have) a substituent" implies that a portion or all of the hydrogen atoms in the hydrocarbon group are substituted by an atom or a group other than a hydrogen atom.

The hydrocarbon group for A may be an aliphatic hydrocarbon group, or may be an aromatic hydrocarbon group. The aliphatic hydrocarbon group means a hydrocarbon group which does not have aromaticity. The aliphatic hydrocarbon group for A may be saturated or may be unsaturated. Usually, it is preferable that the aliphatic hydrocarbon group be saturated.

Specific examples of the aliphatic hydrocarbon group for A include linear or branched aliphatic hydrocarbon groups, and aliphatic hydrocarbon groups containing a ring in the structure. The number of carbon atoms of a linear or branched aliphatic hydrocarbon group is preferably 1 to 10, more preferably 1 to 8, even more preferably 2 to 5, and is most preferably 2.

The linear aliphatic hydrocarbon group is preferably a linear alkylene group, and specific examples thereof include a methylene group, an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group is preferably a branched alkylene group. Specific examples thereof include alkylalkylene groups, such as alkymethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. The alkyl group in the alkylalkylene group is preferably a linear alkyl group having 1 to 5 carbon atoms.

These linear or branched aliphatic hydrocarbon groups may or may not be substituted. Examples of the substituent include a fluorine atom, a fluorinated alkyl group having 1 to 5 carbon atoms and substituted with a fluorine atom, and an oxygen atom (=O).

Examples of the aliphatic hydrocarbon group containing a ring include a cyclic aliphatic hydrocarbon group (a group obtainable by eliminating two hydrogen atoms from an aliphatic hydrocarbon ring), and a group in which the cyclic aliphatic hydrocarbon group is bonded to an end of the linear aliphatic hydrocarbon group described above or is inserted in the middle of a linear aliphatic hydrocarbon group. The number of carbon atoms of the cyclic aliphatic hydrocarbon group is preferably 3 to 20, and more preferably 3 to 12.

The cyclic aliphatic hydrocarbon group may be a polycyclic group or may be a monocyclic group. The monocyclic group is preferably a group obtainable by eliminating two hydrogen atoms from a monocycloalkane having 3 to 6 carbon atoms, and examples of the monocycloalkane include cyclopentane and cyclohexane. The polycyclic group is preferably a group obtainable by eliminating two hydrogen atoms from a polycycloalkane having 7 to 12 carbon atoms, and specific examples of the polycycloalkane include adamantane, norbornane, isobornane, tricyclodecane, and tetracyclododecane.

The cyclic aliphatic hydrocarbon group may or may not have a substituent. Examples of the substituent include a lower alkyl group having 1 to 5 carbon atoms, a fluorine atom, a fluorinated lower alkyl group having 1 to 5 carbon atoms and substituted with a fluorine atom, and an oxygen atom (=O).

A is preferably a linear aliphatic hydrocarbon group, more preferably a linear alkylene group, even more preferably a linear alkylene group having 1 to 5 carbon atoms, and particularly preferably a methylene group or an ethylene group.

B is preferably a linear or branched aliphatic hydrocarbon group, and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

Furthermore, in the group represented by the formula: -[A-C(=O)—O]$_{m'}$-B-, m' represents an integer from 0 to 3; preferably an integer from 0 to 2; more preferably 0 or 1; and most preferably 1.

Specific examples of the constituent unit (a1) include constituent units represented by the following formulae (a1-1) to (a1-4):

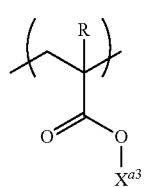

(a1-1)

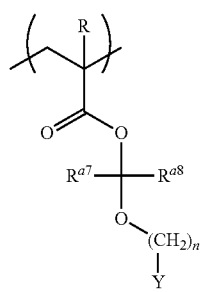

(a1-2)

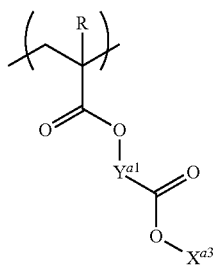

(a1-3)

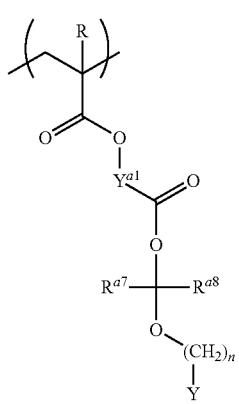

(a1-4)

wherein in the formulae (a1-1) to (a1-4), R, $R^{a7}$, $R^{a8}$, n, Y and $Y^{a1}$ respectively have the same meanings as defined above; and $X^{a3}$ represents a tertiary alkyl ester type acid-dissociable group.

In regard to the formulae (a1-1) and (a1-3), examples of $X^{a3}$ include the same tertiary alkyl ester type acid-dissociable groups as described above.

$R^{a7}$, $R^{a8}$, n and Y respectively have the same meanings as $R^{a7}$, $R^{a8}$, n and Y in the formula (p1) described in the explanation on the "acetal type acid-dissociable group" described above.

$Y^{a1}$ has the same meaning as $Y^{a1}$ in the formula (a1-O-2) described above.

Specific examples of the constituent units represented by the formulae (a1-1) to (a1-4) will be described below. In the following formulae, $R^\alpha$ represents a hydrogen atom, a methyl group, or a trifluoromethyl group.

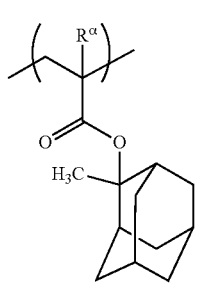

(a1-1-1)

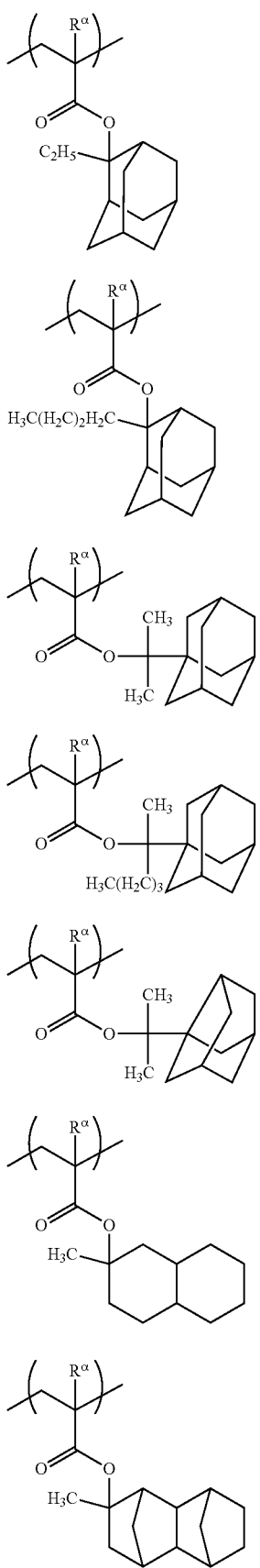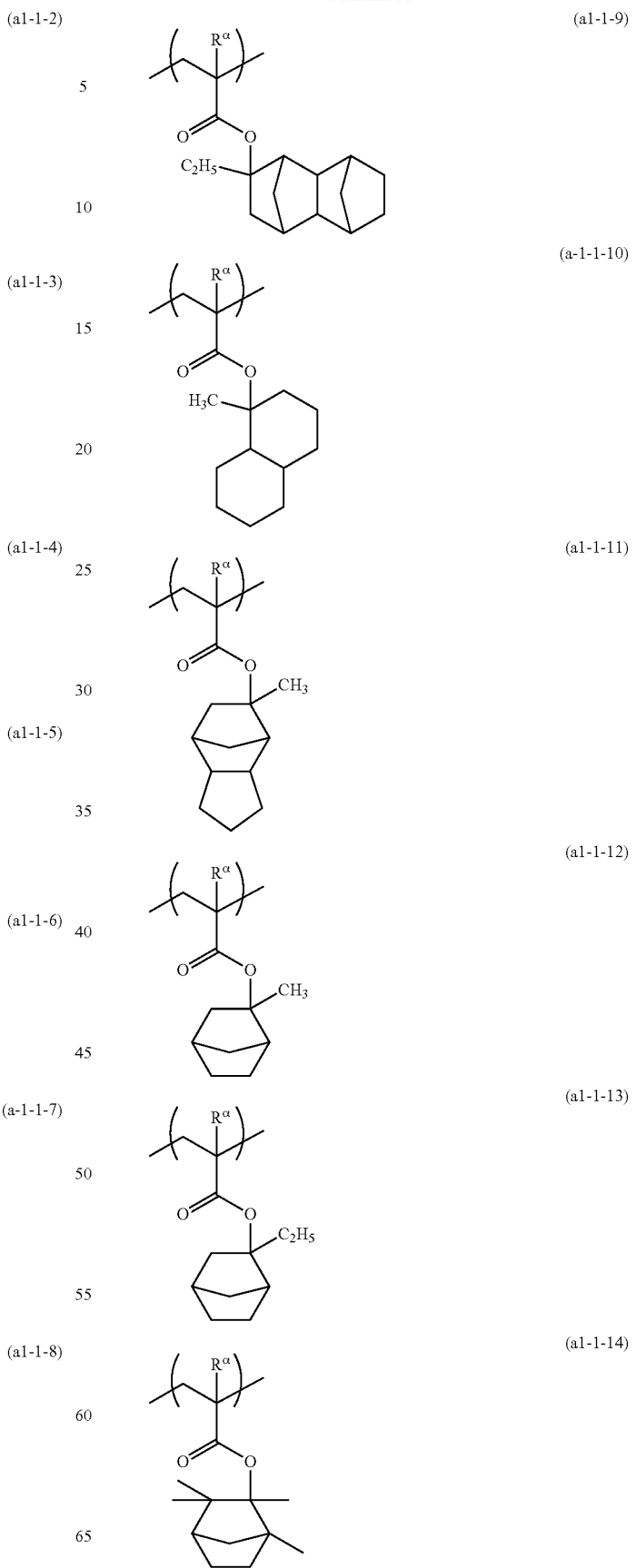

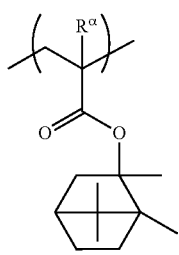 (a1-1-15)
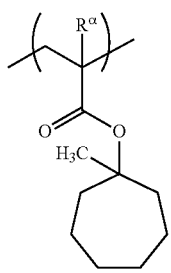 (a1-1-16)
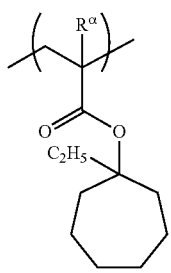 (a1-1-17)
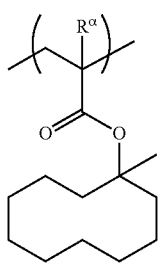 (a1-1-18)
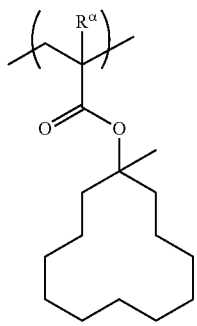 (a1-1-19)
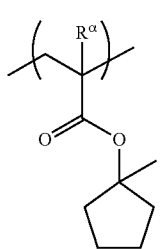 (a1-1-20)
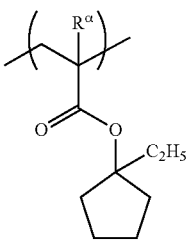 (a1-1-21)
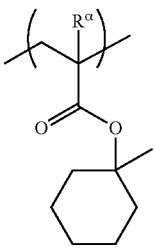 (a1-1-22)
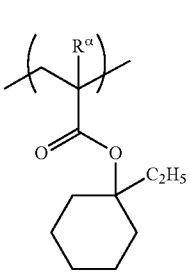 (a1-1-23)
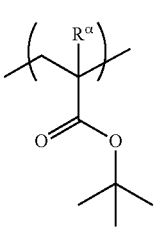 (a1-1-24)
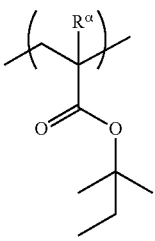 (a1-1-25)
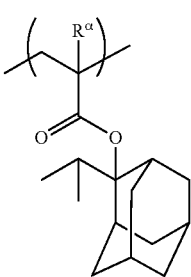 (a1-1-26)

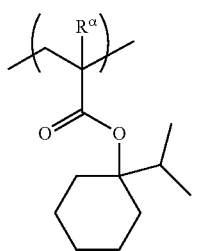 (a1-1-27)
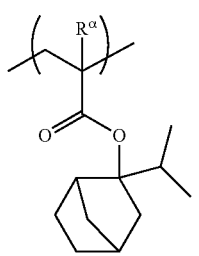 (a1-1-28)
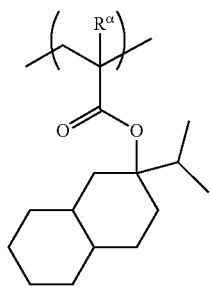 (a1-1-29)
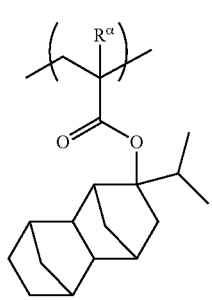 (a1-1-30)
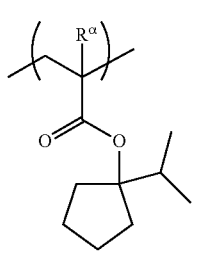 (a1-1-31)
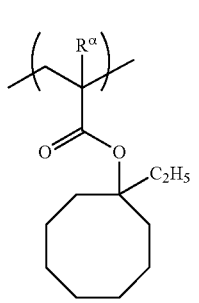 (a1-1-32)
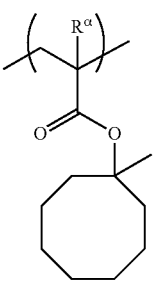 (a1-1-33)
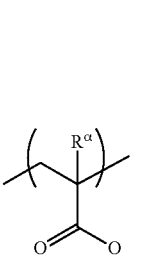 (a1-2-1)
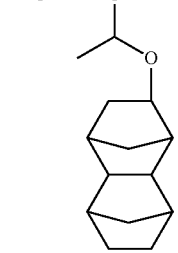 (a1-2-2)
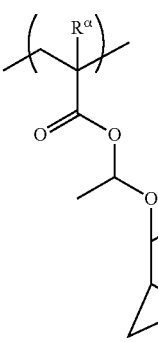 (a1-2-3)

(a1-2-4)
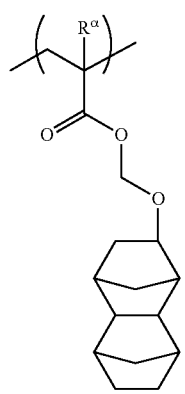
(a1-2-5)
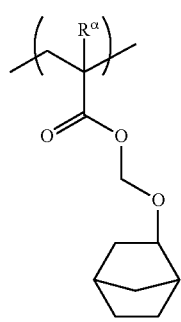
(a1-2-6)
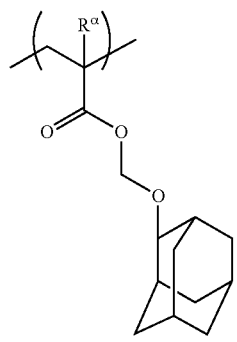
(a1-2-7)
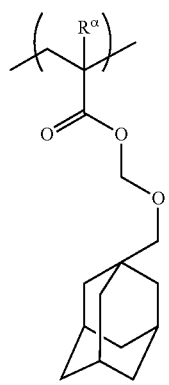
(a1-2-8)
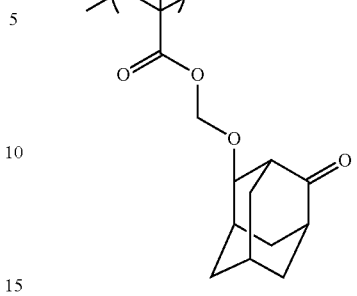
(a1-2-9)
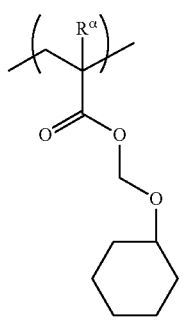
(a1-2-10)
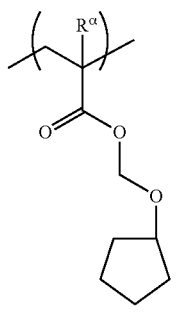
(a1-2-11)
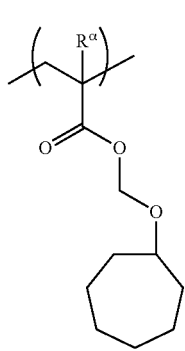
(a1-2-12)
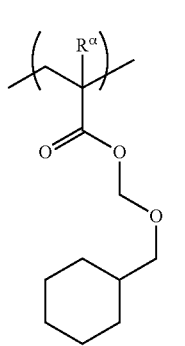

(a1-2-13) 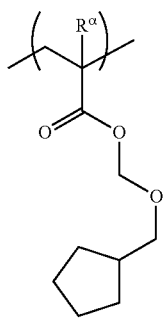
(a1-2-14) 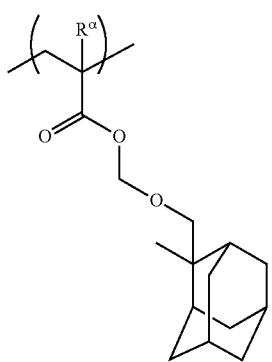
(a1-2-15) 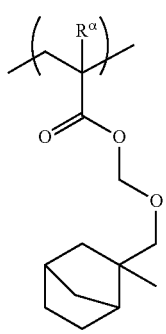
(a1-2-16) 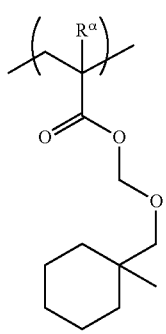
(a1-2-17) 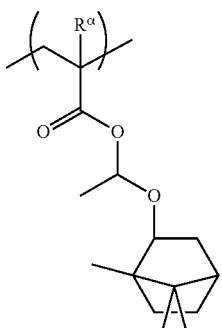
(a1-2-18) 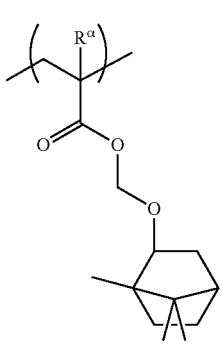
(a1-2-19) 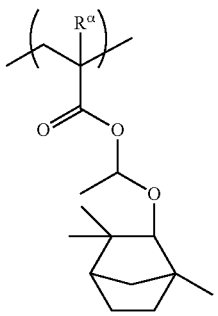
(a1-2-20) 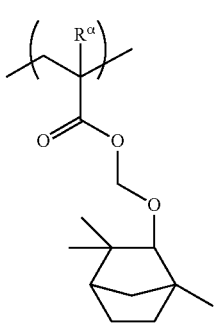
(a1-2-21) 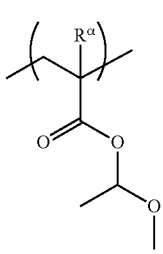

(a1-2-22)
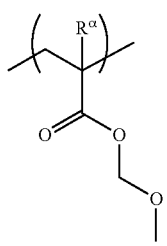
(a1-2-23)
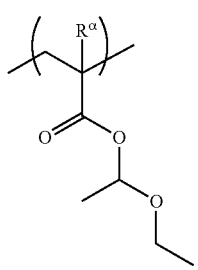
(a1-2-24)
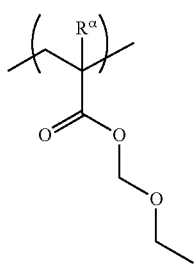
(a1-3-1)
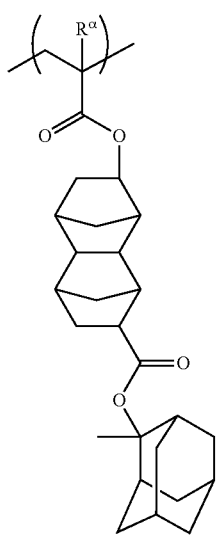
(a1-3-2)
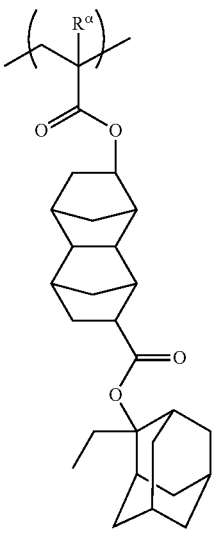
(a1-3-3)
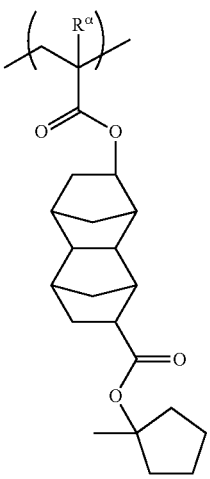
(a1-3-4)
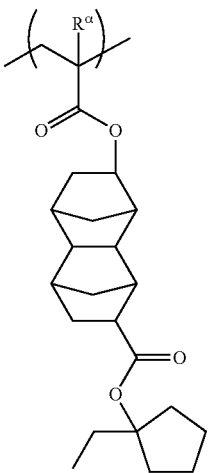

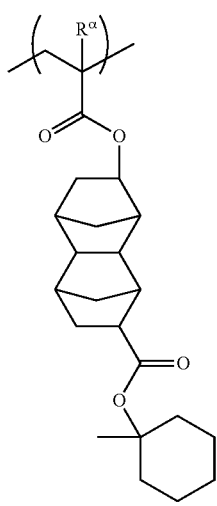
(a1-3-5)
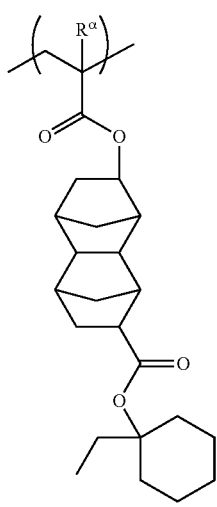
(a1-3-6)
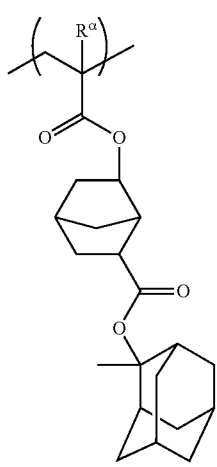
(a1-3-7)
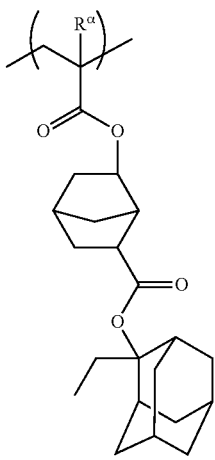
(a1-3-8)
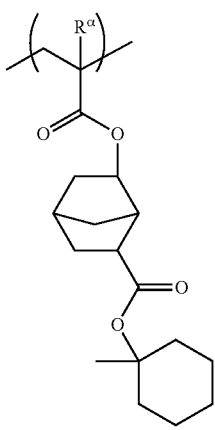
(a1-3-9)
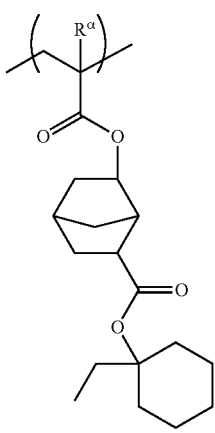
(a1-3-10)

(a1-3-11)
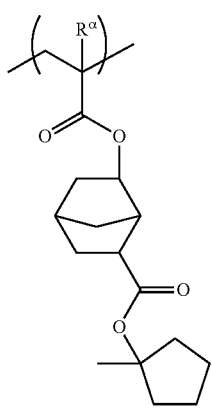
(a1-3-12)
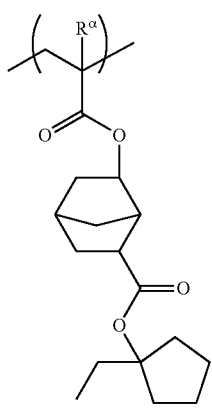
(a1-3-13)
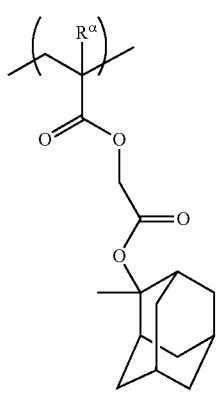
(a1-3-14)
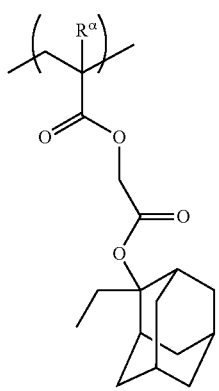
(a1-3-15)
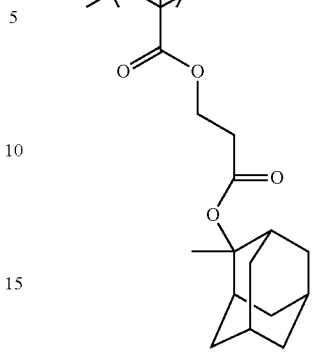
(a1-3-16)
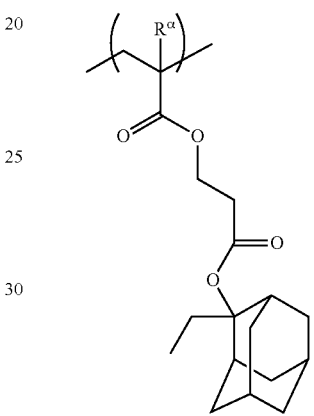
(a1-3-17)
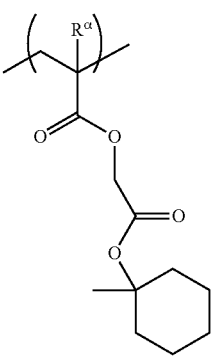
(a1-3-18)
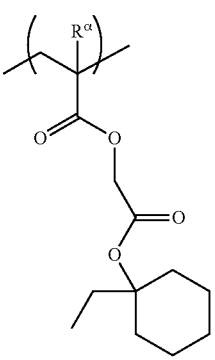

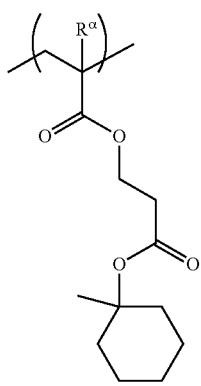 (a1-3-19)
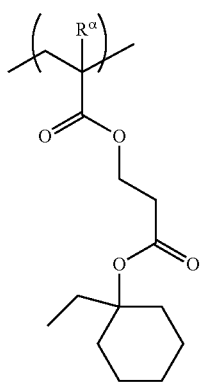 (a1-3-20)
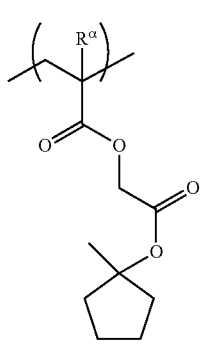 (a1-3-21)
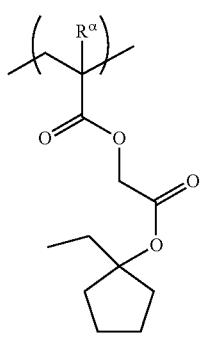 (a1-3-22)
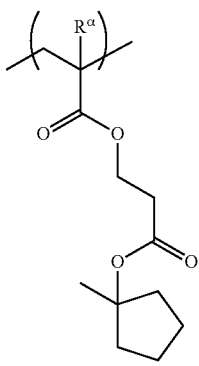 (a1-3-23)
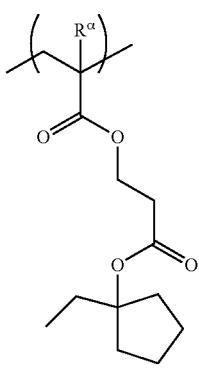 (a1-3-24)
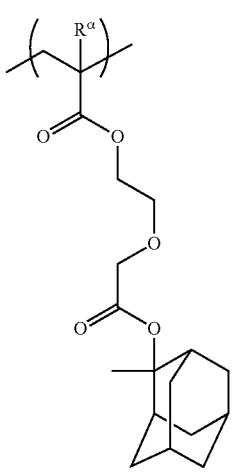 (a1-3-25)
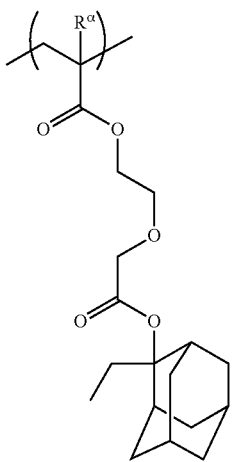 (a1-3-26)

(a1-3-27) 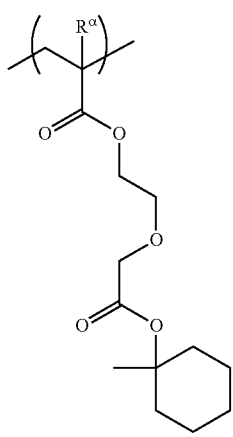
(a1-3-28) 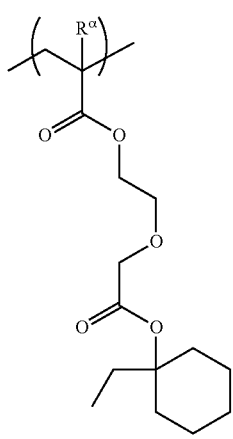
(a1-3-29) 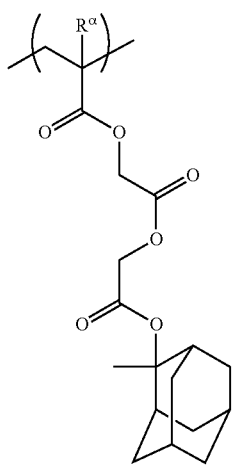
(a1-3-30) 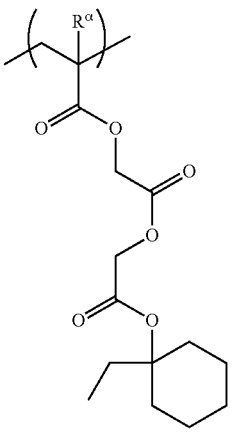
(a1-3-31) 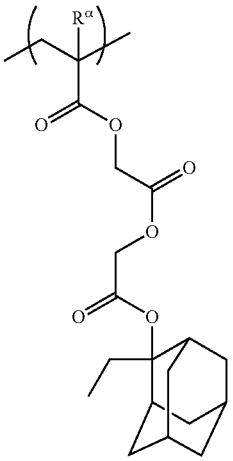
(a1-3-32) 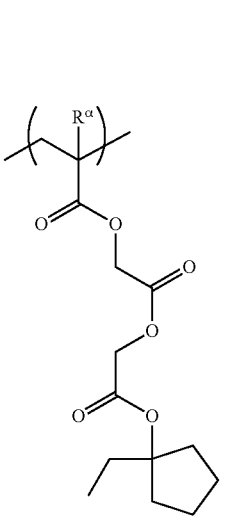

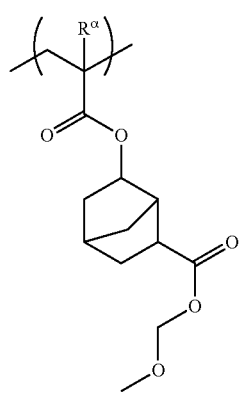 (a1-4-1)
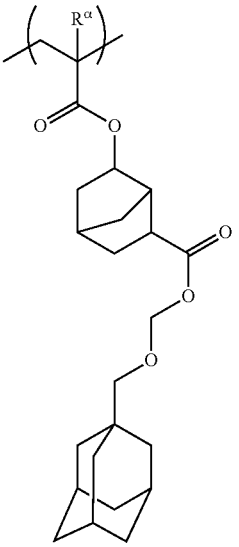 (a1-4-4)
(a1-4-2)
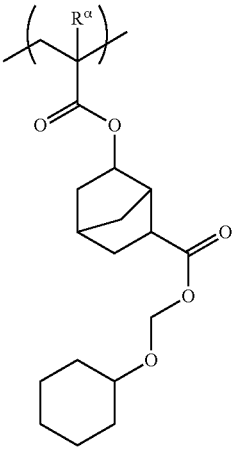 (a1-4-5)
(a1-4-3)
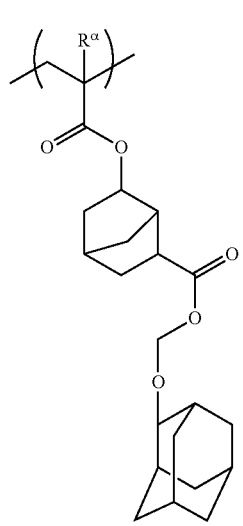 (a1-4-6)

(a1-4-7) 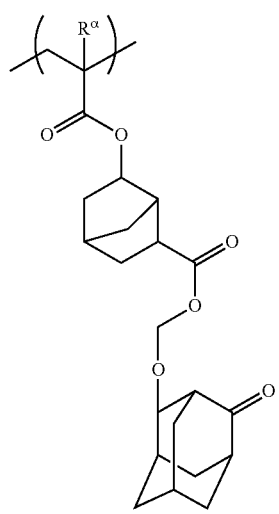
(a1-4-8) 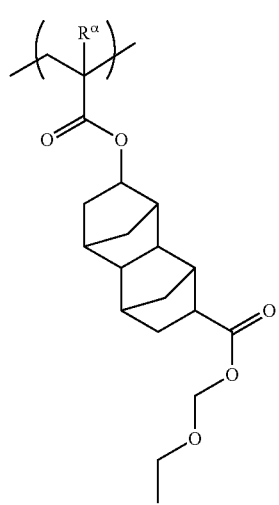
(a1-4-9) 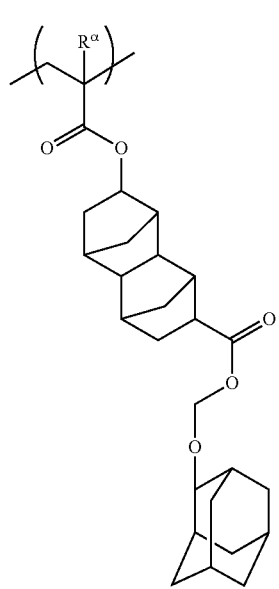
(a1-4-10) 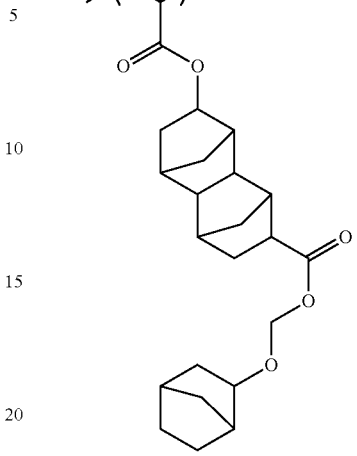
(a1-4-11) 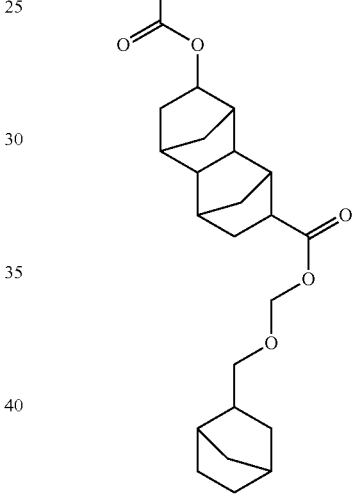
(a1-4-12) 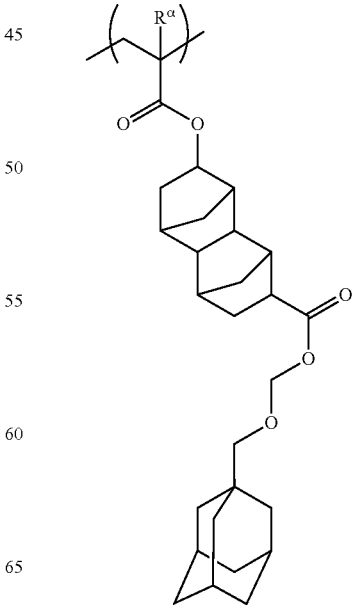

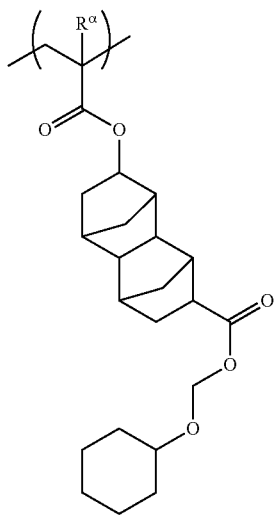

(a1-4-13)

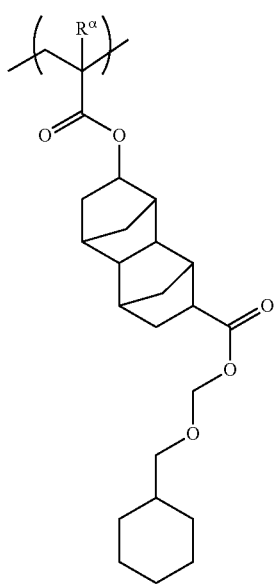

(a1-4-14)

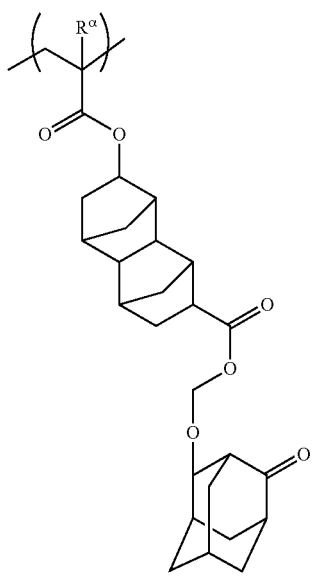

(a1-4-15)

The constituent unit (a1) is such that one kind of the constituent unit may be used alone, or two or more kinds thereof may be used in combination. The constituent unit (a1) is, among those described above, preferably a constituent unit represented by the formula (a1-1) or (a1-3), and specifically, it is more preferable to use at least one selected from the group consisting of constituent units represented by the formulae (a1-1-1) to (a1-1-4), (a1-1-20) to (a1-1-23), (a1-1-26), (a1-1-32) to (a1-1-33), and (a1-3-25) to (a1-3-32).

Furthermore, the constituent unit (a1) is preferably a constituent unit represented by the following formula (a1-1-01) which encompasses constituent units represented by the formulae (a1-1-1) to (a1-1-3) and (a1-1-26); a constituent unit represented by the following formula (a1-1-02) which encompasses constituent units represented by the formulae (a1-1-16) to (a1-1-17), (a1-1-20) to (a1-1-23) and (a1-1-32) to (a1-1-33); a constituent unit represented by the following formula (a1-3-01) which encompasses constituent units represented by the formulae (a1-3-25) to (a1-3-26); a constituent unit represented by the following formula (a1-3-02) which encompasses constituent units represented by the formulae (a1-3-27) to (a1-3-28); and a constituent unit represented by the following formula (a1-3-03) which encompasses constituent units of the formulae (a1-3-29) to (a1-3-32).

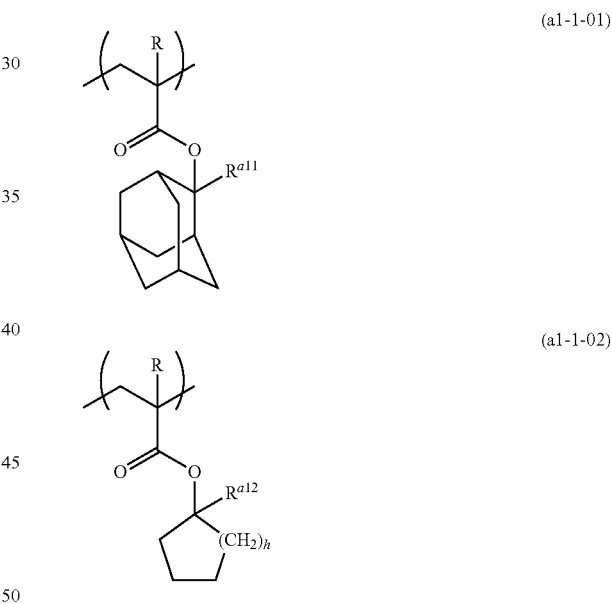

(a1-1-01)

(a1-1-02)

wherein in the formulae (a1-1-01) to (a1-1-02), R represents a hydrogen atom, an alkyl group having 1 to 5 carbon atoms, or a halogenated alkyl group having 1 to 5 carbon atoms; $R^{a11}$ represents an alkyl group having 1 to 5 carbon atoms; $R^{a12}$ represents an alkyl group having 1 to 5 carbon atoms; and h represents an integer from 1 to 6.

In regard to the formula (a1-1-01), R has the same meaning as defined above. Examples of the alkyl group of $R^{a11}$ include the same examples of the alkyl group for R, and a methyl group, an ethyl group or an isopropyl group is preferred.

In regard to the formula (a1-1-02), R has the same meaning as defined above. Examples of the alkyl group of $R^{a12}$ include the ones as the alkyl groups for R, and a methyl group, an ethyl group or an isopropyl group is preferred. h is preferably 1 or 2, and most preferably 2.

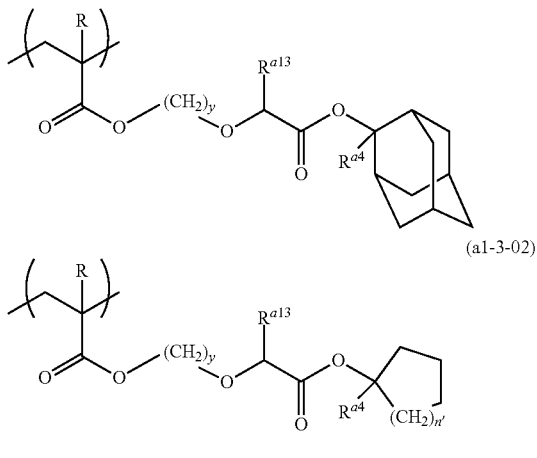

(a1-3-01)

(a1-3-02)

wherein in the formulae (a1-3-01) to (a1-3-02), R represents a hydrogen atom, an alkyl group having 1 to 5 carbon atoms, or a halogenated alkyl group having 1 to 5 carbon atoms; $R^{a4}$ represents an alkyl group; $R^{a13}$ represents a hydrogen atom or a methyl group; y represents an integer from 1 to 10; and n' represents an integer from 1 to 6.

In the formula (a1-3-01) or (a1-3-02), R has the same meaning as defined above. $R^{a13}$ is preferably a hydrogen atom. Examples of the alkyl group of $R^{a4}$ include the same alkyl groups as those for $R^{a4}$ in the formulae (1-1) to (1-9), and a methyl group, an ethyl group or an isopropyl group is preferred. y is preferably an integer from 1 to 8, particularly preferably an integer from 2 to 5, and most preferably 2. n' is most preferably 1 or 2.

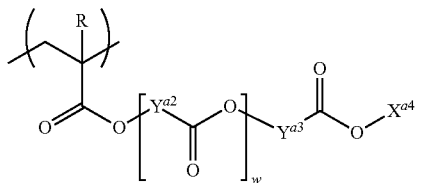

(a1-3-03)

wherein in the formula (a1-3-03), R has the same meaning as defined above; $Y^{a2}$ and $Y^{a3}$ each independently represent a divalent linking group; $X^{a4}$ represents an acid-dissociable group; and w represents an integer from 0 to 3.

In the formula (a1-3-03), examples of the divalent linking group for $Y^{a2}$ and $Y^{a3}$ include the same divalent linking groups as those for $Y^{a1}$ for the formula (a1-3). $Y^{a2}$ is preferably a divalent hydrocarbon group which may be substituted, more preferably a linear aliphatic hydrocarbon group; and even more preferably a linear alkylene group. Among such groups, a linear alkylene group having 1 to 5 carbon atoms is preferred, and a methylene group and an ethylene group are most preferred. $Y^{a3}$ is preferably a divalent hydrocarbon group which may be substituted; more preferably a linear aliphatic hydrocarbon group; and even more preferably a linear alkylene group. Among such groups, a linear alkylene group having 1 to 5 carbon atoms is preferred, and a methylene group and an ethylene group are most preferred. Examples of the acid-dissociable group for $X^{a4}$ include the same acid-dissociable groups as described above, and a tertiary alkyl ester type acid-dissociable group is preferred; while a group having a tertiary carbon atom on the ring skeleton of the (i) monovalent aliphatic cyclic group described above is more preferred. Among others, a group represented by the formula (1-1) is preferred. w represents an integer from 0 to 3, and w is preferably an integer from 0 to 2, more preferably 0 or 1, and most preferably 1.

Furthermore, the constituent unit (a1) is also preferably a unit represented by the following formula (a1-5):

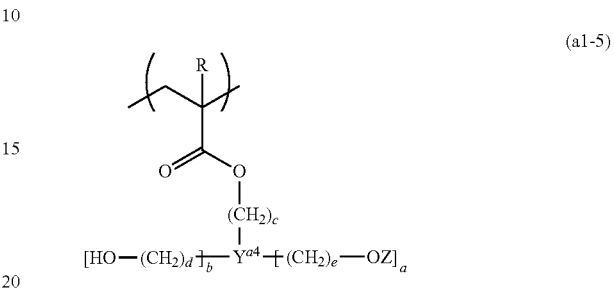

(a1-5)

wherein in the formula (a1-5), R represents a hydrogen atom, a lower alkyl group having 1 to 5 carbon atoms, or a halogenated alkyl group having 1 to 5 carbon atoms; $Y^{a4}$ represents an aliphatic hydrocarbon group which may be substituted; Z represents a monovalent organic group having an acid-dissociable group containing a tertiary ester type acid-dissociable group or an acetal type acid-dissociable group at an end; a represents an integer from 1 to 3; b represents an integer from 0 to 2; a+b=1 to 3; and c, d and e each represent an integer from 0 to 3.

In the formula (a1-5), specific examples of R include the same as described above. Among them, R is preferably a hydrogen atom or a methyl group.

In the formula (a1-5), $Y^{a4}$ represents an aliphatic hydrocarbon group which may be substituted. The aliphatic hydrocarbon group for $Y^{a4}$ may be a saturated aliphatic hydrocarbon group, or may be an unsaturated aliphatic hydrocarbon group. Furthermore, the aliphatic hydrocarbon group may be any of linear, branched and cyclic. Specific examples of the substituent which substitutes a portion or all of the hydrogen atoms that constitute the aliphatic hydrocarbon group include an alkoxy group, a halogen atom, a halogenated alkyl group, a hydroxyl group, an oxygen atom (═O), a cyano group, and an alkyl group.

When the substituent is an alkoxy group, an alkoxy group having 1 to 5 carbon atoms is preferred, and a methoxy group, an ethoxy group, an n-propoxy group, an iso-propoxy group, an n-butoxy group, and a tert-butoxy group are preferred, while a methoxy group and an ethoxy group are most preferred. When the substituent is a halogen atom, examples of the halogen atom include a fluorine atom, a chlorine atom, a bromine atom, and an iodine atom, and a fluorine atom is preferred. When the substituent is a halogenated alkyl group, examples thereof include groups in which a portion or all of the hydrogen atoms of an alkyl group having 1 to 5 carbon atoms, for example, an alkyl group such as a methyl group, an ethyl group, a propyl group, an n-butyl group or a tert-butyl group, are substituted by the halogen atoms described above. When the substituent is an alkyl group, examples thereof include alkyl groups having 1 to 5 carbon atoms, for example, a methyl group, an ethyl group, a propyl group, an n-butyl group, and a tert-butyl group.

When $Y^{a4}$ is a linear or branched aliphatic hydrocarbon group, the number of carbon atoms is preferably 1 to 10, more preferably 1 to 5, and most preferably 1 to 3. Specifically, a linear alkylene group is considered suitable.

When $Y^{a4}$ is a cyclic aliphatic hydrocarbon group (aliphatic cyclic group), the structure of the basic ring (aliphatic ring) obtainable by eliminating the substituent of the aliphatic cyclic group is not limited to a ring composed of carbon and hydrogen (hydrocarbon ring), and may contain heteroatoms such as an oxygen atom, a sulfur atom, and a nitrogen atom in the structure of the ring (aliphatic ring). Furthermore, the "hydrocarbon ring" may be either saturated or unsaturated, but it is usually preferable that the hydrocarbon ring be saturated.

The aliphatic cyclic group may be any of a polycyclic group and a monocyclic group. The aliphatic cyclic group may be substituted with a lower alkyl group, a fluorine atom, or a fluorinated alkyl group. Examples of the aliphatic cyclic group include groups obtainable by eliminating two or more hydrogen atoms each from polycycloalkanes such as a monocycloalkane, a bicycloalkane, a tricycloalkane, and a tetracycloalkane. More specific examples include groups obtainable by eliminating two or more hydrogen atoms each from monocycloalkanes such as cyclopentane and cyclohexane or polycycloalkanes such as adamantane, norbornane, isobornane, tricyclodecane and tetracyclododecane.

Furthermore, examples of the aliphatic cyclic group include groups obtainable by eliminating two or more hydrogen atoms each from tetrahydrofuran and tetrahydropyrane.

In the formula (a1-5), when $Y^{a4}$ is an aliphatic cyclic group, $Y^{a4}$ is preferably a polycyclic group, and among others, a group obtainable by eliminating two or more hydrogen atoms from adamantane is particularly preferred.

In the formula (a1-5), Z represents an acid-degradable group containing a tertiary ester type acid-dissociable group or an acetal type acid-dissociable group. Here, in the present specification and the claims, the term "organic group" means a group containing carbon atoms, and may have atoms other than carbon atoms (for example, a hydrogen atom, an oxygen atom, a nitrogen atom, a sulfur atom, and a halogen atom (a fluorine atom, a chlorine atom or the like)).

Suitable examples of the case where Z is an acid-degradable group containing a tertiary ester type acid-dissociable group, include a tertiary alkyloxycarbonyl group and a tertiary alkyloxycarbonyl group. The alkylene group included in the tertiary alkyloxycarbonyl group is preferably an alkylene group having 1 to 5 carbon atoms, such as a methylene group or an ethylene group.

A suitable tertiary alkyl group which is included in the acid-degradable group containing a tertiary ester type acid-dissociable group, may be a branched group or may be a group containing a cyclic aliphatic group. Suitable examples of the case where the tertiary alkyl group is branched include a group represented by the above-described formula: $-C(R^{a1})(R^{a2})(R^{a3})$. Specific examples of the group represented by the formula: $-C(R^{a1})(R^{a2})(R^{a3})$ include a tert-butyl group, a 2-methylbutan-2-yl group, a 2-methylpentan-2-yl group, and a 3-methylpentan-3-yl group, and a tert-butyl group is particularly preferred. Suitable examples of the case where the tertiary alkyl group is a group containing a cyclic aliphatic group, include groups represented by the above-described formulae (1-1) to (1-9) and formulae (2-1) to (2-6).

Z is preferably an acid-degradable group containing a tertiary ester type acid-dissociable group, and is more preferably a tertiary alkyloxycarbonyl group. Suitable examples of the tertiary alkyloxycarbonyl group include a tert-butyloxycarbonyl group (t-boc) and a tert-amyloxycarbonyl group, and a tert-butyloxycarbonyl group is more preferred.

In the formula (a1-5), a represents an integer from 1 to 3; b represents an integer from 0 to 2; and a+b=1 to 3. a is preferably 1, b is preferably 0, and the value of a+b is preferably 1.

Furthermore, c represents an integer from 0 to 3, and c is preferably 0 or 1, and more preferably 0. d represents an integer from 0 to 3, and d is preferably 0 or 1, and more preferably 0. e represents an integer from 0 to 3, and e is preferably 0 or 1, and more preferably 0.

The constituent unit represented by the formula (a1-5) is particularly preferably a constituent unit represented by the following formula (a1-5-1) or (a1-5-2):

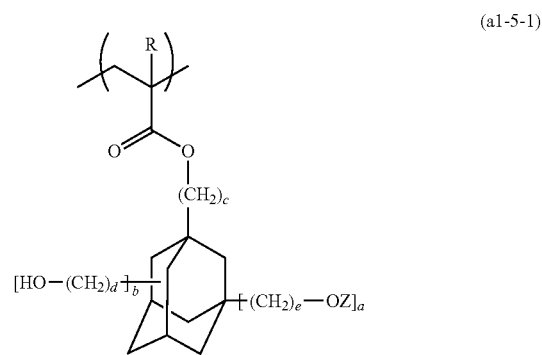

(a1-5-1)

wherein in the formula (a1-5-1), R, Z, b, c, d, and e respectively have the same meanings as defined above.

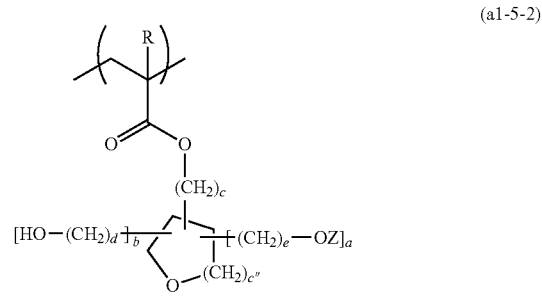

(a1-5-2)

wherein in the formula (a1-5-2), R, Z, a, b, c, d, and e respectively have the same meanings as defined above; and c" represents an integer from 1 to 3.

In the formula (a1-5-2), c" represents an integer from 1 to 3, and c" is preferably 1 or 2, and more preferably 1.

In the case where c in the formula (a1-5-2) is 0, it is preferable that the terminal oxygen atom of the carbonyloxy group ($-C(=O)-O-$) of the acrylic acid ester be not bonded to the carbon atom that is bonded to the oxygen atom in the cyclic group. That is, when c is 0, it is preferable that there exist two or more carbon atoms between the terminal oxygen atom and the oxygen atom in the cyclic group (excluding the case where the number of such carbon atoms is 1 (that is, forming an acetal bond)).

In the resin (a), the proportion of the constituent unit (a1) is preferably 10% to 80% by mole, more preferably 20% to 70% by mole, and even more preferably 25% to 50% by mole, relative to the total content of the constituent units that constitute the resin (a). When the proportion of the constituent unit (a1) is adjusted to such a range, a resist composition which facilitates the formation of patterns can be easily prepared.

[Constituent Unit (a0)]

The constituent unit (a0) is a constituent unit derived from an acrylic acid ester containing a $-SO_2-$ moiety-containing cyclic group. Here, the —SO₂— moiety-containing cyclic group refers to a cyclic group which includes a ring containing —SO₂— in the ring skeleton, and specifically, the —SO₂— moiety-containing cyclic group is a cyclic group in which the sulfur atom (S) in —SO₂— forms a portion of the ring skeleton of the cyclic group. In regard to the —SO₂— moiety-containing cyclic group, the ring containing —SO₂— in the ring skeleton is counted as a first ring, and if there is only the first ring, the group is referred to as a monocyclic group; and if the group further has other ring structures, the group is referred to as a polycyclic group regardless of the structure.

The —SO₂— moiety-containing cyclic group may be monocyclic or may be polycyclic. Furthermore, the —SO₂— moiety-containing cyclic group is preferably a cyclic group containing —O—SO₂— in the ring skeleton, that is, a sultone ring in which —O—S— in —O—SO₂— forms a portion of the ring skeleton.

The number of carbon atoms of the —SO₂— moiety-containing cyclic group is preferably 3 to 30, more preferably 4 to 20, particularly preferably 4 to 15, and most preferably 4 to 12. However, the number of carbon atoms is the number of the carbon atoms that constitute the ring skeleton, and it is defined that the number of carbon atoms does not include the number of carbon atoms in the substituents.

The —SO₂— moiety-containing cyclic group may be a —SO₂— moiety-containing aliphatic cyclic group, or may be a —SO₂— moiety-containing aromatic cyclic group, and a —SO₂— moiety-containing aliphatic cyclic group is more preferred. The —SO₂— moiety-containing aliphatic cyclic group may be a group obtainable by eliminating at least one hydrogen atom from an aliphatic hydrocarbon ring in which a portion of the carbon atoms that constitute the ring skeleton are substituted by —SO₂— or —O—SO₂—. More specific examples thereof include a group obtainable by eliminating at least one hydrogen atom from an aliphatic hydrocarbon ring in which —CH₂— that constitutes the ring skeleton is substituted by —SO₂—; and a group obtainable by eliminating at least one hydrogen atom from an aliphatic hydrocarbon ring in which —CH₂—CH₂— constituting the ring is substituted by —O—SO₂—. The number of carbon atoms of the aliphatic hydrocarbon ring is preferably 3 to 20, and more preferably 3 to 12.

The alicyclic hydrocarbon group obtainable by eliminating at least one hydrogen atom from an aliphatic hydrocarbon ring may be polycyclic or may be monocyclic. The monocyclic alicyclic hydrocarbon group is preferably a group obtainable by eliminating two hydrogen atoms from a monocycloalkane having 3 to 6 carbon atoms, and examples of the monocycloalkane include cyclopentane and cyclohexane. The polycyclic alicyclic hydrocarbon group is preferably a group obtainable by eliminating two hydrogen atoms from a polycycloalkane having 7 to 12 carbon atoms, and specific examples of the polycycloalkane include adamantane, norbornane, isobornane, tricyclodecane, and tetracyclododecane.

The —SO₂— moiety-containing cyclic group may have a substituent. Examples of the substituent include an alkyl group, an alkoxy group, a halogen atom, a halogenated alkyl group, a hydroxyl group, an oxygen atom (=O), —COOR", —OC(=O)R" (wherein R" represents a hydrogen atom or an alkyl group), a hydroxyalkyl group, and a cyano group.

The alkyl group as a substituent is preferably an alkyl group having 1 to 6 carbon atoms. The alkyl group is preferably linear or branched. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or an ethyl group is preferred, and a methyl group is particularly preferred.

The alkoxy group as a substituent is preferably an alkoxy group having 1 to 6 carbon atoms. The alkoxy group is preferably linear or branched. Specific examples thereof include a group in which an oxygen atom (—O—) is bonded to an alkyl group mentioned previously as the alkyl group as a substituent.

Examples of the halogen atom as a substituent include a fluorine atom, a chlorine atom, a bromine atom, and an iodine atom, and a fluorine atom is preferred.

The halogenated alkyl group of a substituent may be a group in which a portion or all of the hydrogen atoms of the alkyl group mentioned above are substituted by the halogen atoms mentioned above. The halogenated alkyl group as a substituent may be a group in which a portion or all of the hydrogen atoms of an alkyl group mentioned as the alkyl group as a substituent are substituted by the halogen atoms mentioned above. The halogenated alkyl group is preferably a fluorinated alkyl group, and is particularly preferably a perfluoroalkyl group.

R" in the above-described moieties —COOR" and —OC(=O)R" is preferably a hydrogen atom, or a linear, branched or cyclic alkyl group having 1 to 15 carbon atoms. When R" is a linear or branched alkyl group, the number of carbon atoms is preferably 1 to 10, and more preferably 1 to 5. The linear or branched alkyl group is particularly preferably a methyl group or an ethyl group. When R" is a cyclic alkyl group, the number of carbon atoms is preferably 3 to 15, more preferably 4 to 12, and particularly preferably 5 to 10. Specific examples of the cyclic alkyl group include groups obtainable by eliminating one or more hydrogen atoms each from polycycloalkanes such as a monocycloalkane, a bicycloalkane, a tricycloalkane, and a tetracycloalkane. More specific examples thereof include groups obtainable by eliminating one or more hydrogen atoms each from monocycloalkanes such as cyclopentane and cyclohexane, or polycycloalkanes such as adamantane, norbornane, isobornane, tricyclodecane, and tetracyclododecane.

Regarding the hydroxyalkyl group as a substituent, the number of carbon atoms is preferably 1 to 6, and specifically, the hydroxyalkyl group may be a group in which at least one hydrogen atom of an alkyl group which has been mentioned as the alkyl group as the substituent described above, is substituted by a hydroxyl group.

More specific examples of the —SO₂— moiety-containing cyclic group include groups represented by the following formulae (0-1) to (0-4):

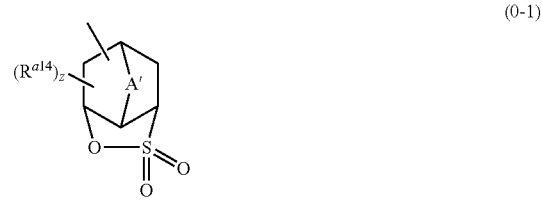

(0-1)

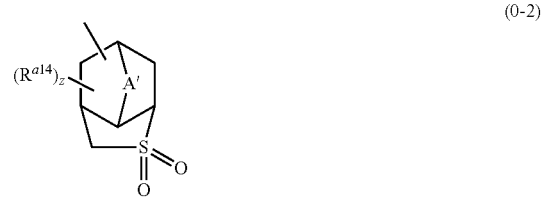

(0-2)

(0-3)

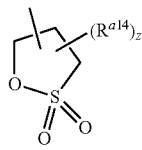

(0-4)

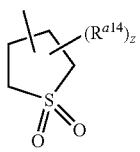

wherein in the formulae (0-1) to (0-4), A' represents an oxygen atom, a sulfur atom, or an alkylene group having 1 to 5 carbon atoms, which may contain an oxygen atom or a sulfur atom; z represents an integer from 0 to 2; $R^{a14}$ represents an alkyl group, an alkoxy group, a halogenated alkyl group, a hydroxyl group, —COOR", —OC(=O)R", a hydroxyalkyl group, or a cyano group; and R" represents a hydrogen atom or an alkyl group.

In the formulae (0-1) to (0-4), A' represents an oxygen atom, a sulfur atom, or an alkylene group having 1 to 5 carbon atoms, which may contain an oxygen atom (—O—) or a sulfur atom (—S—).

The alkylene group having 1 to 5 carbon atoms for A' is preferably a linear or branched alkylene group, and examples thereof include a methylene group, an ethylene group, an n-propylene group, and an isopropylene group. When the alkylene group contains an oxygen atom or a sulfur atom, specific examples thereof include alkylene groups such as those described above, which are interrupted by —O— or —S— at the ends or between the carbon atoms, and examples thereof include —O—CH$_2$—, —CH$_2$—O—CH$_2$—, —S—CH$_2$—, and —CH$_2$—S—CH$_2$—. A' is preferably —O— or an alkylene group having 1 to 5 carbon atoms; more preferably an alkylene group having 1 to 5 carbon atoms; and most preferably a methylene group.

z may be any of 0 to 2, and 0 is most preferred. When z is 2, plural $R^{a14}$'s may be identical with each other, or may be different from each other.

Examples of the alkyl group, alkoxy group, halogenated alkyl group, —COOR", —OC(=O)R", and hydroxyalkyl group for $R^{a14}$ include the same alkyl group, alkoxy group, halogenated alkyl group, —COOR", —OC(=O)R", and hydroxyalkyl group, respectively, as those described as the substituents which may be carried by the —SO$_2$— moiety-containing cyclic group.

Specific examples of the cyclic groups represented by the formulae (0-1) to (0-4) will be listed below. Meanwhile, the symbol "Ac" in the formulae represents an acetyl group.

(0-1-1)

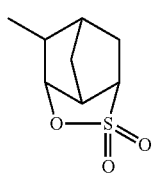

(0-1-2)

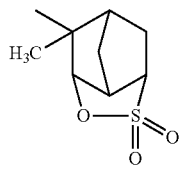

(0-1-3)

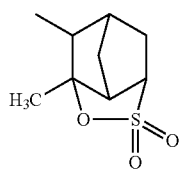

(0-1-4)

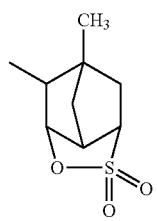

(0-1-5)

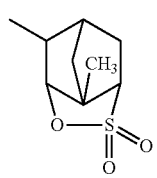

(0-1-6)

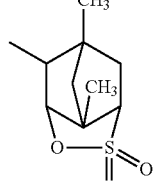

(0-1-7)

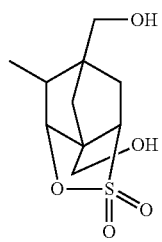

(0-1-8)

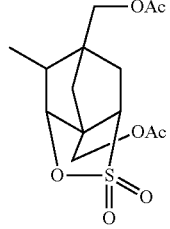

(0-1-9)

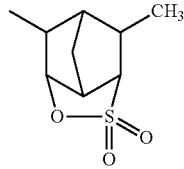

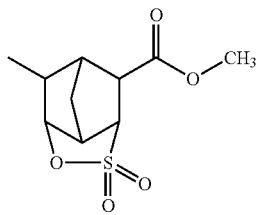 (0-1-10)
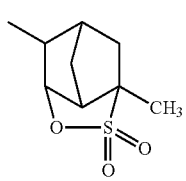 (0-1-11)
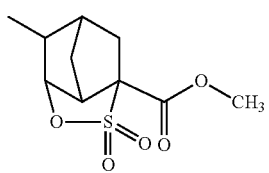 (0-1-12)
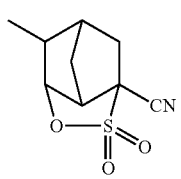 (0-1-13)
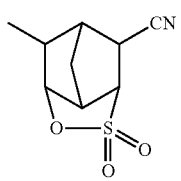 (0-1-14)
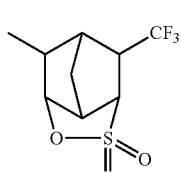 (0-1-15)
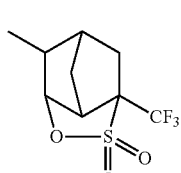 (0-1-16)
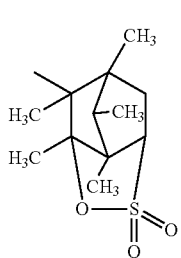 (0-1-17)
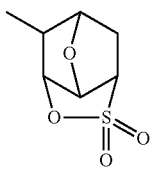 (0-1-18)
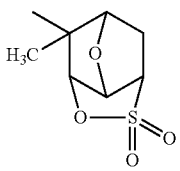 (0-1-19)
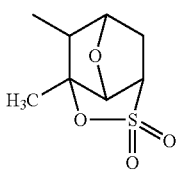 (0-1-20)
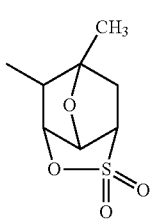 (0-1-21)
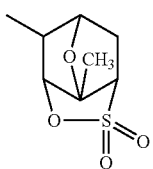 (0-1-22)
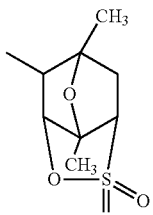 (0-1-23)
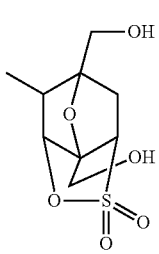 (0-1-24)

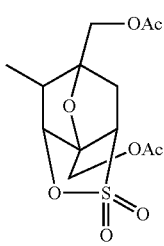 (0-1-25)

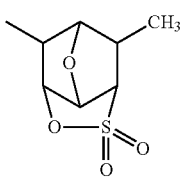 (0-1-26)

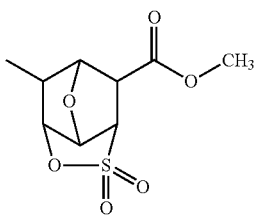 (0-1-27)

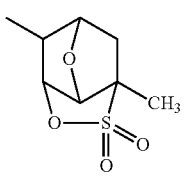 (0-1-28)

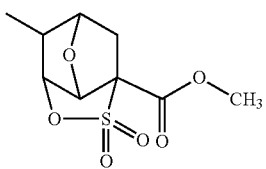 (0-1-29)

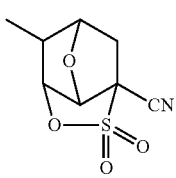 (0-1-30)

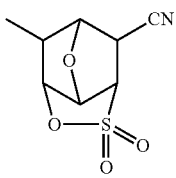 (0-1-31)

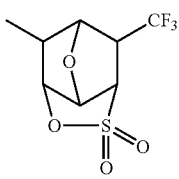 (0-1-32)

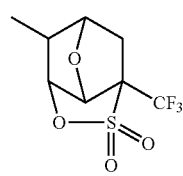 (0-1-33)

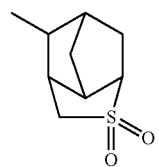 (0-2-1)

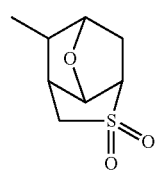 (0-2-2)

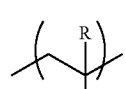 (0-3-1)

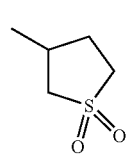 (0-4-1)

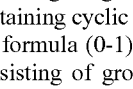

Among the groups described above, the —SO$_2$— moiety-containing cyclic group is preferably a group represented by the formula (0-1), and at least one selected from the group consisting of groups represented by the formulae (0-1-1), (0-1-18), (0-3-1) and (0-4-1) is more preferred, while a group represented by the formula (0-1-1) is most preferred.

More specific examples of the constituent unit (a0) include a constituent unit represented by the following formula (a0-1):

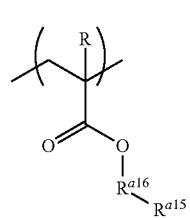 (a0-1)

wherein in the formula (a0-1), R represents a hydrogen atom, an alkyl group having 1 to 5 carbon atoms, or a halogenated alkyl group having 1 to 5 carbon atoms; $R^{a15}$ represents a —SO$_2$— moiety-containing cyclic group; and $R^{a16}$ represents a single bond or a divalent linking group.

In the formula (a0-1), R has the same meaning as defined above. $R^{a15}$ represents the same —SO$_2$— moiety-containing cyclic group as that described above; and $R^{a16}$ may be any of a single bond and a divalent linking group. In view of having excellent effects of the present invention, a divalent linking group is preferred.

The divalent linking group for $R^{a16}$ is not particularly limited, and for example, the same groups mentioned as the divalent linking group for $Y^{a1}$ in the formula (a1-0-2) that were described in the explanation on the constituent unit (a1), may be used. Among those, it is preferable that the divalent linking group contain an alkylene group or an ester bond (—C(=O)—O—). The alkylene group is preferably a linear or branched alkylene group. Specific examples of the divalent linking group include the same linear alkylene groups and branched alkylene groups as those mentioned as the aliphatic hydrocarbon groups for $Y^{a1}$. The divalent linking group containing an ester bond is particularly preferably a group represented by the formula: —$R^{a17}$—C(=O)—O— [wherein $R^{a17}$ represents a divalent linking group]. That is, the constituent unit (a0) is preferably a constituent unit represented by the following formula (a0-11):

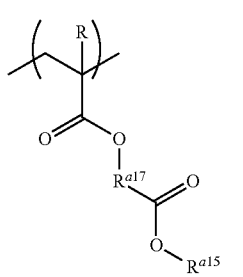
(a0-11)

wherein in the formula (a0-11), R and $R^{a15}$ are the same as R and $R^{a15}$, respectively, of the formula (a0-1); and $R^{a17}$ represents a divalent linking group.

$R^{a17}$ is not particularly limited, and examples thereof include the same groups as the divalent linking group for $Y^{a1}$ in the formula (a1-0-2) described in the explanation on the constituent unit (a1).

The divalent linking group for $R^{a17}$ is preferably a linear or branched alkylene group, a divalent alicyclic hydrocarbon group, or a divalent linking group containing a heteroatom. Examples of the linear or branched alkylene group, the divalent alicyclic hydrocarbon group, and the divalent linking group containing a heteroatom include the same examples of the linear or branched alkylene group, the divalent alicyclic hydrocarbon group, and the divalent linking group containing a heteroatom, respectively, as those described above for $Y^{a1}$. Among the groups described above, a linear or branched alkylene group, or a divalent linking group containing an oxygen atom as a heteroatom is preferred.

The linear alkylene group is preferably a methylene group or an ethylene group and a methylene group is particularly preferred. The branched alkylene group is preferably an alkylmethylene group or an alkylethylene group, and —CH(CH$_3$)—, —C(CH$_3$)$_2$— or —C(CH$_3$)$_2$CH$_2$— is particularly preferred.

The divalent linking group containing an oxygen atom is preferably a divalent linking group containing an ether bond or an ester bond, and the above-described groups represented by the formulae: -A-O-B-, -[A-C(=O)—O]m'-B- or -A-O—C(=O)-B- are more preferred. Among them, a group represented by the formula: -A-O—C(=O)-B- is preferred, and a group represented by the formula: —(CH$_2$)$_{c0}$—C(=O)—O—(CH$_2$)$_{d0}$— is particularly preferred. c0 represents an integer from 1 to 5, and is preferably 1 or 2. d0 represents an integer from 1 to 5, and is preferably 1 or 2.

The constituent unit (a0) is particularly preferably a constituent unit represented by the following formula (a0-21) or (a0-22), and a constituent unit represented by the formula (a0-22) is more preferred.

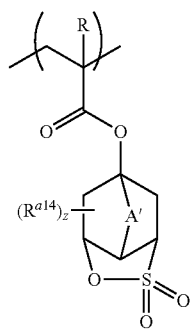
(a0-21)

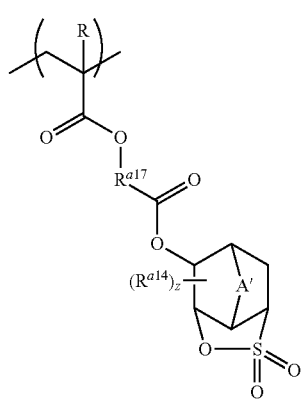
(a0-22)

wherein in the formulae (a0-21) to (a0-22), R, A', $R^{a14}$, z and $R^{a17}$ respectively have the same meanings as defined above.

In the formula (a0-21), A' is preferably a methylene group, an oxygen atom (—O—), or a sulfur atom (—S—).

$R^{a17}$ is preferably a linear or branched alkylene group, or a divalent linking group containing an oxygen atom. Examples of the linear or branched alkylene group and the divalent linking group containing an oxygen atom for $R^{a17}$ include the same examples of the linear or branched alkylene group and the divalent linking group containing an oxygen atom, respectively, as described above.

The constituent unit represented by the formula (a0-22) is particularly preferably a constituent unit represented by the following formula (a0-22a) or (a0-22b):

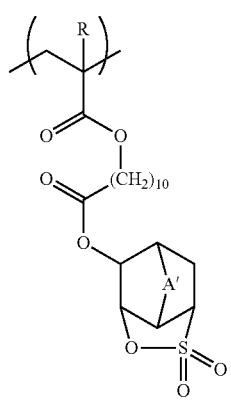
(a0-22a)

(a0-22b)

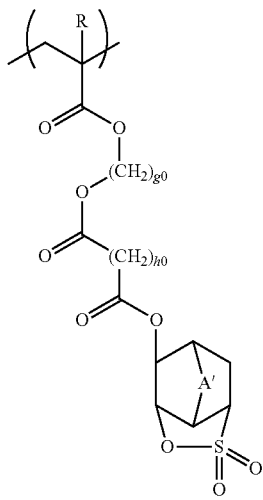

wherein in the formulae (a0-22a) and (a0-22b), R and A' respectively have the same meanings as defined above; and f0, g0 and h0 each independently represent an integer from 1 to 3.

The constituent unit (a0) is such that one kind of the constituent unit may be included alone in the resin (a), or two or more kinds thereof may be included. The proportion of the constituent unit (a0) in the resin (a) is preferably 5% to 60% by mole, more preferably 10% to 50% by mole, and even more preferably 15% to 40% by mole, relative to the total amount of all the constituent units constituting the resin (a). When the proportion is greater than or equal to the lower limit, sensitivity, resolution, and lithographic properties are enhanced. When the proportion is less than or equal to the upper limit, a balance with the other constituent units can be achieved, and solubility in organic solvents is also satisfactory.

[Constituent Unit (a2)]

The constituent unit (a2) is a constituent unit derived from an acrylic acid ester containing a lactone-containing cyclic group. Here, the lactone-containing cyclic group indicates a cyclic group containing one ring containing a —O—C(=O)— structure (lactone ring). The lactone ring is counted as a first ring, and when there is only a lactone ring, the lactone-containing cyclic group is referred to as a monocyclic group, while when the lactone-containing cyclic group further has other ring structures, the group is referred to as a polycyclic group irrespective of the structure.

The lactone cyclic group of the constituent unit (a2) is effective, in the case where the resin (a) is used for the formation of a resist film, in view of increasing the adhesiveness of the resist film to a substrate.

Regarding the lactone cyclic group for the constituent unit (a2), any lactone cyclic group can be used without any particular limitations. Specific examples of the lactone-containing cyclic group may be groups obtainable by eliminating one hydrogen atom each from 4-membered to 6-membered lactone rings, for example, a group obtainable by eliminating one hydrogen atom from a β-propionolactone, a group obtainable by eliminating one hydrogen atom from a γ-butyrolactone, and a group obtainable by eliminating one hydrogen atom from a δ-valerolactone. Furthermore, examples of the lactone-containing polycyclic group include groups obtainable by eliminating one hydrogen atom each from a bicycloalkane, a tricycloalkane and a tetracycloalkane having a lactone ring.

Specific examples of the constituent unit (a2) will be described below. In each of the following formulae, $R^\alpha$ represents a hydrogen atom, a methyl group, or a trifluoromethyl group.

(a2-1-1)

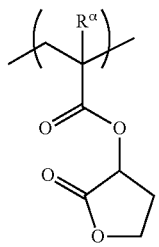

(a2-1-2)

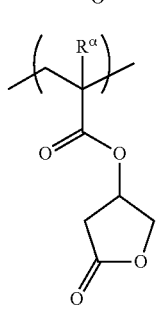

(a2-1-3)

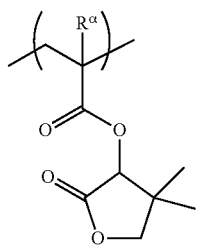

(a2-1-4)

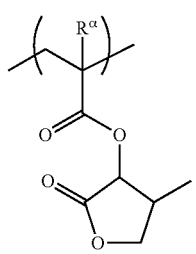

(a2-1-5)

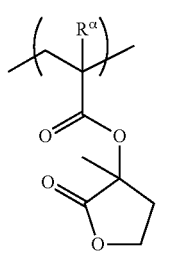

(a2-1-6)

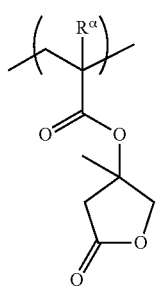

(a2-1-7) 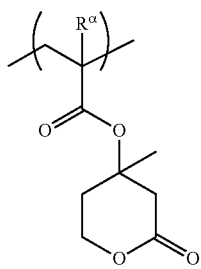
(a2-1-8) 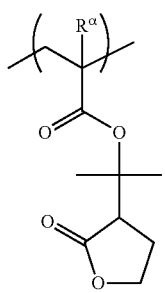
(a2-1-9) 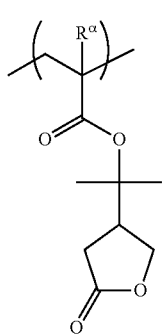
(a2-1-10) 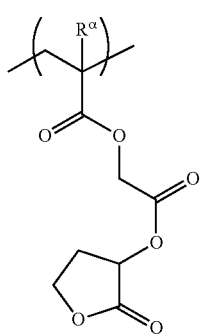
(a2-1-11) 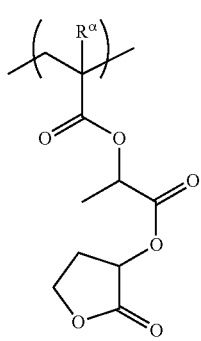
(a2-1-12) 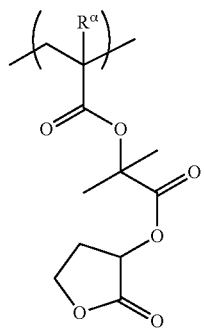
(a2-1-13) 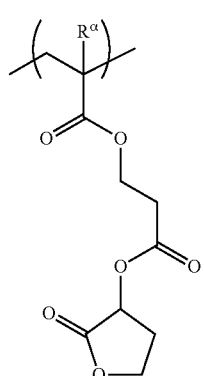
(a2-2-1) 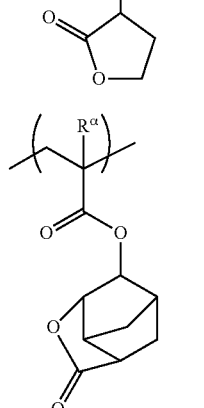
(a2-2-2) 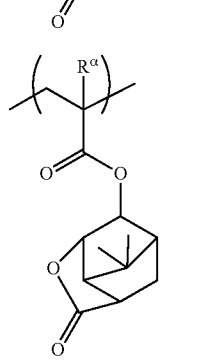
(a2-2-3) 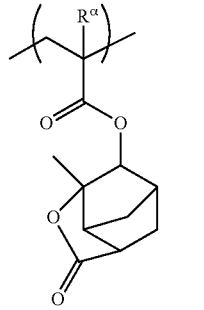

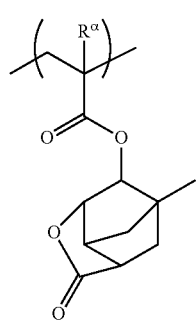 (a2-2-4)
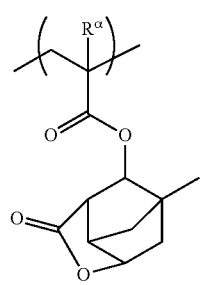 (a2-2-5)
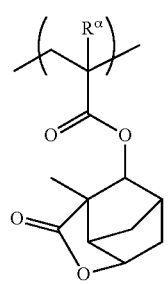 (a2-2-6)
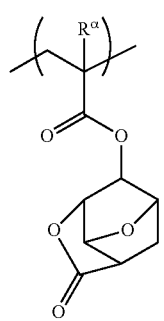 (a2-2-7)
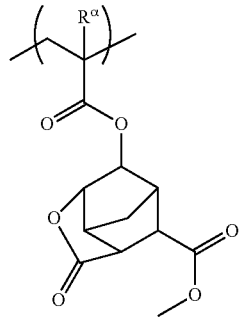 (a2-2-8)
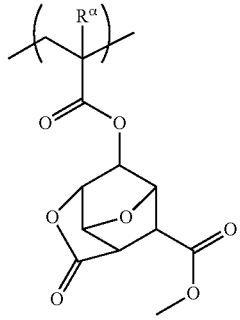 (a2-2-9)
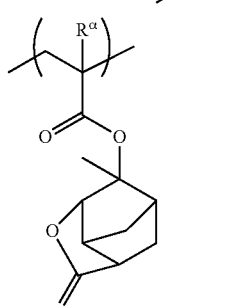 (a2-2-10)
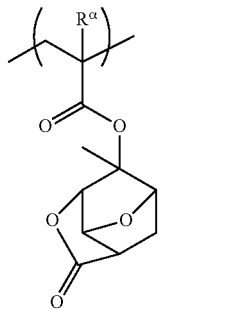 (a2-2-11)
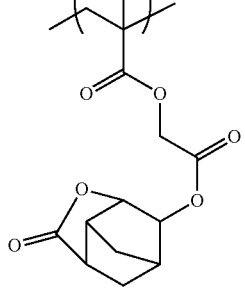 (a2-2-12)
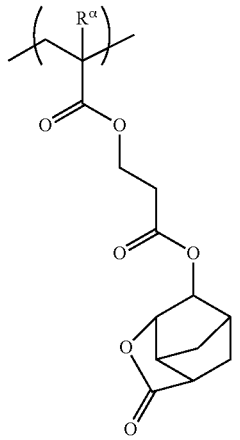 (a2-2-13)

(a2-2-14)
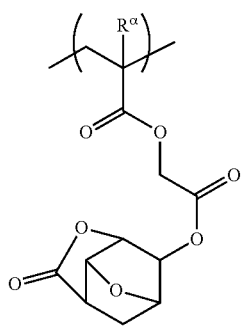
(a2-2-15)
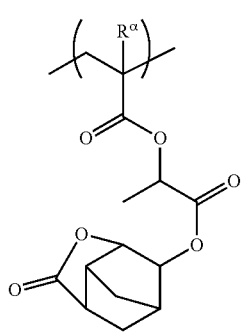
(a2-2-16)
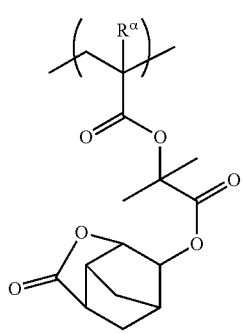
(a2-2-17)
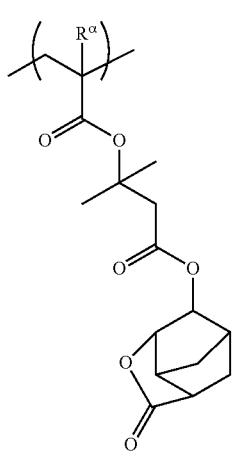
(a2-3-1)
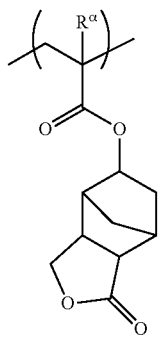
(a2-3-2)
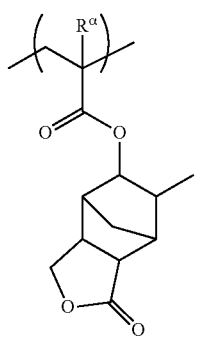
(a2-3-3)
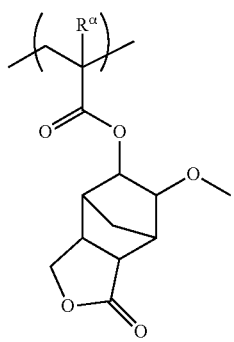
(a2-3-4)
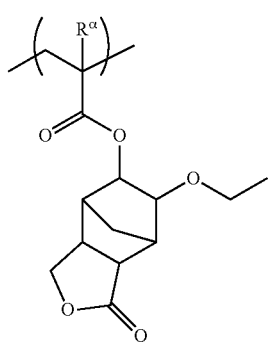

(a2-3-5)
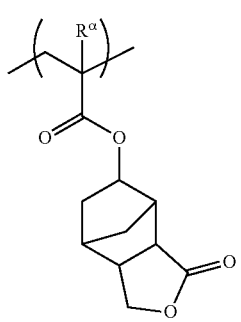
(a2-4-1)
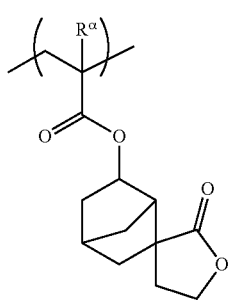
(a2-4-2)
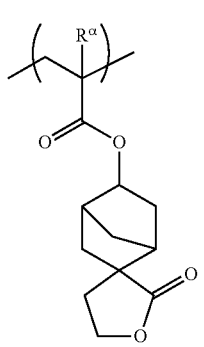
(a2-4-3)
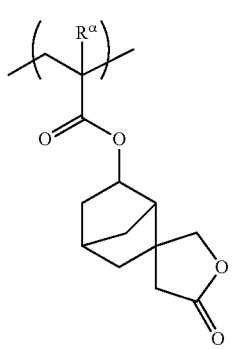
(a2-4-4)
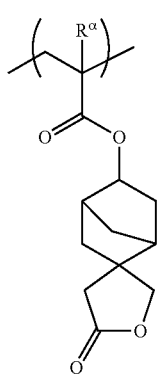
(a2-4-5)
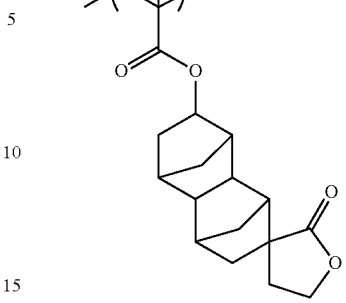
(a2-4-6)
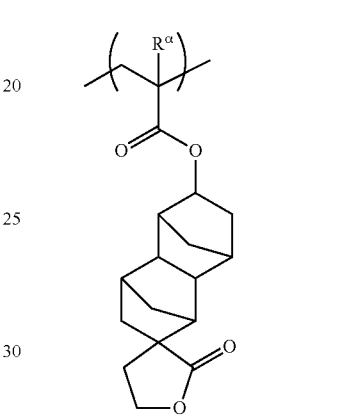
(a2-4-7)
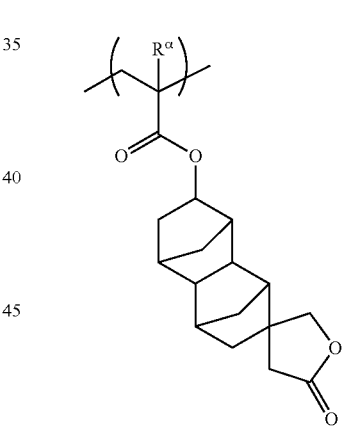
(a2-4-8)
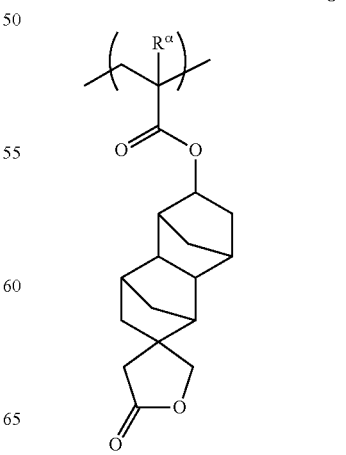

(a2-4-9)
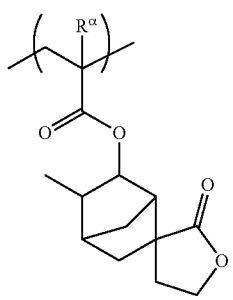
(a2-4-10)
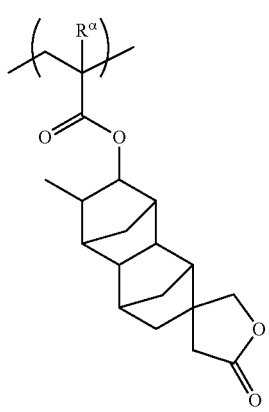
(a2-4-11)
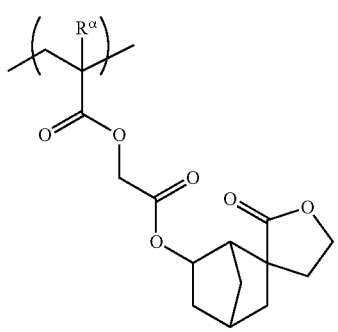
(a2-4-12)
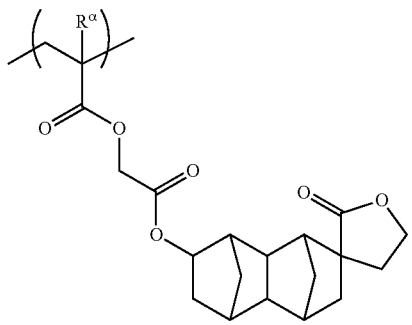
(a2-5-1)
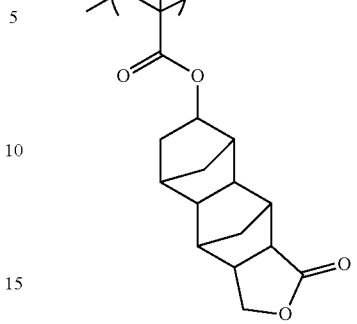
(a2-5-2)
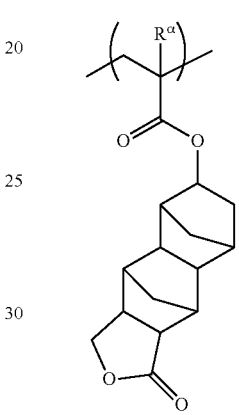
(a2-5-3)
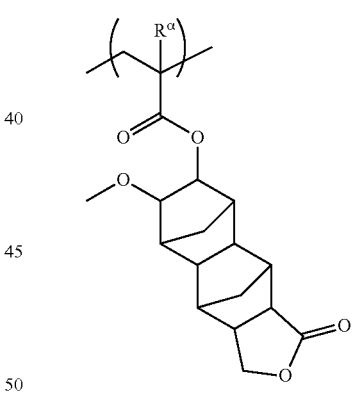
(a2-5-4)
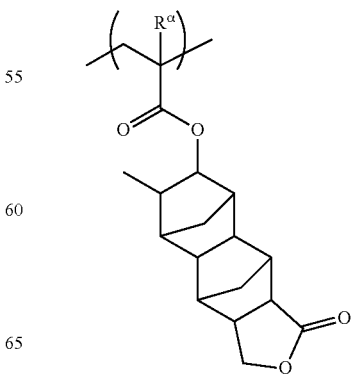

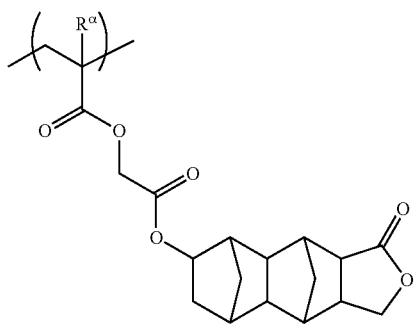
(a2-5-5)

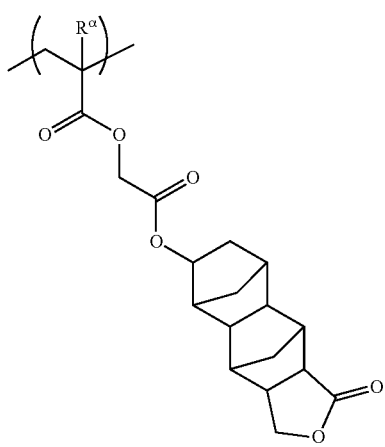
(a2-5-6)

For the resin (a), one kind of the constituent (a2) unit may be used alone, or two or more kinds thereof may be used in combination. The proportion of the constituent unit (a2) in the resin (a) is preferably 5% to 60% by mole, more preferably 10% to 50% by mole, and even more preferably 20% to 50% by mole, relative to the total amount of all the constituent units that constitute the resin (a).

[Constituent Unit (a3)]

The constituent unit (a3) is a constituent unit (a3) derived from an acrylic acid ester containing a polar group-containing aliphatic hydrocarbon group. When the resin (a) includes the constituent unit (a3), hydrophilicity of the resin (a) is increased, and sensitivity, resolution, lithographic properties and the like are enhanced. Meanwhile, the constituent unit (a3) is a constituent unit which does not correspond to the constituent units (a1), (a0) and (a2). That is, a constituent unit which corresponds to the constituent unit (a1), (a0) or (a2) even if the constituent unit is a "constituent unit derived from an acrylic acid ester containing a polar group-containing aliphatic hydrocarbon group," does not correspond to the constituent unit (a3).

Examples of the polar group include a hydroxyl group, a cyano group, a carboxy group, and a fluorinated alcohol group (a hydroxyalkyl group in which a portion of the hydrogen atoms of an alkyl group are substituted by fluorine atoms). Among these, a hydroxyl group and a carboxyl group are preferred, and a hydroxyl group is particularly preferred.

In regard to the constituent unit (a3), the number of polar groups that are bonded to the aliphatic hydrocarbon group is not particularly limited, but the number of polar groups is preferably 1 to 3, and most preferably 1. The aliphatic hydrocarbon group to which a polar group is bonded may be saturated or may be unsaturated, but it is preferable that the aliphatic hydrocarbon group be saturated.

Specific examples of the aliphatic hydrocarbon group include a linear or branched aliphatic hydrocarbon group, and an aliphatic hydrocarbon group containing a ring in the structure.

The "linear or branched aliphatic hydrocarbon group" preferably has 1 to 12 carbon atoms, more preferably 1 to 10 carbon atoms, even more preferably 1 to 8 carbon atoms, and still more preferably 1 to 6 carbon atoms. The linear or branched aliphatic hydrocarbon group is such that a portion or all of the hydrogen atoms may be substituted by substituents other than polar groups. Examples of the substituents other than polar groups include a fluorine atom, a fluorinated alkyl group having 1 to 5 carbon atoms and substituted with a fluorine atom, and an oxygen atom (=O). Furthermore, the linear or branched aliphatic hydrocarbon group may be interrupted, between the carbon atoms, by a divalent group containing a heteroatom. Examples of the "divalent group containing a heteroatom" include the same "divalent linking groups containing a heteroatom" as those described as the divalent linking group for $Y^{a1}$ in the formula (a1-0-2) in the explanation on the constituent unit (a1).

When the aliphatic hydrocarbon group is linear or branched, the constituent unit (a3) is preferably a constituent unit represented by the following formula (a3-1) or (a3-2):

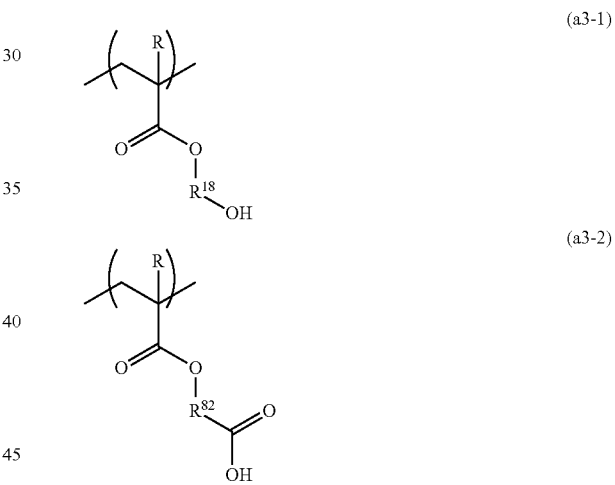

wherein in the formulae (a3-1) and (a3-2), R represents a hydrogen atom, an alkyl group having 1 to 5 carbon atoms, or a halogenated alkyl group having 1 to 5 carbon atoms; $R^{81}$ represents a linear or branched alkylene group; and $R^{82}$ represents an alkylene group which may be interrupted by a divalent group containing a heteroatom.

In the formula (a3-1), the number of carbon atoms of the alkylene group for $R^{81}$ is preferably 1 to 12, and more preferably 1 to 10. In the formula (a3-2), the number of carbon atoms of the alkylene group for $R^{82}$ is preferably 1 to 12, more preferably 1 to 10, and particularly preferably 1 to 6.

When the alkylene group is an alkylene group having 2 or more carbon atoms, the alkylene group may be interrupted, between the carbon atoms, by a divalent group containing a heteroatom. Examples of the "divalent group containing a heteroatom" include the same "divalent linking groups containing a heteroatom" as those described as the divalent linking group for $Y^{a1}$ in the formula (a1-0-2) in the explanation on the constituent unit (a1).

$R^{82}$ is particularly preferably an alkylene group which is not interrupted by a divalent group containing a heteroatom, or an alkylene group which is interrupted by a divalent group containing an oxygen atom as a heteroatom. The alkylene group which is interrupted by a divalent group containing an oxygen atom is preferably a group represented by the formula: -A-O-B- or -A-O—C(═O)-B-. In the formulae, A and B each independently represent a divalent hydrocarbon group which may be substituted, and examples thereof include the same divalent hydrocarbon groups of A and B for the formulae: -A-O-B- and -A-O—C(═O)-B- described in the explanation on the constituent unit (a1). Among these, a group represented by the formula: -A-O—C(═O)-B- is preferred, and a group represented by the formula: —(CH$_2$)$_f$—O—C(═O)—(CH$_2$)$_{g'}$— [wherein f and g' each independently represent an integer from 1 to 3] is preferred.

Examples of the "aliphatic hydrocarbon group containing a ring in the structure" include a cyclic aliphatic hydrocarbon group, and a group in which a cyclic aliphatic hydrocarbon group is bonded to an end of the linear aliphatic hydrocarbon group described above or is inserted in the middle of the linear aliphatic hydrocarbon group. The number of carbon atoms of the cyclic aliphatic hydrocarbon group is preferably 3 to 30. Furthermore, the cyclic aliphatic hydrocarbon group may be polycyclic or may be monocyclic, and the cyclic aliphatic hydrocarbon group is preferably polycyclic.

Specifically, the cyclic aliphatic hydrocarbon group can be appropriately selected for use among, for example, a large number of those groups suggested for the resins for resist compositions for ArF excimer laser. For example, the monocyclic aliphatic hydrocarbon group is preferably a group obtainable by eliminating two or more hydrogen atoms from a monocycloalkane having 3 to 20 carbon atoms, and examples of the monocycloalkane include cyclopentane and cyclohexane. The polycyclic aliphatic hydrocarbon group is preferably a group obtainable by eliminating two or more hydrogen atoms from a polycycloalkane having 7 to 30 carbon atoms, and specific examples of the polycycloalkane include adamantane, norbornane, isobornane, tricyclodecane, and tetracyclododecane.

The cyclic aliphatic hydrocarbon group may have a portion or all of the hydrogen atoms substituted by substituents other than the polar groups described above. Examples of the substituents other than polar groups include an alkyl group having 1 to 5 carbon atoms, a fluorine atom, a fluorinated alkyl group having 1 to 5 carbon atoms and substituted with a fluorine atom, and an oxygen atom (═O).

When the aliphatic hydrocarbon group contains a ring in the structure, the constituent unit (a3) is preferably a constituent unit represented by the following formula (a3-3), (a3-4) or (a3-5):

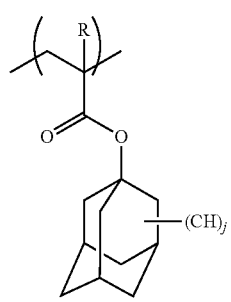
(a3-3)

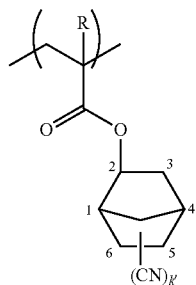
(a3-4)

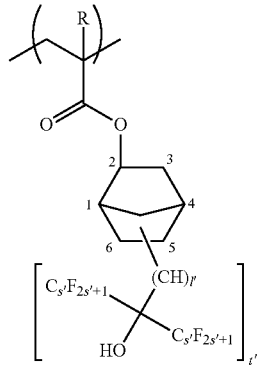
(a3-5)

wherein in the formulae (a3-3) to (a3-5), R has the same meaning as defined above; j represents an integer from 1 to 3; k' represents an integer from 1 to 3; t' represents an integer from 1 to 3; l' represents an integer from 1 to 5; and s' represents an integer from 1 to 3.

In the formula (a3-3), j is preferably 1 or 2, and more preferably 1. When j is 2, it is preferable that the hydroxyl groups be bonded to the 3-position and the 5-position of the adamantyl group. When j is 1, it is preferable that the hydroxyl group be bonded to the 3-position of the adamantyl group.

In the formula (a3-4), k' is preferably 1. It is preferable that the cyano group be bonded to the 5-position or the 6-position of the norbornyl group.

In the formula (a3-5), t' is preferably 1; l' is preferably 1; and s' is preferably 1. In the formula (a3-5), it is preferable that the oxygen atom (—O—) of the carbonyloxy group be bonded to the 2-position or the 3-position of the norbornane ring. The fluorinated alkyl alcohol group is preferably bonded to the 5-position or the 6-position of the norbornyl group.

The constituent unit (a3) included in the resin (a) is such that one kind of the constituent unit may be included in the resin, or two or more kinds thereof may be used together. The constituent unit (a3) preferably includes any one of constituent units represented by the formulae (a3-1) to (a3-5) described above, and particularly preferably includes a constituent unit represented by the formula (a3-3).

When the resin (a) includes a constituent unit (a3), the proportion of the constituent unit (a3) in the resin (a) is preferably 1% to 50% by mole, more preferably 5% to 40% by mole, and even more preferably 5% to 25% by mole, relative to the total amount of all the constituent units that constitute the resin (a).

[Constituent Unit (a4)]

The constituent unit (a4) is a constituent unit derived from hydroxystyrene. Specific examples of the constituent unit (a4) include structures of the following formulae (a4-1) and (a4-2):

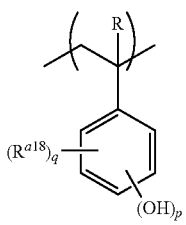

(a4-1)

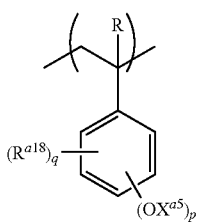

(a4-2)

wherein R represents a hydrogen atom, an alkyl group having 1 to 5 carbon atoms, or a halogenated alkyl group having 1 to 5 carbon atoms; $R^{a18}$ represents a halogen atom, a lower alkyl group having 1 to 5 carbon atoms, or a halogenated alkyl group; p represents an integer from 1 to 3; q represents an integer from 0 to 4, provided that the value of p+q is from 1 to 5. In the formula (a5-2), $X^{a5}$ represents an acid-dissociable dissolution suppressing group.

In the formulae (a4-1) and (a4-2), R represents a hydrogen atom, an alkyl group having 1 to 5 carbon atoms, or a halogenated alkyl group having 1 to 5 carbon atoms. Suitable examples of R include the same groups as those described above.

In the formulae (a4-1) and (a4-2), $R^{a18}$ represents a halogen atom, a lower alkyl group having 1 to 5 carbon atoms, or a halogenated alkyl group. Examples of the halogen atom for $R^{a18}$ include a fluorine atom, a chlorine atom, a bromine atom, and an iodine atom, and a fluorine atom is particularly preferred. The lower alkyl group for $R^{a18}$ is a lower alkyl group having 1 to 5 carbon atoms, and examples thereof include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group. Examples of the halogenated alkyl group for $R^{a18}$ include groups in which a portion or all of the hydrogen atoms of the lower alkyl group for $R^{a18}$ are substituted by halogen atoms, and a fluorinated lower alkyl group is preferred.

In the formulae (a4-1) and (a4-2), p represents an integer from 1 to 3, and preferably 1.

The bonding position of the hydroxyl group may be any of the o-position, the m-position and the p-position of the phenyl group. When p is 1, the p-position is preferred from the viewpoints of easy availability and low cost. When p is 2 or 3, any arbitrary positions of substitution may be used in combination.

In the formulae (a4-1) and (a4-2), q represents an integer from 0 to 4, preferably an integer from 0 to 2, more preferably 0 or 1, and particularly preferably 0.

The position of substitution of $R^{a18}$ may be, in the case where q is 1, any of the o-position, the m-position, and the p-position. When q is 2, any arbitrary positions of substitution may be used in combination. Plural $R^{a18}$'s may be identical with each other, or may be different from each other. However, the value of p+q is from 1 to 5.

In the formula (a4-2), $X^{a5}$ is not particularly limited as long as it is an acid-dissociable group. Suitable examples of the acid-dissociable group include the tertiary alkyl ester type acid-dissociable group and acetal type acid-dissociable group described above, and the acetal type acid-dissociable group is preferred. Specific suitable examples of the acid-dissociable group include groups represented by the formulae (p1) and (p2) described above.

The component (A1) may use one kind of the constituent unit (a4) alone, or may use two or more kinds thereof in combination.

The proportion of the constituent unit (a4) in the resin (a) is such that, in the case of the constituent unit represented by the formula (a4-1), the proportion is preferably 10% to 90% by mole, preferably 20% to 80% by mole, and more preferably 40% to 80% by mole, relative to the total amount of all the constituent units that constitute the resin (a). In the case of the constituent unit represented by the formula (a4-2), the proportion is preferably 5% to 90% by mole, and more preferably 10% to 60% by mole, relative to the total amount of all the constituent units that constitute the resin (a).

[Constituent Unit (a5)]

The constituent unit (a5) is a constituent unit derived from styrene. According to the present invention, the constituent unit (a5) is not essential; however, when this constituent unit is incorporated, it is easy to regulate solubility of the resin (a) in a developer liquid containing an organic solvent.

The term "styrene" as used herein is a concept which includes styrene, and compounds in which the hydrogen atom at the a-position of styrene is substituted by another substituent such as an alkyl group.

The "constituent unit derived from styrene" means a constituent unit that is formed as a result of cleavage of the ethylenic double bonds of styrene. Styrene may have the hydrogen atoms of the phenyl group substituted by substituents such as an alkyl group having 1 to 5 carbon atoms.

Specific examples of the constituent unit (a5) include a constituent unit having a structure represented by the following formula (a5-1):

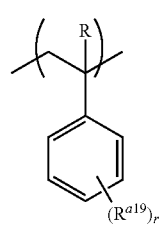

(a5-1)

wherein in the formula (a5-1), R has the same meaning as defined above; $R^{a19}$ represents a halogen atom, a lower alkyl group having 1 to 5 carbon atoms, or a halogenated alkyl group; and r represents an integer from 0 to 3.

In the formula (a5-1), R has the same meaning as R in the formula (a4-1) described above. $R^{a19}$ may be the same as $P^{a18}$ in the formula (a4-1). r represents an integer from 0 to 3, preferably 0 or 1, and more preferably 0.

When r is 1, the position of substitution of $R^{a18}$ may be any of the o-position, the m-position, and the p-position of the phenyl group. When r is 2 or 3, any arbitrary positions of substitution may be used in combination. Plural $R^{a18}$'s may be identical with each other, or may be different from each other.

The constituent unit (a5) is such that one kind thereof may be used alone, or two or more kinds thereof may be used in combination.

When the resin (a) has a constituent unit (a5), the proportion of the constituent unit (a5) in the resin (a) is preferably 1% to 20% by mole, more preferably 3% to 15% by mole, and even more preferably 5% to 15% by mole, relative to the total amount of all the constituent units that constitute the resin (a).

The component (A) described above is such that one kind thereof may be used alone, or two or more kinds thereof may be used in combination. The content of the component (A) in the resist composition is not particularly limited, and is appropriately adjusted in accordance with the resist film thickness to be formed, or the like.

[Component (B)]

The component (B) is a compound which generates an acid when irradiated with actinic rays or radiation, and can be appropriately selected for use from those compounds used as acid generators for the materials for forming resist films. The compounds used as the component (B) may be used alone, or two or more kinds thereof may be used in combination.

Examples of the acid generators include various kinds of acid generators such as onium salt-based acid generators such as iodonium salts and sulfonium salts; oxime sulfonate-based acid-generators; diazomethane-based acid generators such as bisalkyl- or bisarylsulfonyldiazomethanes and poly(bissulfonyl)diazomethanes; nitrobenzyl sulfonate-based acid generators; iminosulfonate-based acid generators; and disulfone-based acid generators.

As an onium salt-based acid generator, for example, a compound represented by the following formula (b1) or (b2) can be used:

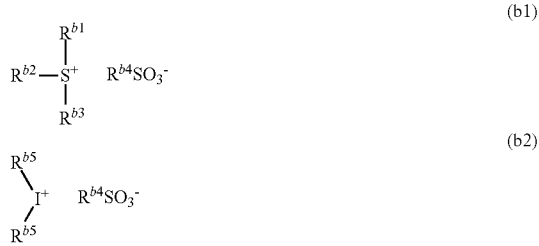

wherein in the formulae (b1) and (b2), $R^{b1}$ to $R^{b3}$ and $R^{b5}$ to $R^{b6}$ each independently represent an aryl group or an alkyl group, both of which may be substituted; any two of $R^{b1}$ to $R^{b3}$ in the formula (b1) may be bonded to each other to form a ring together with the sulfur atom in the formula; $R^{b4}$ represents an alkyl group which may have a substituent, a halogenated alkyl group, an aryl group, or an alkenyl group; at least one of $R^{b1}$ to $R^{b3}$ represents an aryl group; and at least one of $R^{b5}$ to $R^{b6}$ represents an aryl group.

In the formula (b1), $R^{b1}$ to $R^{b3}$ each independently represent an aryl group or an alkyl group, both of which may have a substituent. Meanwhile, among $R^{b1}$ to $R^{b3}$ in the formula (b1), any two of them may be bonded to each other and form a ring together with the sulfur atom in the formula. Furthermore, at least one of $R^{b1}$ to $R^{b3}$ represents an aryl group. It is preferable that two or more of $R^{b1}$ to $R^{b3}$ be aryl groups, and it is most preferable that all of $R^{b1}$ to $R^{b3}$ be aryl groups.

There are no particular limitations on the aryl group for $R^{b1}$ to $R^{b3}$, and an example thereof may be an aryl group having 6 to 20 carbon atoms. The aryl group is preferably an aryl group having 6 to 10 carbon atoms from the viewpoint that the compound can be synthesized at low cost. Specific examples thereof include a phenyl group and a naphthyl group.

The aryl group may have a substituent. The term "have a substituent" means that a portion or all of the hydrogen atoms of the aryl group are substituted by substituents. Examples of the substituents that may be carried by the aryl group include an alkyl group, an alkoxy group, a halogen atom, a hydroxyl group, an alkoxyalkyloxy group, and —O—$R^{b7}$—C(=O)—(O)$_{n''}$—$R^{b8}$ [wherein $R^{b7}$ represents an alkylene group or a single bond; $R^{b8}$ represents an acid-dissociable group or a non-acid-dissociable group; and n" represents 0 or 1].

The alkyl group which may be used to substitute a hydrogen atom of the aryl group is preferably an alkyl group having 1 to 5 carbon atoms, and is more preferably a methyl group, an ethyl group, a propyl group, an n-butyl group or a tert-butyl group.

The alkoxy group which may be used to substitute a hydrogen atom of the aryl group is preferably an alkoxy group having 1 to 5 carbon atoms, and a methoxy group, an ethoxy group, an n-propoxy group, an isopropoxy group, an n-butoxy group and a tert-butoxy group are preferred, while a methoxy group and an ethoxy group are most preferred.

The halogen atom which may be used to substitute a hydrogen atom of the aryl group is preferably a fluorine atom.

The alkoxyalkyloxy group which may be used to substitute a hydrogen atom of the aryl group may be, for example, a group represented by the following formula:

—O—C($R^{b9}$)($R^{b10}$)—O—$R^{b11}$ wherein $R^{b9}$ and $R^{b10}$ each independently represent a hydrogen atom, or a linear or branched alkyl group; $R^{b11}$ represents an alkyl group; and $R^{b10}$ and $R^{b11}$ may also be bonded to each other and form one ring structure, provided that at least one of $R^{b9}$ and $R^{b10}$ is a hydrogen atom.

In regard to $R^{b9}$ and $R^{b10}$, the number of carbon atoms of the alkyl group is preferably 1 to 5, and an ethyl group and a methyl group are preferred, while a methyl group is most preferred. It is preferable that any one of $R^{b9}$ and $R^{b10}$ be a hydrogen atom, and the other be a hydrogen atom or a methyl group, while it is particularly preferable that both of $R^{b9}$ and $R^{b10}$ be hydrogen atoms.

The alkyl group for $R^{b11}$ preferably has 1 to 15 carbon atoms, and may be any of linear, branched and cyclic. The linear or branched alkyl group for $R^{b11}$ preferably has 1 to 5 carbon atoms, and examples thereof include a methyl group, an ethyl group, a propyl group, an n-butyl group, and a tert-butyl group.

The cyclic alkyl group for $R^{b11}$ preferably has 4 to 15 carbon atoms, more preferably 4 to 12 carbon atoms, and most preferably 5 to 10 carbon atoms. Specific examples thereof include groups obtainable by eliminating one or more hydrogen atoms each from monocycloalkanes which may or may not be substituted with an alkyl group having 1 to 5 carbon atoms, a fluorine atom, or a fluorinated alkyl group, or from polycycloalkanes such as a bicycloalkane, a tricycloalkane and a tetracycloalkane. Examples of the monocycloalkanes include cyclopentane and cyclohexane. Examples of the polycycloalkanes include adamantane, norbornane, isobornane, tricyclodecane, and tetracyclododecane. Among them, a group obtainable by eliminating one or more hydrogen atoms from adamantane is preferable.

$R^{b10}$ and $R^{b11}$ may be bonded to each other and form one ring structure. In this case, a cyclic group is formed between $R^{b10}$, $R^{b11}$, the oxygen atom to which $R^{b11}$ is bonded, and the carbon atom to which an oxygen atom and $R^{b10}$ are bonded.

The cyclic group in this case is preferably a 4-membered to 7-membered ring, and a 4-membered to 6-membered ring is more preferred.

In —O—$R^{b7}$—C(=O)—(O)$_{n''}$—$R^{b8}$, which is a group in which the hydrogen atoms of the aryl group may be substituted, the alkylene group for $R^{b7}$ is preferably a linear or branched alkylene group, and the number of carbon atoms is preferably 1 to 5. Specific examples of the alkylene group include a methylene group, an ethylene group, a trimethylene group, a tetramethylene group, and a 1,1-dimethylethylene group.

The acid-dissociable group for $R^{b8}$ is not particularly limited as long as the acid-dissociable group is an organic group which is capable of dissociation under the action of an acid (the acid generated from the component (B) upon exposure), and examples thereof include the same acid-dissociable dissolution suppressing groups as those described in the explanation on the component (A). Among them, a tertiary alkyl ester type acid-dissociable group is preferred.

Suitable examples of the non-acid-dissociable group for $R^{b8}$ include a decyl group, a tricyclodecyl group, an adamantyl group, a 1-(1-adamantyl)methyl group, a tetracyclododecyl group, an isobornyl group, and a norbornyl group.

When $R^{b1}$ to $R^{b3}$ are alkyl groups, there are no particular limitations. Suitable examples of the alkyl group include linear, branched or cyclic alkyl groups having 1 to 10 carbon atoms. From the viewpoint that a resist composition having excellent resolution can be easily prepared, the number of carbon atoms of the alkyl group is preferably 1 to 5. Specific examples of the alkyl group include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group. Among these alkyl groups, a methyl group is more preferred.

The alkyl group may have a substituent. The term "have a substituent" means that a portion or all of the hydrogen atoms of the alkyl group are substituted by substituents. Examples of the substituents that may be carried by the alkyl group include the same ones described previously as the substituents that may be carried by the aryl group.

In the formula (b1), any two of $R^{b1}$ to $R^{b3}$ may be bonded to each other and form a ring together with a sulfur atom in the formula. The ring thus formed may be saturated or may be unsaturated. Furthermore, the ring thus formed may be monocyclic or may be polycyclic. For example, when any one or both of the two members that form a ring are a cyclic group (a cyclic alkyl group or an aryl group), when the members are bonded to each other, a polycyclic ring (fused ring) is formed.

When any two of $R^{b1}$ to $R^{b3}$ are bonded to each other and form a ring, it is preferable that one ring which contains, in the ring skeleton, the sulfur atom present in the formula (b1), be a 3-membered to 10-membered ring containing a sulfur atom, and it is more preferable that the ring be a 5-membered to 7-membered ring.

Specific examples of the ring that is formed by bonding of any two of $R^{b1}$ to $R^{b3}$ include benzothiophene, dibenzothiophene, 9H-thioxanthene, thioxanthone, thianthrene, phenoxathiin, tetrahydrothiophenium, and tetrahydrothiopyranium. When any two of $R^{b1}$ to $R^{b3}$ are bonded to each other and form a ring together with the sulfur atom in the formula, it is preferable that the remaining one be an aryl group.

In the cation moiety of the compound represented by the formula (b1), preferred examples of the case where all of $R^{b1}$ to $R^{b3}$ are phenyl groups which may be substituted, that is, in the case where the cation moiety has a triphenylsulfonium skeleton, include cation moieties represented by the following formulae (b1-1) to (b1-14):

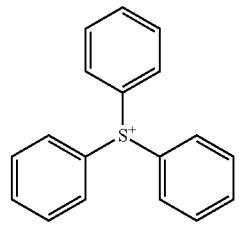

(b1-1)

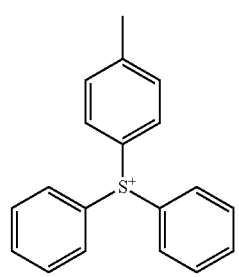

(b1-2)

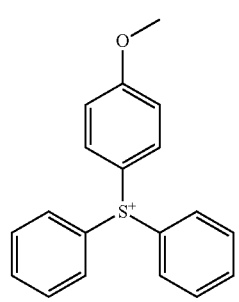

(b1-3)

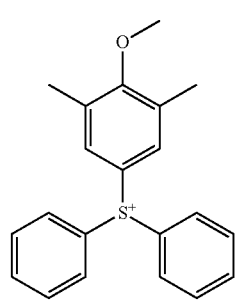

(b1-4)

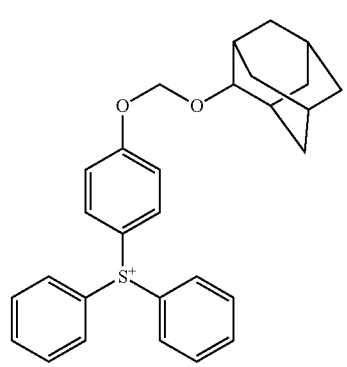

(b1-5)

(b1-6) 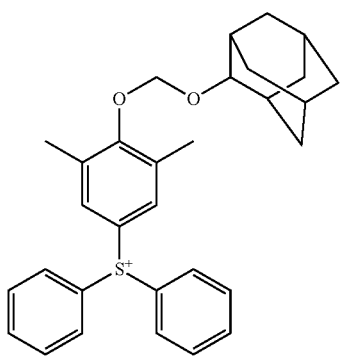
(b1-7) 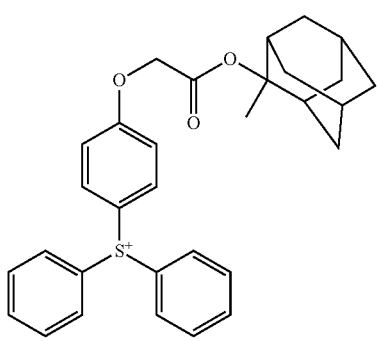
(b1-8) 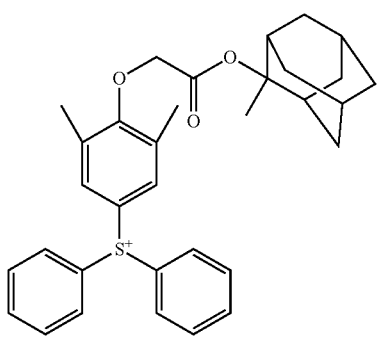
(b1-9) 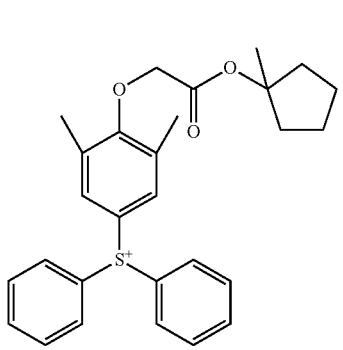
(b1-10) 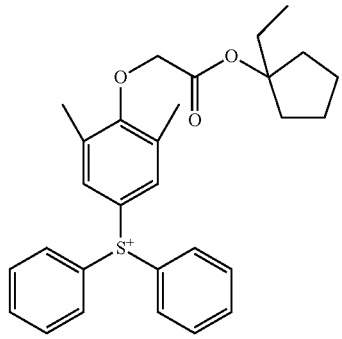
(b1-11) 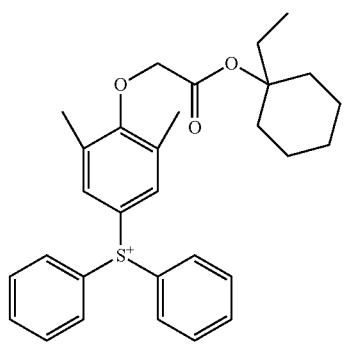
(b1-12) 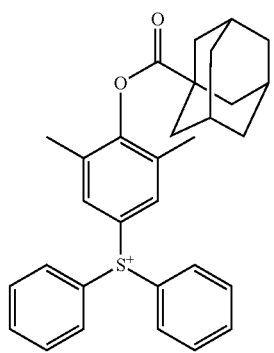
(b1-13) 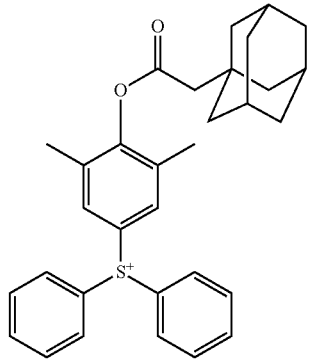

-continued (b1-14)

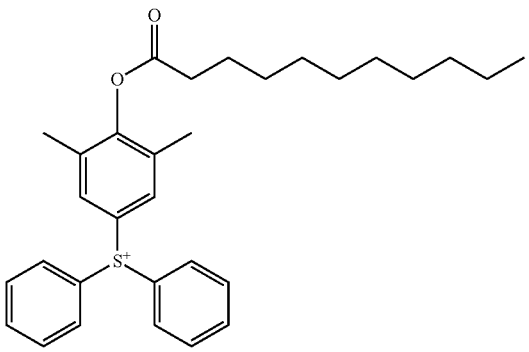

Furthermore, preferred examples also include compounds in which a portion or all of the phenyl groups in these cation moieties are substituted by naphthyl groups which may be substituted. Among the three phenyl groups, it is preferable that one or two be substituted by naphthyl groups.

Furthermore, among the cation moieties of the compounds represented by the formula (b1), specific preferred examples of the case where any two of $R^{b1}$ to $R^{b3}$ are bonded to each other and form a ring together with the sulfur atom in the formula, include cation moieties represented by the following formulae (b1-15) to (b1-18):

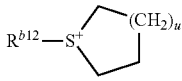

(b1-15)

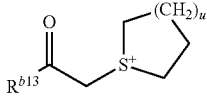

(b1-16)

wherein in the formulae (b1-15) and (b1-16), $R^{b12}$ represents a phenyl group which may have a substituent, a naphthyl group which may have a substituent, or an alkyl group having 1 to 5 carbon atoms; $R^{b13}$ represents a phenyl group which may have a substituent, a naphthyl group which may have a substituent, an alkyl group having 1 to 5 carbon atoms, an alkoxy group having 1 to 5 carbon atoms, or a hydroxyl group; and u represents an integer from 1 to 3.

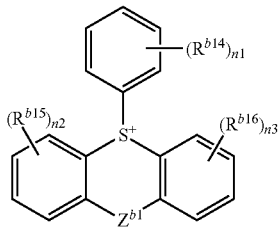

(b1-17)

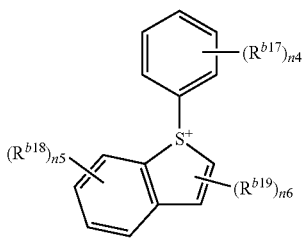

(b1-18)

wherein in the formulae (b1-17) and (b1-18), $Z^{b1}$ represents a single bond, a methylene group, a sulfur atom, an oxygen atom, a nitrogen atom, a carbonyl group, —SO—, —SO$_2$—, —SO$_3$—, —COO—, —CONH—, or N(R$^{b20}$)— (wherein R$^{b20}$ represents an alkyl group having 1 to 5 carbon atoms); $R^{b14}$, and $R^{b15}$ to $R^{b19}$ each independently represent an alkyl group, an acetal group, an alkoxy group, a carboxyl group, a hydroxyl group or a hydroxyalkyl group; n1 to n5 each independently represent an integer from 0 to 3; and n6 represents an integer from 0 to 2.

In the formulae (b1-15) and (b1-16), examples of the substituents which may be carried by the phenyl group or the naphthyl group for $R^{b12}$ and $R^{b13}$ include the same substituents as those which may be carried by the aryl group in the case where $R^{b1}$ to $R^{b3}$ are aryl groups. Furthermore, examples of the substituents which may be carried by the alkyl group for $R^{b12}$ and $R^{b13}$ include the same substituents as those which may be carried by the alkyl group in the case where $R^{b1}$ and $R^{b1}$ are alkyl groups. u represents an integer from 1 to 3, and is preferably 1 or 2.

In the formulae (b1-17) and (b1-18), the alkyl group for $R^{b14}$ to $R^{b19}$ is preferably an alkyl group having 1 to 5 carbon atoms, and among such alkyl groups, linear or branched alkyl groups are more preferred, while a methyl group, an ethyl group, a propyl group, an isopropyl group, an n-butyl group, and a tert-butyl group are particularly preferred. The alkoxy group is preferably an alkoxy group having 1 to 5 carbon atoms, and among such alkoxy groups, linear or branched alkoxy groups are more preferred, while a methoxy group and an ethoxy group are particularly preferred. The hydroxyalkyl group is preferably a group in which one or plural hydrogen atoms in the alkyl group described above are substituted by hydroxy groups, and examples thereof include a hydroxymethyl group, a hydroxyethyl group, and a hydroxypropyl group.

When the reference numerals n1 to n6 assigned to $R^{b14}$ to $R^{b19}$ are each an integer of 2 or greater, the plural groups of $R^{b14}$ to $R^{b19}$ may be respectively identical with each other or may be different from each other. n1 is preferably an integer from 0 to 2, more preferably 0 or 1, and particularly preferably 0. n2 and n3 are each independently preferably 0 or 1, and more preferably 0. n4 is preferably an integer from 0 to 2, and more preferably 0 or 1. n5 is preferably 0 or 1, and more preferably 0. n6 is preferably 0 or 1, and more preferably 1.

In the formulae (b1) and (b2), $R^{b4}$ represents an alkyl group which may have a substituent, a halogenated alkyl group, an aryl group, or an alkenyl group. The alkyl group for $R^{b4}$ may be any of linear, branched, and cyclic. The number of carbon atoms of the linear or branched alkyl group is preferably 1 to 10, more preferably 1 to 8, and particularly preferably 1 to 4.

The number of carbon atoms of the cyclic alkyl group is preferably 4 to 15, more preferably 4 to 10, and particularly preferably 6 to 10.

Examples of the halogenated alkyl group for $R^{b4}$ include groups in which a portion or all of the hydrogen atoms of the linear, branched or cyclic alkyl groups described above are substituted by halogen atoms. Examples of the halogen atoms include a fluorine atom, a chlorine atom, a bromine atom, and an iodine atom, and a fluorine atom is preferred.

In regard to the halogenated alkyl group, the proportion of the number of halogen atoms to the total number of the halogen atoms and hydrogen atoms contained in the halogenated alkyl group (halogenations ratio (%)) is preferably 10% to 100%, more preferably 50% to 100%, and most preferably 100%. As the halogenations ratio increases, the strength of the acid generated increases, which is preferable.

The aryl group for $R^{b4}$ is preferably an aryl group having 6 to 20 carbon atoms. The alkenyl group for $R^{b4}$ is preferably an alkenyl group having 2 to 10 carbon atoms.

With regard to $R^{b4}$, the term "may have a substituent" means that a portion or all of the hydrogen atoms in the linear, branched or cyclic alkyl group, halogenated alkyl group, aryl group or alkenyl group described above may be substituted by substituents (atoms or groups other than hydrogen atoms). The number of substituents for $R^{b4}$ may be one, or may be 2 or greater.

Examples of the substituents include a halogen atom, a heteroatom, an alkyl group, and a group represented by the formula: $R^{b20}$-$Q^{b1}$- [wherein $Q^{b1}$ represents a divalent linking group containing an oxygen atom, and $R^{b20}$ represents a hydrocarbon group having 3 to 30 carbon atoms which may be substituted].

Examples of the halogen atom and the alkyl group include the same halogen atoms and alkyl groups as those described in relation to the halogenated alkyl group for $R^{b4}$. Examples of the heteroatom include an oxygen atom, a nitrogen atom, and a sulfur atom.

In the group represented by the formula: $R^{b20}$-$Q^{b1}$-, $Q^{b1}$ represents a divalent linking group containing an oxygen atom. $Q^{b1}$ may also contain an atom other than an oxygen atom. Examples of the atom other than an oxygen atom include a carbon atom, a hydrogen atom, an oxygen atom, a sulfur atom, and a nitrogen atom.

Examples of the divalent linking group containing an oxygen atom include non-hydrocarbon-based oxygen atom-containing linking groups such as an oxygen atom (ether bond; —O—), an ester bond (—C(=O)—O—), an amide bond (—C(=O)—NH—), a carbonyl group (—C(=O)—), and a carbonate bond (—O—C(=O)—O—); and combinations of non-hydrocarbon-based oxygen atom-containing linking groups and alkylene groups.

Examples of the combinations of non-hydrocarbon-based oxygen atom-containing linking groups and alkylene groups include —$R^{b21}$—O—, —$R^{b22}$—O—C(=O)—, —C(=O)—O—$R^{b23}$—, and —C(=O)—O—$R^{b24}$—OC(=O)— (wherein $R^{b21}$ to $R^{b24}$ each independently represent an alkylene group). The alkylene group for $R^{b21}$ to $R^{b24}$ is preferably a linear or branched alkylene group. The number of carbon atoms of the alkylene group is preferably 1 to 12, more preferably 1 to 5, and particularly preferably 1 to 3.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (an n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^{b1}$ is preferably a divalent linking group containing an ester bond or an ether bond, and among such groups, —$R^{b21}$—O—, —$R^{b22}$—O—C(=O)—, —C(=O)—O—, —C(=O)—O—$R^{b23}$— and —C(=O)—O—$R^{b24}$—C(=O)— are preferred.

In the group represented by the formula: $R^{b20}$-$Q^{b1}$-, when $R^{b20}$ is a hydrocarbon group, $R^{b20}$ may be an aromatic hydrocarbon group, or may be an aliphatic hydrocarbon group. An aromatic hydrocarbon group is a hydrocarbon group having an aromatic ring. The number of carbon atoms of the aromatic hydrocarbon group is preferably 3 to 30, more preferably 5 to 30, even more preferably 5 to 20, particularly preferably 6 to 15, and most preferably 6 to 12. However, the number of carbon atoms of the aromatic hydrocarbon group is defined not to include the number of carbon atoms in the substituents.

Specific examples of the aromatic hydrocarbon group include an aryl group which are obtainable by eliminating one hydrogen atom each from aromatic hydrocarbon rings such as a phenyl group, a biphenyl group, a fluorenyl group, a naphthyl group, an anthryl group, and a phenanthryl group and an arylalkyl group such as a benzyl group, a phenethyl group, a 1-naphtylmethyl group, a 2-naphthylmethyl group, a 1-naphthylethyl group and a 2-naphthylethyl group. The number of carbon atoms of the alkyl chain in the arylalkyl group is preferably 1 to 4, more preferably 1 to 2, and particularly preferably 1.

The aromatic hydrocarbon group may have a substituent. Examples of the substituent which may be carried by the aromatic hydrocarbon group include an alkyl group, an alkoxy group, a halogen atom, a halogenated alkyl group, a hydroxyl group, and an oxygen atom (=O).

The alkyl group as a substituent for the aromatic hydrocarbon group is preferably an alkyl group having 1 to 5 carbon atoms, and a methyl group, an ethyl group, a propyl group, an n-butyl group, and a tert-butyl group are more preferred.

The alkoxy group as a substituent for the aromatic hydrocarbon group is preferably an alkoxy group having 1 to 5 carbon atoms, and a methoxy group, an ethoxy group, an n-propoxy group, an iso-propoxy group, an n-butoxy group, and a tert-butoxy group are more preferred, while a methoxy group and an ethoxy group are particularly preferred.

Examples of the halogen atom as a substituent for the aromatic hydrocarbon group include a fluorine atom, a chlorine atom, a bromine atom, and an iodine atom, and a fluorine atom is preferred. Examples of the halogenated alkyl group as a substituent for the aromatic hydrocarbon group include groups in which a portion or all of the hydrogen atoms of alkyl groups are substituted by the aforementioned halogenated atoms.

Furthermore, a portion of the carbon atoms that constitute the aromatic ring carried by the aromatic hydrocarbon group may also be substituted by heteroatoms. Examples of the case where a portion of the carbon atoms that constitute the aromatic ring of the aromatic hydrocarbon group are substituted by heteroatoms, include heteroaryl groups in which a portion of the carbon atoms that constitute the rings of aryl groups are substituted by heteroatoms such as an oxygen atom, a sulfur atom, and a nitrogen atom; and heteroarylalkyl groups in which a portion of the carbon atoms that constitute the aromatic hydrocarbon rings of arylalkyl groups are substituted by the aforementioned heteroatoms.

The aliphatic hydrocarbon group for $R^{b20}$ may be a saturated aliphatic hydrocarbon group, or may be an unsaturated aliphatic hydrocarbon group. Furthermore, the aliphatic hydrocarbon group may be any of linear, branched or cyclic.

The aliphatic hydrocarbon group for $R^{b20}$ may have a portion of the carbon atoms that constitute the aliphatic hydrocarbon group, substituted by substituents containing heteroatoms, or may have a portion or all of the hydrogen atoms that constitute the aliphatic hydrocarbon group, substituted by substituents containing heteroatoms.

The "heteroatom" for $R^{b20}$ is not particularly limited as long as it is an atom other than a carbon atom and a hydrogen atom, and examples thereof include a halogen atom, an oxygen atom, a sulfur atom, and a nitrogen atom. Examples of the halogen atom include a fluorine atom, a chlorine atom, an iodine atom, and a bromine atom.

The "substituent containing a heteroatom" (hereinafter, may be referred to as a heteroatom-containing substituent)

may be composed of the heteroatoms only, or may also be a group containing a group or an atom other than the heteroatoms.

Examples of the heteroatom-containing substituent in which a portion of the carbon atoms that constitute the aliphatic hydrocarbon group may be substituted, include —O—, —C(=O)—O—, —C(=O)—, —O—C(=O)—O—, —C(=O)—NH—, —NH— (wherein H may be substituted by a substituent such as an alkyl group or an acyl group), —S—, —S(=O)$_2$—, and —S(=O)$_2$—O—. In the case of —NH—, the substituent which may substitute the H atom (an alkyl group, an acyl group or the like) preferably has 1 to 10 carbon atoms, more preferably 1 to 8 carbon atoms, and particularly preferably 1 to 5 carbon atoms. If the aliphatic hydrocarbon group is cyclic, the aliphatic hydrocarbon group may contain these substituents in the ring structure.

Examples of the heteroatom-containing substituent in which a portion or all of the hydrogen atoms that constitute the aliphatic hydrocarbon group may be substituted, include a halogen atom, an alkoxy group, a hydroxyl group, —C(=O)—R$^{b25}$ [wherein R$^{b25}$ represents an alkyl group], —COOR$^{b26}$ [wherein R$^{b26}$ represents a hydrogen atom or an alkyl group], a halogenated alkyl group, a halogenated alkoxy group, an amino group, an amide group, a nitro group, an oxygen atom (=O), a sulfur atom, and a sulfonyl group (SO$_2$).

Examples of the halogen atom as the heteroatom-containing substituent include a fluorine atom, a chlorine atom, a bromine atom, and an iodine atom, and a fluorine atom is preferred.

The alkyl group in the alkoxy group as the heteroatom-containing substituent may be any of linear, branched and cyclic, and may be a combination thereof. The number of carbon atoms of the alkyl group for the alkoxy group is preferably 1 to 30. When the alkyl group is linear or branched, the number of carbon atoms is preferably 1 to 20, more preferably 1 to 17, even more preferably 1 to 15, and particularly preferably 1 to 10. Specifically, examples of the alkyl group include the same groups as the specific examples of the linear or branched saturated hydrocarbon group that will be listed as examples below. When the alkyl group is cyclic (in the case of a cycloalkyl group), the number of carbon atoms is preferably 3 to 30, more preferably 3 to 20, even more preferably 3 to 15, particularly preferably 4 to 12, and most preferably 5 to 10. When the alkyl group is cyclic, the alkyl group may be monocyclic or may be polycyclic. Specific examples thereof include groups obtainable by eliminating one or more hydrogen atoms each from monocycloalkanes, and groups obtainable by eliminating one or more hydrogen atoms each from polycycloalkanes such as a bicycloalkane, a tricycloalkane, and a tetracycloalkane. Specific examples of the monocycloalkane include cyclopentane and cyclohexane. Furthermore, specific examples of the polycycloalkane include adamantane, norbornane, isobornane, tricyclodecane, and tetracyclododecane. These cycloalkyl groups are such that a portion or all of the hydrogen atoms that are bonded to the ring may or may not be substituted by substituents such as a fluorine atom and a fluorinated alkyl group.

In the groups —C(=O)—R$^{b25}$ and —COOR$^{b26}$ as the heteroatom-containing substituents, examples of the alkyl group for R$^{b25}$ and R$^{b26}$ include the same alkyl groups as those described as the alkyl group for the alkoxy group described above.

Examples of the alkyl group for the halogenated alkyl group as the heteroatom-containing substituent include the same alkyl groups as those described as the alkyl group for the alkoxy group. The halogenated alkyl group is particularly preferably a fluorinated alkyl group.

Examples of the halogenated alkoxy group as the heteroatom-containing substituent include groups in which a portion or all of the hydrogen atoms of the alkoxy group are substituted by the halogen atoms described above. The halogenated alkoxy group is preferably a fluorinated alkoxy group.

Examples of the hydroxyalkyl group as the heteroatom-containing substituent include groups in which at least one of the hydrogen atoms of the alkyl group mentioned as the alkyl group for the alkoxy group is substituted by a hydroxyl group. The number of hydroxyl group carried by the hydroxyalkyl group is preferably 1 to 3, and more preferably 1.

The aliphatic hydrocarbon group is preferably a linear or branched saturated hydrocarbon group, a linear or branched monovalent unsaturated hydrocarbon group, or a cyclic aliphatic hydrocarbon group (aliphatic cyclic group).

The number of carbon atoms of the linear saturated hydrocarbon group (alkyl group) is preferably 1 to 20, more preferably 1 to 15, and most preferably 1 to 10. Specific examples of the linear saturated hydrocarbon group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The number of carbon atoms of the branched saturated hydrocarbon group (alkyl group) is preferably 3 to 20, more preferably 3 to 15, and most preferably 3 to 10. Specific examples of the branched saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The number of carbon atoms of the unsaturated hydrocarbon group is preferably 2 to 10, more preferably 2 to 5, particularly preferably 2 to 4, and most preferably 3. Examples of the linear monovalent unsaturated hydrocarbon group include a vinyl group, a propenyl group (allyl group), and a butynyl group. Examples of the branched monovalent unsaturated hydrocarbon group include a 1-methylpropenyl group, and a 2-methylpropenyl group. The unsaturated hydrocarbon group is particularly preferably a propenyl group.

The aliphatic cyclic group may be a monocyclic group or may be a polycyclic group. The number of carbon atoms of the aliphatic cyclic group is preferably 3 to 30, more preferably 5 to 30, even more preferably 5 to 20, particularly preferably 6 to 15, and most preferably 6 to 12.

Specific examples of the aliphatic cyclic group include groups obtainable by eliminating one or more hydrogen atoms each from monocycloalkanes; and groups obtainable by eliminating one or more hydrogen atoms each from polycycloalkanes such as a bicycloalkane, a tricycloalkane, and a tetracycloalkane. More specific examples thereof include groups obtainable by eliminating one or more hydrogen atoms each from monocycloalkanes such as cyclopentane and cyclohexane; and groups obtainable by eliminating one or more hydrogen atoms each from polycycloalkanes such as adamantane, norbornane, isobornane, tricyclodecane, and tetracyclododecane.

When the aliphatic cyclic group does not contain a substituent containing a heteroatom in the ring structure, the aliphatic cyclic group is preferably a polycyclic group. A group obtainable by eliminating one or more hydrogen atoms from a polycycloalkane is preferred, and a group obtainable by eliminating one or more hydrogen atoms from adamantane is most preferred.

When the aliphatic cyclic group contains a substituent containing a heteroatom in the ring structure, the substituent containing a heteroatom is preferably —O—, —C(=O)—O—, —S—, —S(=O)$_2$—, or —S(=O)$^2$—O—. Specific examples of such an aliphatic cyclic group include groups represented by the following formulae (L1) to (L5) and (S1) to (S4):

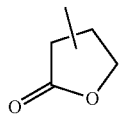
(L1)

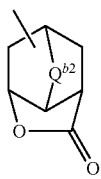
(L2)

(L3)

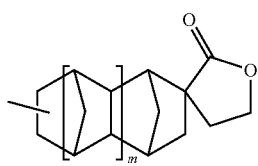
(L4)

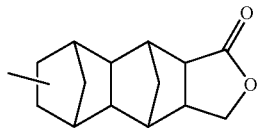
(L5)

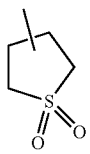
(S1)

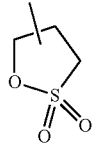
(S2)

-continued

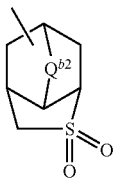
(S3)

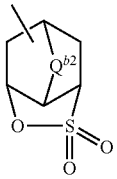
(S4)

wherein in the formulae (L2), (S3) and (S4), $Q^{b2}$ represents an oxygen atom, a sulfur atom, or an alkylene group which may contain an oxygen atom or a sulfur atom; and in the formula (L4), m represents an integer of 0 or 1.

In the formulae, the alkylene group for $Q^{b2}$ is preferably linear or branched, and the number of carbon atoms is preferably 1 to 5. Specific examples thereof include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; a trimethylene group (an n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—]. Among these, a methylene group or an alkylmethylene group is preferred, and a methylene group, —CH(CH$_3$)— or —C(CH$_3$)$_2$— is particularly preferred.

When $Q^{b2}$ is an alkylene group, the alkylene group may contain an oxygen atom (—O—) or a sulfur atom (—S—). Specific examples thereof include alkylene groups that are interrupted by —O— or —S— at the ends or between the carbon atoms, and examples include O—$R^{b27}$—, —S—$R^{b28}$—, —$R^{b29}$—O$R^{b30}$—, and —$R^{b31}$—S—$R^{b32}$—. Here, $R^{b27}$ to $R^{b32}$ each independently represent an alkylene group. Examples of the alkylene group include the same alkylene groups as those described as the alkylene group for $Q^{b2}$. Among them, —O—CH$_2$—, —CH$_2$—O—CH$_2$—, —S—CH$_2$—, —CH$_2$—S—CH$_2$—, and the like are preferred.

These aliphatic cyclic groups are such that a portion or all of the hydrogen atoms may be substituted by substituents. Examples of the substituents which may be carried by the aliphatic cyclic groups include an alkyl group, a halogen atom, an alkoxy group, a hydroxyl group, —C(=O)—$R^{b25}$ [wherein $R^{b25}$ represents an alkyl group], —COO$R^{b26}$ [wherein $R^{b26}$ represents a hydrogen atom or an alkyl group], a halogenated alkyl group, a halogenated alkoxy group, an amino group, an amide group, a nitro group, an oxygen atom (=O), a sulfur atom, and a sulfonyl group (SO$_2$).

Examples of the alkyl group as the substituent include the same alkyl groups as those described for the alkoxy group as the heteroatom-containing substituent. The number of carbon atoms of such an alkyl group is particularly preferably 1 to 6.

Furthermore, the alkyl group is preferably linear or branched. Specific examples of the alkyl group include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or an ethyl group is preferred, and a methyl group is particularly preferred.

Examples of the halogen atom, alkoxy group, —C(=O)—$R^{b25}$, —COOR$^{b26}$, halogenated alkyl group, and halogenated alkoxy group as the substituents respectively include the same groups as those described as the heteroatom-containing substituents in which a portion or all of the hydrogen atoms that constitute the aliphatic hydrocarbon group may be substituted.

Preferred examples of the substituents that substitute the hydrogen atoms of the aliphatic cyclic group include, among those described above, an alkyl group, an oxygen atom (=O), and a hydroxyl group. The number of substituents carried by the aliphatic cyclic group may be one, or may be 2 or greater. When the aliphatic cyclic group has plural substituents, the plural substituents may be identical with each other, or may be different from each other.

$R^{b20}$ is preferably a cyclic group which may be substituted. When $R^{b20}$ is a cyclic group, the cyclic group may be an aromatic hydrocarbon group which may be substituted, or may be an aliphatic cyclic group which may be substituted. Between these two, an aliphatic cyclic group which may be substituted is more preferred.

The aromatic hydrocarbon group is preferably a naphthyl group which may be substituted, or a phenyl group which may be substituted.

The aliphatic cyclic group which may be substituted is preferably a polycyclic aliphatic cyclic group which may be substituted. Preferred examples of the polycyclic aliphatic cyclic group include groups obtainable by eliminating one or more hydrogen atoms each from polycycloalkanes such as adamantane, norbornane, isobornane, tricyclodecane, and tetracyclododecane; and groups represented by the formulae (L2) to (L5), (S3), and (S4).

According to the present invention, it is preferable that $R^{b4}$ have $R^{b20}$-$Q^{b1}$- as a substituent. In this case, $R^{b4}$ is preferably a group represented by the formula: $R^{b20}$-$Q^{b1}$-$Y^{b1}$- [wherein $Q^{b1}$ and $R^{b20}$ respectively have the same meanings as defined above; and $Y^{b1}$ represents an alkylene group having 1 to 4 carbon atoms which may be substituted, or a fluorinated alkylene group having 1 to 4 carbon atoms which may be substituted].

In the group represented by $R^{b20}$-$Q^{b1}$-$Y^{b1}$—, examples of the alkylene group for $Y^{b1}$ include the same alkylene groups as those having 1 to 4 carbon atoms among the alkylene groups described for $Q^{b1}$.

Examples of the fluorinated alkylene group include groups in which a portion or all of the hydrogen atoms of the alkylene groups are substituted by fluorine atoms.

Specific examples of $Y^{b1}$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$—, —CH$_2$CH$_2$CF$_2$CF$_2$—, —CH(CF$_3$)CH$_2$CH$_2$—, —CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

$Y^{b1}$ is preferably a fluorinated alkylene group, and particularly preferably a fluorinated alkylene group in which a carbon atom that is bonded to the adjacent sulfur atom is fluorinated. Examples of such a fluorinate alkylene group include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—. Among these, —CF$_2$—, —CF$_2$CF$_2$—, —CF$_2$CF$_2$CF$_2$—, or —CH$_2$CF$_2$CF$_2$— is preferred; —CF$_2$—, —CF$_2$CF$_2$— or —CF$_2$CF$_2$CF$_2$— is more preferred; and —CF$_2$— is even more preferred.

The alkyl group or fluorinated alkylene group described above may have a substituent. When it is said that the alkylene group or fluorinated alkylene group "has a substituent," it is implied that a portion or all of the hydrogen atoms or fluorine atoms in the alkylene group or fluorinated alkylene group are substituted by atoms or groups other than hydrogen atoms and fluorine atoms. Examples of the substituent which may be carried by the alkylene group or fluorinated alkylene group include an alkyl group having 1 to 4 carbon atoms, an alkoxy group having 1 to 4 carbon atoms, and a hydroxyl group.

In the formula (b2), $R^{b5}$ and $R^{b6}$ each independently represent an aryl group or an alkyl group. Furthermore, at least one of $R^{b5}$ and $R^{b6}$ represents an aryl group, and it is preferable that $R^{b5}$ and $R^{b6}$ be both aryl groups. Examples of the aryl group for $R^{b5}$ and $R^{b6}$ include the same aryl groups as those for $R^{b1}$ to $R^{b3}$. Examples of the alkyl group for $R^{b5}$ and $R^{b6}$ include the same alkyl groups as those for $R^{b1}$ to $R^{b3}$. Among these, it is most preferable that $R^{b5}$ and $R^{b6}$ be both phenyl groups. $R^{b4}$ in the formula (b2) has the same meaning as $R^{b4}$ defined for the formula (b1).

Specific examples of the onium salt-based acid generator represented by the formula (b1) or (b2) include trifluoromethanesulfonate or nonafluorobutanesulfonate of diphenyliodonium; trifluoromethanesulfonate or nonafluorobutanesulfonate of bis(4-tert-butylphenyl)iodonium; trifluoromethanesulfonate, heptafluoropropanesulfonate or nonafluorobutanesulfonate of triphenylsulfonium; trifluoromethanesulfonate, heptafluoropropanesulfonate or nonafluorobutanesulfonate of tri(4-methylphenyl)sulfonium; trifluoromethanesulfonate, heptafluoropropanesulfonate or nonafluorobutanesulfonate of dimethyl(4-hydroxynaphthyl)sulfonium; trifluoromethanesulfonate, heptafluoropropanesulfonate or nonafluorobutanesulfonate of monophenyldimethylsulfonium; trifluoromethanesulfonate, heptafluoropropanesulfonate or nonafluorobutanesulfonate of diphenylmonomethylsulfonium; trifluoromethanesulfonate, heptafluoropropanesulfonate or nonafluorobutanesulfonate of (4-methylphenyl)diphenylsulfonium; trifluoromethanesulfonate, heptafluoropropanesulfonate or nonafluorobutanesulfonate of (4-methoxyphenyl)diphenylsulfonium; trifluoromethanesulfonate, heptafluoropropanesulfonate or nonafluorobutanesulfonate of tri(4-tert-butyl)phenylsulfonium; trifluoromethanesulfonate, heptafluoropropanesulfonate or nonafluorobutanesulfonate of diphenyl(1-(4-methoxy)naphthyl)sulfonium; trifluoromethanesulfonate, heptafluoropropanesulfonate or nonafluorobutanesulfonate of di(1-naphthyl)phenylsulfonium; trifluoromethanesulfonate, heptafluoropropanesulfonate or nonafluorobutanesulfonate of 1-phenyltetrahydrothiophenium; trifluoromethanesulfonate, heptafluoropropanesulfonate or nonafluorobutanesulfonate of 1-(4-methylphenyl)tetrahydrothiophenium; trifluoromethanesulfonate, heptafluoropropanesulfonate or nonafluorobutanesulfonate of 1-(3,5-dimethyl-4-hydroxyphenyl)tetrahydrothiophenium; trifluoromethanesulfonate, heptafluoropropanesulfonate or nonafluorobutanesulfonate of 1-(4-methoxynaphthalen-1-yl)tetrahydrothiophenium; trifluoromethanesulfonate, heptafluoropropanesulfonate or nonafluorobutanesulfonate of 1-(4-ethoxynaphthalen-1-yl)tetrahydrothiophenium; trifluoromethanesulfonate, heptafluoropropanesulfonate or nonafluorobutanesulfonate of 1-(4-n-butoxynaphthalen-1-yl)tetrahydrothiophenium; trifluoromethanesulfonate, heptafluoropropanesulfonate or nonafluorobutanesulfonate of 1-phenyltetrahydrothiopyranium; trifluoromethanesulfonate, heptafluoropropanesulfonate or nonafluorobutanesulfonate of 1-(4-hydroxyphenyl)tetrahydrothiopyranium; trifluoromethanesulfonate, heptafluoropropanesulfonate or nonafluorobutanesulfonate of 1-(3,5-dimethyl-4-hydroxyphenyl)tetrahydrothiopyranium; and trifluoromethanesulfonate, heptafluoropropanesulfonate or nonafluorobutanesulfonate of 1-(4-methylphenyl)tetrahydrothiopyranium.

Further, an onium salt having the anion part of the above onium salts substituted with an alkyl sulfonate like methane sulfonate, n-propane sulfonate, n-butane sulfonate, n-octane sulfonate, 1-adamantane sulfonate, and 2-norbornane sulfonate; and sulfonate like d-camphor-10-sulfonate, benzene sulfonate, perfluorobenzene sulfonate, p-toluene sulfonate can be also used.

Further, an onium salt having the anion part of the above onium salts substituted with an anion part that is represented by any one of the following formulae (bI) to (bVIII) can be also used.

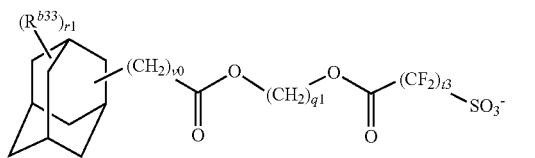
(bI)

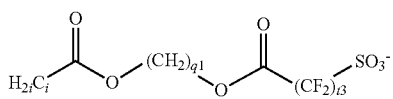
(bII)

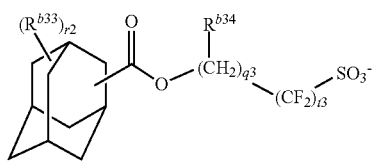
(bIII)

[in the formulae (bI) to (bIII), v0 represents an integer of from 0 to 3, q1 and q2 each independently represent an integer of from 1 to 5, q3 represents an integer of from 1 to 12, r1 and r2 each independently represent an integer of from 0 to 3, i represent an integer of from 1 to 20, t3 represents an integer of from 1 to 3, $R^{b33}$ represents a substituent group, and $R^{b34}$ represents a hydrogen atom, an alkyl group having 1 to 5 carbon atoms, or a halogenated alkyl group having 1 to 5 carbon atoms.]

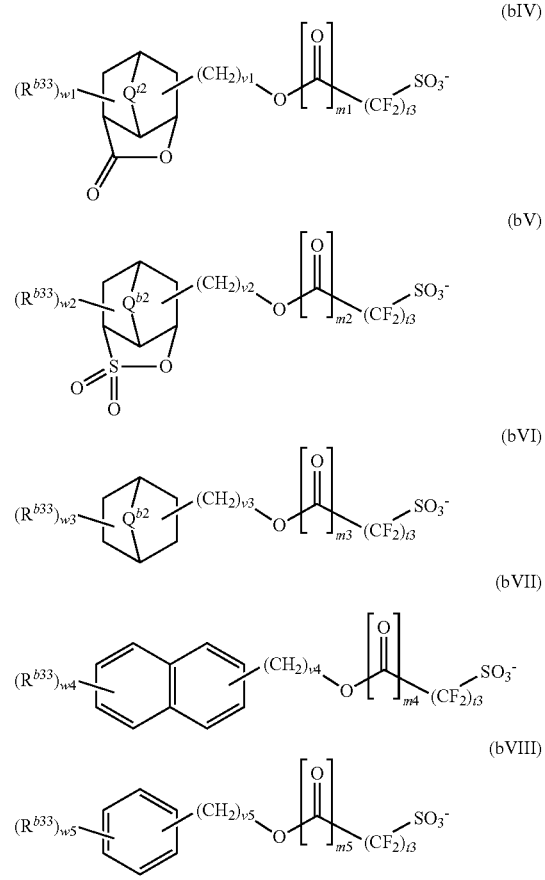

[in the formulae (bIV) to (bVIII), t3, $R^{b33}$, and $Q^{b2}$ have the same meanings as defined above, m1 to m5 each independently represent 0 or 1, v1 to v5 each independently represent an integer of from 0 to 3, and w1 to w5 each independently represent an integer of from 0 to 3].

Examples of the substituent group for $R^{b33}$ include an alkyl group and a substituent group containing a heteroatom. Examples of the alkyl group are the same as the examples of alkyl group listed for $R^{b20}$ as a substituent group which may be preferably contained in the aromatic hydrocarbon group. Further, examples of the substituent group containing a heteroatom are the same as the examples of substituent group containing a heteroatom listed for $R^{b20}$ as a substituent group containing a heteroatom which may preferably substitute part of or entire hydrogen atoms constituting an aliphatic hydrocarbon group.

When the symbol included in $R^{b33}$ (r1 and r2, w1 to w5) is an integer of 2 or more, plural $R^{b33}$s in the same compound may be identical with each other, or may be different from each other.

Examples of the alkyl group and halogenated alkyl group for $R^{b34}$ include the same alkyl group and halogenated alkyl group, respectively, listed above for $R^{b4}$.

Each of r1 and r2 and w1 to w5 is preferably an integer of from 0 to 2, and more preferably 0 or 1. v0 to v5 are preferably 0 to 2, and more preferably 0 or 1. t3 is preferably 1 or 2, and more preferably 1. q3 is preferably an integer of from 1 to 5, more preferably an integer of from 1 to 3, and particularly preferably 1.

Further, as an onium salt-based acid generator, the onium salt-based acid generator of the formula (b1) or (b2) in which the anion part is substituted with an anion represented by the formula (b3) or (b4) may be also used (the cation part is the same as that of the formula (b1) or (b2)).

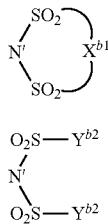

[in the formulae (b3) and (b4), $X^{b1}$ represents an alkylene group having 2 to 6 carbon atoms in which at least one hydrogen atom is substituted with a fluorine atom; $Y^{b2}$ and $Z^{b2}$ each independently represent an alkyl group having 1 to 10 carbon atoms in which at least one hydrogen atom is substituted with a fluorine atom].

$X^{b1}$ represents a linear or branched alkylene group in which at least one hydrogen atom is substituted with a fluorine atom, and the alkylene group has 2 to 6 carbon atoms, preferably 3 to 5 carbon atoms, and more preferably 3 carbon atoms.

$Y^{b2}$ and $Z^{b2}$ each independently represent a linear or branched alkyl group in which at least one hydrogen atom is substituted with a fluorine atom, and the alkyl group has 1 to 10 carbon atoms, preferably 1 to 7 carbon atoms, and more preferably 1 to 3 carbon atoms.

Within the range of carbon atom number described above, the smaller number of carbon atoms in the alkylene group for $X^{b1}$ or the carbon atoms in the alkyl group for $Y^{b2}$ and $Z^{b2}$ are preferable due to good solubility in a resist solvent or the like.

Further, as for the alkylene group for $X^{b1}$ or the alkyl group for $Y^{b2}$ and $Z^{b2}$, the higher number of hydrogen atoms that are substituted with a fluorine atom is preferable in that the acid strength is higher and transparency toward high energy beam with wavelength of the same or less than 200 nm or electron beam is improved.

Ratio of fluorine atoms in an alkylene group or an alkyl group, i.e., fluorination ratio, is preferably 70 to 100%, more preferably 90 to 100%, and particularly preferably 100%. In other words, a perfluoroalkylene group or a perfluoroalkyl group of which every hydrogen atom is substituted with a fluorine atom is particularly preferable.

Further, an onium-salt based acid generator of the formula (b1) or (b2) in which the anion part ($R^{b4}SO_3^-$) is substituted with $R^{b7}$—COO⁻ [in the formula, $R^{b7}$ represents an alkyl group or a fluoroalkyl group] can be also used (the cation part is the same as that of the (b1) or (b2)). Examples of $R^{b7}$ include those exemplified above for $R^{b4}$. Specific examples of the anion represented by $R^{b7}$—COO⁻ include a trifluoroacetic acid ion, an acetic acid ion, and a 1-adamantane carboxylic acid ion.

As used herein, the oxime sulfonate-based acid generator indicates a compound which has at least one group represented by the following formula (B1), and it has a characteristic of generating an acid when irradiated with radiation. As for the oxime sulfonate-based acid generator, any one selected from those conventionally used for a resist composition can be used.

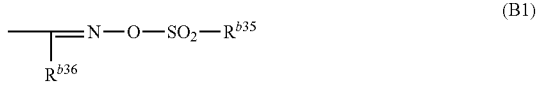

[in the formula (B1), $R^{b35}$ and $R^{b36}$ each independently represent an organic group].

The organic group for $R^{b35}$ and $R^{b36}$ is a group containing a carbon atom, and it may contain an atom other than the carbon atom (e.g., a hydrogen atom, an oxygen atom, a nitrogen atom, a sulfur atom, and a halogen atom (fluorine atom, chlorine atom, or the like)).

The organic group for $R^{b35}$ is preferably a linear, branched, or cyclic alkyl group or an aryl group. The alkyl group or aryl group may have a substituent group. The substituent group is not specifically limited, and examples include a fluorine atom, and a linear, branched, or cyclic alkyl group having 1 to 6 carbon atoms. As used herein, the expression "have a substituent group" means that part of or entire hydrogen atoms of the alkyl group or aryl group are substituted with a substituent group.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As for the alkyl group, an alkyl group which is partially or completely halogenated (herein below, it may be referred to as a "halogenated alkyl group") is preferable, in particular. Further, the partially halogenated alkyl group means an alkyl group in which part of the hydrogen atoms are substituted with a halogen atom. The completely halogenated alkyl group means an alkyl group in which all the hydrogen atoms are substituted with a halogen atom. Examples of the halogen atom include a fluorine atom, a chlorine atom, a bromine atom, and an iodine atom. A fluorine atom is particularly preferable. Thus, the halogenated alkyl group is preferably a fluoroalkyl group.

The aryl group preferably has 4 to 20 carbon atoms, more preferably 4 to 10 carbon atoms, and particularly preferably 6 to 10 carbon atoms. As for the aryl group, an aryl group which is partially or completely halogenated is preferable. Further, the partially halogenated aryl group means an alkyl group in which part of the hydrogen atoms are substituted with a halogen atom. The completely halogenated aryl group means an aryl group in which all the hydrogen atoms are substituted with a halogen atom.

$R^{b35}$ is preferably an unsubstituted alkyl group having 1 to 4 carbon atoms or a fluoroalkyl group having 1 to 4 carbon atoms, in particular.

The organic group for $R^{b36}$ is preferably a linear, branched, or cyclic alkyl group, an aryl group, or a cyano group. Examples of the alkyl group and aryl group for $R^{b36}$ are the same as the examples of the alkyl group and aryl group listed above for $R^{b35}$.

$R^{b36}$ is preferably a cyano group, an unsubstituted alkyl group having 1 to 8 carbon atoms, or a fluoroalkyl group having 1 to 8 carbon atoms, in particular.

As for the more preferred oxime sulfonate-based acid generator, the compounds represented by the following formula (B2) or (B3) can be mentioned.

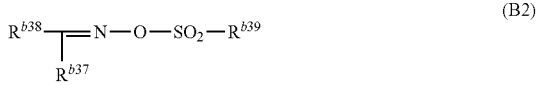

[in the formula (B2), $R^{b37}$ represents a cyano group, an alkyl group having no substituent group, or a halogenated alkyl group. $R^{b38}$ represents an aryl group. $R^{b39}$ represents an alkyl group having no substituent group or a halogenated alkyl group]

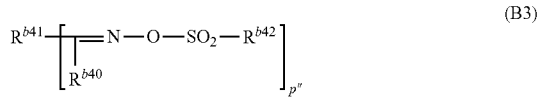

[in the formula (B3), $R^{b40}$ represents a cyano group, an alkyl group having no substituent group, or a halogenated alkyl group. $R^{b41}$ represents a divalent or trivalent aromatic hydrocarbon group. $R^{b42}$ represents an alkyl group having no substituent group or a halogenated alkyl group. p" is 2 or 3].

In the formula (B2), the alkyl group having no substituent group or halogenated alkyl group for $R^{b37}$ preferably has 1 to 10 carbon atoms, more preferably 1 to 8 carbon atoms, and most preferably 1 to 6 carbon atoms. As for $R^{b37}$, a halogenated alkyl group is preferable and a fluoroalkyl group is more preferable. In the fluoroalkyl group for $R^{b37}$, 50% or more of the hydrogen atoms of the alkyl group are preferably fluorinated. More preferably, 70% or more of them are fluorinated. Particularly preferably, 90% or more of them are fluorinated.

Examples of the aryl group for $R^{b38}$ include a group in which one hydrogen atom is removed from an aromatic hydrocarbon ring like a phenyl group, a biphenyl group, a fluorenyl group, a naphthyl group, an anthryl group, and a phenanthryl group, and a heteroaryl group in which part of the carbon atoms constituting the ring are substituted with a hetero atom like an oxygen atom, a sulfur atom, and a nitrogen atom. Among them, a fluorenyl group is preferable.

The aryl group for $R^{b38}$ may have a substituent group like an alkyl group having 1 to 10 carbon atoms, a halogenated alkyl group, and an alkoxy group. The alkyl group or halogenated alkyl group as a substituent group preferably has 1 to 8 carbon atoms, and more preferably 1 to 4 carbon atoms. Further, the halogenated alkyl group is preferably a fluoroalkyl group.

The alkyl group having no substituent group or halogenated alkyl group for $R^{b39}$ preferably has 1 to 10 carbon atoms, more preferably 1 to 8 carbon atoms, and particularly preferably 1 to 6 carbon atoms. As for $R^{b39}$, a halogenated alkyl group is preferably and a fluoroalkyl group is more preferable.

In the fluoroalkyl group for $R^{b39}$, 50% or more of the hydrogen atoms in the alkyl group are preferably fluorinated, more preferably, 70% or more of them are fluorinated, and particularly preferably, 90% or more of them are fluorinated as the strength of generated acid is increased. Most preferably, it is a completely fluorinated alkyl group in which 100% of the hydrogen atoms are substituted with a fluorine.

In the formula (B3), examples of the alkyl group having no substituent group or a halogenated alkyl group for $R^{b40}$ are the same as the examples of the alkyl group having no substituent group or a halogenated alkyl group listed above for $R^{b37}$. Examples of the divalent or trivalent aromatic hydrocarbon group for $R^{b41}$ include the aryl group listed for $R^{b38}$ from which one or two hydrogen atoms are removed. Further, examples of the alkyl group having no substituent group or a halogenated alkyl group for $R^{b42}$ are the same as the examples of the alkyl group having no substituent group or a halogenated alkyl group listed above for $R^{b39}$. p" is preferably 2.

Specific examples of the oxime sulfonate-based acid generator include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, preferred examples thereof include the following.

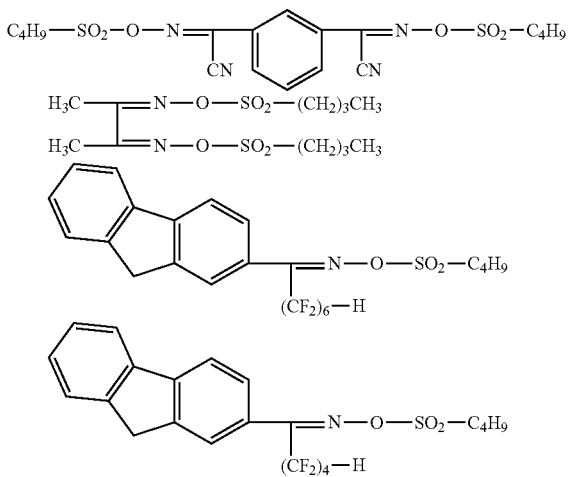

Among of the diazomethane-based acid generator, specific examples of a bisalkyl or a bisarylsulfonyl diazo methanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, examples of the poly(bissulfonyl)diazomethane include 1,3-bis(phenylsulfonyl diazomethylsulfonyl)propane, 1,4-bis(phenylsulfonyl diazomethylsulfonyl)butane, 1,6-bis(phenylsulfonyl diazomethylsulfonyl)hexane, 1,10-bis(phenylsulfonyl diazomethylsulfonyl)decane, 1,2-bis(cyclohexylsulfonyl diazomethylsulfonyl)ethane, 1,3-bis(cyclohexylsulfonyl diazomethylsulfonyl)propane, 1,6-bis(cyclohexylsulfonyl diazomethylsulfonyl)hexane, and 1,10-bis(cyclohexylsulfonyl diazomethylsulfonyl)decane.

As for the component (B), the aforementioned acid generator may be used alone, or two or more kinds thereof may be used in combination. Content of the component (B) in the resist composition is preferably 0.5 to 50 parts by weight, and more preferably 1 to 40 parts by weight per 100 parts by weight of the component (A). When the content of the component (B) is within the range, a favorable pattern can be easily formed using the resist composition.

[($C^1$) Organic Solvent]

The resist composition is prepared by dissolving the materials in an organic solvent (herein below, referred to as component ($C^1$)). The component ($C^1$) is not specifically limited, if it can dissolve each component to be used to give a homogeneous solution. It can be appropriately selected from known organic solvents that are used for a resist composition.

Specific examples of the organic solvent include lactones like γ-butyrolactone; ketones like acetone, methyl ethyl ketone, cyclohexanone (CH), methyl-n-pentyl ketone, methyl isopentyl ketone, and 2-heptanone; polyhydric alcohols like ethylene glycol, diethylene glycol, propylene glycol, and dipropylene glycol; derivatives of polyhydric alcohol like a compound having an ester bond like ethylene glycol monoacetate, diethylene glycol monoacetate, propylene glycol monoacetate, or dipropylene glycol monoacetate, and a compound having an ether bond like monoalkyl ether including monomethyl ether, monoethyl ether, monopropyl ether, and monobutyl ether of polyhydric alcohols or a compound having an ester bond, or monophenyl ether; cyclic ethers like dioxane and esters like methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents like anisole, ethyl benzyl ether, cresyl methyl ether, diphenyl ether, dibenzyl ether, phenetol, butyl phenyl ether, ethylbenzene, diethylbenzene, pentylbenzene, isopropylbenzene, toluene, xylene, cemene, and mesitylene. The organic solvent may be used alone, or two or more kinds thereof may be used in combination.

Among the organic solvents described above, propylene glycol monomethyl ether acetate (PGMEA), propylene glycol monomethyl ether (PGME), γ-butyrolactone, ethyl lactate (EL), and cyclohexanone (CH) are preferable.

Further, a mixture solvent containing PGMEA and a polar solvent is also preferable. The mixing ratio (weight ratio) can be appropriately determined in consideration of compatibility between PGMEA and a polar solvent. Preferably, in terms of PGMEA:polar solvent, it is between 1:9 and 9:1. More preferably, it is between 2:8 and 8:2.

More specifically, when EL is added as a polar solvent, the weight ratio of PGMEA:EL is preferably between 1:9 and 9:1. More preferably, it is between 2:8 and 8:2. Further, when PGME is added as a polar solvent, the weight ratio of PGMEA:PGME is preferably between 1:9 and 9:1. More preferably, it is between 2:8 and 8:2. Particularly preferably, it is between 3:7 and 7:3.

Further, as for the component ($C^1$), a mixture solvent of at least one selected from PGMEA, PGME, CH and EL with γ-butyrolactone is also preferable. For such case, the preferable mixing ratio is believed to be between 70:30 and 95:5, in terms of weight ratio between the former and the latter.

Amount used of the component ($C^1$) is not specifically limited. Instead, it is appropriately selected such that suitable solid matter concentration of the resist composition for coating on a substrate or the like can be obtained. In general, the component ($C^1$) is used such that the solid matter concentration in the resist composition is in the range of 1 to 20% by weight, and preferably in the range of 2 to 15% by weight.

[Optional Components]

Herein below, optional components that may be also contained in the resist composition are explained.

(Component (D) (Quencher))

The resist composition may contain, as an optional component, a quencher (herein below, referred to as "component (D)"). The component (D) is not specifically limited if it functions as an acid diffusion controlling agent, i.e., a quencher for trapping an acid generated from the component (B) by light exposure. It may be arbitrarily selected from those well known in the field.

As for the component (D), a compound with low molecular weight (non-polymer) is generally used. Examples of the component (D) include amines like aliphatic amine and aromatic amine. Aliphatic amine is preferable. In particular, secondary aliphatic amine and tertiary aliphatic amine are preferable. As described herein, the aliphatic amine indicates an amine having at least one aliphatic group, and the aliphatic group preferably has 1 to 20 carbon atoms.

Examples of the aliphatic amine include an amine in which at least one hydrogen atom of ammonia ($NH_3$) is substituted with an alkyl group having 20 or less carbon atoms or a hydroxyalkyl group (i.e., alkylamine or alkyl alcohol amine) and a cyclic amine.

Specific examples of the alkylamine and alkyl alcohol amine include monoalkylamine like n-hexylamine, n-heptylamine, n-octylamine, n-nonylamine, and n-decylamine; dialkylamine like diethylamine, di-n-propylamine, di-n-heptylamine, di-n-octylamine, and dicyclohexylamine; trialkylamine like trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amine like diethanol amine, triethanol amine, diisopropanol amine, and triisopropanol amine, di-n-octanol amine, tri-n-octanol amine, stearyl diethanol amine, and lauryl diethanol amine. Of these, trialkylamine and/or alkyl alcohol amine are preferable.

Examples of the cyclic amine include a heterocyclic compound which contains a nitrogen atom as a heteroatom. The heterocyclic compound may be either a monocyclic compound (aliphatic monocyclic amine) or a polycyclic compound (aliphatic polycyclic amine).

Specific examples of the aliphatic monocyclic amine include piperidine and piperazine. As for the aliphatic polycyclic amine, those having 6 to 10 carbon atoms are preferable, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Further examples of other aliphatic amine include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-

(1-ethoxyethoxy)ethyl}amine, tris{2-(1-ethoxypropoxy) ethyl}amine, and tris[2-{2-(2-hydroxyethoxy) ethoxy}ethylamine.

Examples of the aromatic amine include aniline, pyridine, 4-dimethylaminopyridine, pyrrole, indole, pyrazole, imidazole, and a derivative thereof, diphenylamine, triphenylamine, tribenzylamine, 2,6-diisopropylaniline, 2,2'-dipyridyl, 4,4'-dipyridyl or the like.

Further, an onium salt explained above with regard to the component (B) in which the cation part of the onium salt represented by the formula (b1) is combined with a hydroxy ion or a perfluoroalkyl carboxylic acid ion can be also used as a quencher. The perfluoroalkyl contained in the perfluoroalkyl carboxylic acid ion preferably has 1 to 6 carbon atoms, and more preferably 1 to 4 carbon atoms.

The component (D) may be used alone, or two or more kinds thereof may be used in combination. The component (D) is generally used within a range of 0.01 to 5.0 parts by weight per 100 parts by weight of the component (A). By using the component (D) within this range, resist pattern shape and post-exposure stability over time or the like are improved.

(Component (E) (Organic Carboxylic Acid or Phosphorus Oxyacid))

Under the purpose of preventing deterioration in sensitivity and improving resist pattern shape and post-exposure stability over time or the like, the resist composition may also contain at least one compound which is selected from a group consisting of organic carboxylic acid, phosphorus oxyacid, and derivatives thereof (herein below, referred to as "component (E)").

Preferred examples of the organic carboxylic acid include acetic acid, malonic acid, citric acid, malic acid, succinic acid, benzoic acid, and salicylic acid. Preferred examples of the phosphorus oxyacid include phosphoric acid, phosphonic acid, and phosphinic acid. Of these, phosphonic acid is more preferable. Examples of the derivatives of the phosphorus oxyacid include an ester of the aforementioned oxyacid of which hydrogen atoms are substituted with a hydrocarbon group. Examples of the hydrocarbon group include an alkyl group having 1 to 5 carbon atoms and an aryl group having 6 to 15 carbon atoms.

Examples of the derivatives of phosphoric acid include phosphoric acid ester like phosphoric acid di-n-butyl ester and phosphoric acid diphenyl ester. Examples of the derivatives of phosphonic acid include phosphonic acid ester like phosphonic acid dimethyl ester, phosphonic acid-di-n-butyl ester, phenyl phosphonic acid, phosphonic acid diphenyl ester, and phosphonic acid dibenzyl ester. Examples of the derivatives of phosphinic acid include phosphinic acid ester like phenyl phosphinic acid.

The component (E) may be used alone, or two or more kinds thereof may be used in combination. The component (E) is generally used within a range of 0.01 to 5.0 parts by weight per 100 parts by weight of the component (A).

(Component (F) (Fluorine-Containing Compound))

The resist composition may also contain, as an optional component, a fluorine-containing compound component (F) (herein below, referred to as "component (F)"). In the present invention, the component (F) encompasses the fluorine-containing polymer compound (F1) which has a constituent unit (f) having a base-dissociable group (herein below, referred to as "component (F1)"). Examples of the constituent unit (f) having a base-dissociable group include the units that are represented by the following formula (f1).

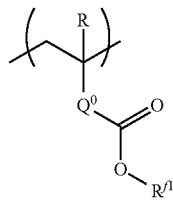

(f1)

[in the formula (f1), R represents a hydrogen atom, an alkyl group having 1 to 5 carbon atoms, or a halogenated alkyl group having 1 to 5 carbon atoms, $Q^0$ represents a single bond or a divalent linking group which may have a fluorine atom, and $R^{f1}$ represents an organic group which may have a fluorine atom].

Preferred examples of the divalent linking group for $Q^0$ include a divalent hydrocarbon group which may have a substituent group and a divalent linking group containing a heteroatom. The divalent linking group for $Q^0$ may be the "divalent hydrocarbon group which may have a substituent group" or "divalent linking group containing a heteroatom" in which a fluorine atom is included for each. Alternatively, it may be the group not containing any fluorine atom.

As for the divalent linking group for $Q^0$, a linear or branched alkylene group, a divalent aromatic cyclic group, or a divalent linking group containing a heteroatom, or those containing a fluorine atom are preferable. Of these, the divalent linking group containing a heteroatom which may have a fluorine atom is particularly preferable.

When $Q^0$ is a linear or branched alkylene group, the alkylene group preferably has 1 to 10 carbon atoms, more preferably 1 to 6 carbon atoms, particularly preferably 1 to 4 carbon atoms, and most preferably 1 to 3 carbon atoms. Specific examples thereof are the same as the examples of a linear alkylene group and a branched alkylene group listed above for the "divalent hydrocarbon group which may have a substituent group".

When $Q^0$ is a divalent aromatic cyclic group, examples of the aromatic cyclic group include a divalent aromatic hydrocarbon group in which one hydrogen atom is additionally removed from the nucleus of an aromatic hydrocarbon of a monovalent aromatic hydrocarbon group like a phenyl group, a biphenyl group, a fluorenyl group, a naphthyl group, an anthryl group, and a phenanthryl group; an aromatic hydrocarbon group in which part of carbon atoms constituting the ring of a divalent aromatic hydrocarbon group are substituted with a heteroatom like an oxygen atom, a sulfur atom, and a nitrogen atom; an arylalkyl group like a benzyl group, a phenethyl group, a 1-naphthylmethyl group, a 2-naphthylmethyl group, a 1-naphthylethyl group, and a 2-naphthylethyl group, and an aromatic hydrocarbon group obtained by further removing one hydrogen atom from the nucleus of such aromatic hydrocarbon.

When $Q^0$ is a divalent linking group containing a heteroatom, preferred examples of the linking group include —O—, —C(=O)—O—, —C(=O)—, —O—C(=O)—O—, —C(=O)—NH—, —NR$^{04}$— (R$^{04}$ indicates a substituent group like an alkyl group and an acyl group), —S—, —S(=O)$_2$—, —S(=O)$_2$—O—, a group represented by the formula —C(=O)—O—R$^{08}$—, a group represented by the formula —O—R$^{08}$—, a group represented by the formula —R$^{09}$—O—, and a group represented by the formula —R$^{09}$—O—R$^{08}$—.

R$^{08}$ represents a divalent hydrocarbon group which may have a substituent group, and it is preferably a linear or branched aliphatic hydrocarbon group, and more preferably an alkylene group or an alkylalkylene group. Particularly preferred examples of the alkylene group include a methylene group and an ethylene group. The alkyl group in an alkylalkylene group is preferably a linear alkyl group having 1 to 5 carbon atoms, more preferably a linear alkyl group having 1 to 3 carbon atoms, and most preferably an ethyl group. $R^{o8}$ may or may not contain a fluorine atom.

$R^{o9}$ represents a divalent aromatic cyclic group. Preferably, it is a divalent aromatic hydrocarbon group in which one hydrogen atom is further removed from the nucleus of an aromatic hydrocarbon of a monovalent aromatic hydrocarbon group. Most preferably, it is a group obtained by further removing one hydrogen atom from a naphthyl group.

In the formula (f1), the structure of $R^{f1}$ may be any one of a linear, branched, or cyclic type. Preferably, it is a linear or a branched type. In $R^{f1}$, the organic group preferably has 1 to 20 carbon atoms, more preferably 1 to 15 carbon atoms, particularly preferably 1 to 10 carbon atoms, and most preferably 1 to 5 carbon atoms.

In $R^{f1}$, the fluorination ratio is preferably 25% or more, more preferably 50% or more, and particularly preferably 60% or more.

The "fluorination ratio" means the ratio of (number of fluorine atoms) per (total number of hydrogen atoms and fluorine atoms) in an organic group.

Preferred examples of $R^{f1}$ include a methyl group, an ethyl group, and a fluorohydrocarbon group which may have a substituent group.

With regard to the fluorohydrocarbon group which may have a substituent group for $R^{f1}$, the hydrocarbon group may be an aliphatic hydrocarbon group or an aromatic hydrocarbon group. Preferably, it is an aliphatic hydrocarbon group. $R^{f1}$ is preferably a saturated fluorohydrocarbon group or an unsaturated fluorohydrocarbon group. Particularly preferably, it is a saturated fluorohydrocarbon group, i.e., a fluoroalkyl group.

Examples of the fluoroalkyl group include a group in which part or all of hydrogen atoms of the following unsubstituted alkyl group are substituted with a fluorine atom. The fluoroalkyl group may be a group in which part of hydrogen atoms of the unsubstituted alkyl group are substituted with a fluorine atom or a group in which all of hydrogen atoms of the unsubstituted alkyl group are substituted with a fluorine atom (i.e., perfluoroalkyl group). The unsubstituted alkyl group may be any one of a linear type, a branched type, or a cyclic type. It may be also a combination of a linear or branched alkyl group and a cyclic alkyl group.

The unsubstituted linear alkyl group preferably has 1 to 10 carbon atoms, and more preferably 1 to 8 carbon atoms. Specific examples thereof include a methyl group, an ethyl group, an n-propyl group, an n-butyl group, an n-pentyl group, an n-hexyl group, an n-heptyl group, an n-octyl group, an n-nonyl group, and an n-decyl group.

The unsubstituted branched alkyl group preferably has 3 to 10 carbon atoms, more preferably 3 to 8 carbon atoms. Preferred examples of the branched alkyl group include a tertiary alkyl group. Examples of the unsubstituted cyclic alkyl group include a group obtained by removing one hydrogen atom from a monocycloalkane or a polycycloalkane like bicycloalkane, tricycloalkane, and tetracycloalkane. Specific examples thereof include a monocycloalkyl group like a cyclopentyl group and a cyclohexyl group; and a polycycloalkyl group like an adamantyl group, a norbornyl group, an isobornyl group, a tricyclodecyl group, and a tetracyclododecyl group. Examples of the combination of an unsubstituted linear or branched alkyl group and a cyclic alkyl group include a group in which a cyclic alkyl group is bonded, as a substituent group, to a linear or branched alkyl group and a group in which a linear or branched alkyl group is bonded, as a substituent group, to a cyclic alkyl group. Examples of the substituent group which may be contained in the fluorohydrocarbon group include a lower alkyl group having 1 to 5 carbon atoms.

As for the component (F), the fluorine-containing polymer compound (F1-1) with the following constituent unit is preferable, in particular.

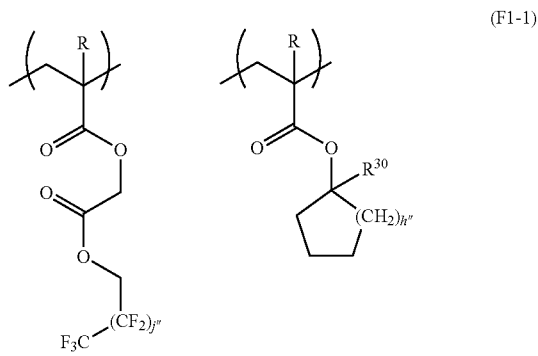

(F1-1)

[in the formula (F1-1), R represents a hydrogen atom, an alkyl group having 1 to 5 carbon atoms or a halogenated alkyl group having 1 to 5 carbon atoms, and plural Rs may be identical with each other, or may be different from each other. j" represents an integer of from 0 to 3, $R^{30}$ represents an alkyl group having 1 to 5 carbon atoms, and h" represents an integer of from 1 to 6].

In the formula (F1-1), R is the same as R described for the aforementioned constituent unit (a1). j" is preferably 0 to 2, more preferably 0 or 1, and most preferably 0. $R^{30}$ is the same as the lower alkyl group for R, and it is particularly preferably a methyl group or an ethyl group. Most preferably, it is an ethyl group. h" is preferably 3 or 4, and most preferably 4.

The weight average molecular weight (Mw) of the component (F) (when converted into polystyrene based on gel permeation chromatography) is not particularly limited. It is preferably 2000 to 100000, more preferably 3000 to 100000, still more preferably 4000 to 50000, and most preferably 5000 to 50000. When the component (F) having such weight average molecular weight (Mw) is used, the component (F) can be easily dissolved in the resist composition and also a pattern with favorable cross-section shape can be easily formed by using the resist composition obtained therefrom. In addition, the polydispersity (Mw/Mn) of the component (F) is preferably 1.0 to 5.0, more preferably 1.0 to 3.0, and particularly preferably 1.2 to 2.8.

The component (F) may be used alone, or two or more kinds thereof may be used in combination. Content of the component (F) in the resist composition is preferably 0.1 to 50 parts by weight, more preferably 0.1 to 40 parts by weight, particularly preferably 0.3 to 30 parts by weight, and most preferably 0.5 to 15 parts by weight per 100 parts by weight of the component (A). When the component (F) is used in an amount of this range, it can have hydrophobicity desired for liquid immersion light exposure and also a resist composition with excellent lithographic characteristics can be easily obtained.

(Other Optional Components)

If desired, the resist composition may further contain miscible additives, for example, an additional resin for improving performance of a resist film, a surface active agent for enhancing coatability, a dissolution inhibitor, a plasticizer, a stabilizer, a colorant, a halation inhibitor, or a dye may be appropriately added to and contained in the resist composition.

Method for Forming Resist Film

Figure 1B:
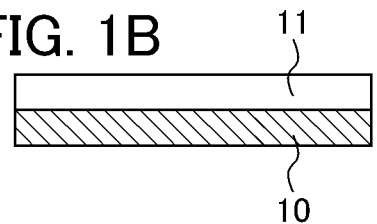
FIG. 1B is a view showing the resist film formed on the substrate.

The method for forming a resist film is explained in view of FIGS. 1A and 1B. By coating the resist composition containing the components explained above on a substrate 10, a resist film 11 is formed on the substrate 10. The method for coating the resist composition on the substrate 10 is not specifically limited, if the resist composition can be coated well with desired thickness on a substrate. Specific example of the coating method include a spin coating method, a spray method, a roller coating method, and a dipping method. The spin coating method is more preferable.

After forming the resist film 11 by coating the resist composition on the substrate 10, the resist film 11 on the substrate is heated (i.e., prebaking), if necessary. Accordingly, a film with an insoluble solvent removed therefrom can be evenly formed. The temperature for prebaking is not specifically limited. However, it is preferably 50° C. to 160° C., and more preferably 60° C. to 140° C.

Type of the substrate 10 for forming a film is not specifically limited in the present invention. Examples of the substrate 10 include an inorganic substrate like silicon, $SiO_2$, and SiN and a coated inorganic substrate like SOG, that are generally used for a process for fabricating semiconductors like IC, a process for fabricating a circuit substrate like thermal head, and liquid crystal, and also a lithography process for other photoapplications.

It is also possible to coat and form an anti-reflective film (not illustrated) on the substrate 10 before forming the resist film 11. As an anti-reflective film, both an inorganic film type like titan, titan dioxide, titan nitride, chrome oxide, carbon, and amorphous silicon, and an organic film type consisting of a light absorbing agent and a polymer material can be used. Further, as an organic anti-reflective film, commercially available organic anti-reflective films like DUV-30 series or DUV-40 series manufactured by Brewer Science, Inc. and AR-2, AR-3, and AR-5 manufactured by Shipley can be also used.

Light Exposure Step

Figure 1C:
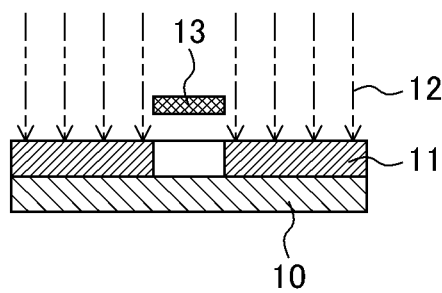
FIG. 1C is a view showing the selective light exposure of the resist film formed on the substrate.
Figure 1D:
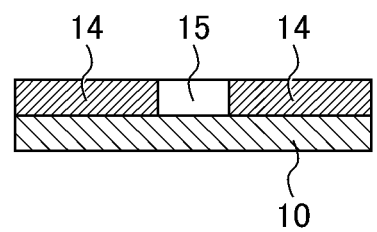
FIG. 1D is a view showing the exposed section and the unexposed section formed in the resist film.

The light exposure step is explained in view of FIGS. 1C and 1D. During the light exposure step, selective light exposure of the rest film 11 formed on the substrate 10 is performed by using active energy ray 12 like UV ray or electronic beam. The light exposure method is not specifically limited, and it can be appropriately selected from various methods which have been adopted as a light exposure method for the resist film 11. Examples of the preferred method include a method including irradiating active energy ray 12 like UV ray or electronic beam on the resist film 11 through a predetermined mask 13.

According to the light exposure, an exposed section 14 and an unexposed section 15 are formed in the resist film 11. Since a resist composition containing (A) a base material having decreased solubility in a developer liquid containing an organic solvent according to an action of an acid and (B) a compound which generates an acid when irradiated with actinic rays or radiation is used during the resist film forming step, the exposed section 14 has decreased solubility in a developer liquid containing an organic solvent according to an action of an acid that is generated by the component (B). Meanwhile, as the unexposed section 15 is not irradiated with the active energy ray 13, it remains in a state in which it can be easily dissolved in a developer liquid containing an organic solvent.

Examples of the active energy ray 12 include infrared light, visible light, UV light, far UV light, X ray, and electronic beam. Of these, the far UV light having wavelength of 250 nm or less, preferably 220 nm or less, and more preferably 1 to 200 nm is preferable. Specific examples of the far UV light include ArF excimer laser, $F_2$ excimer laser, and EUV (13 nm).

For the light exposure step, a liquid immersion exposure method in which the space between an optical lens section and a resist film is filled with a liquid immersion media for carrying out the light exposure may be adopted. The liquid immersion media is not specifically limited, if it has reflective index which is higher than that of air but lower than that of the resist film used. Examples of the liquid immersion media include water (pure water or de-ionized water), a liquid having high reflective index by adding various additives to water, a fluorine-based inert liquid, a silicon-based inert liquid, and a hydrocarbon liquid. Liquid immersion media having high reflective index that are expected to be developed in the near future can be also used. Examples of the fluorine-based inert liquid include a liquid containing a fluorine compound as a main component like $C_3HCl_2F_5$, $C_4F_9OCH_3$, $C_4F_9OC_2H_5$, and $C_5H_3F_7$. When exposure light with wavelength of 193 nm (ArF excimer laser or the like) is used, from the viewpoint of cost, safety, environmental concerns, and universal usability or the like, water (pure water or de-ionized water) is preferable. When exposure light with wavelength of 157 nm ($F_2$ excimer laser or the like) is used, a fluorine-based inert solvent is preferable.

It is preferable to perform baking (PEB) after completing light exposure. Temperature for PEB is not specifically limited, if a favorable resist pattern is obtained. In general, it is from 40° C. to 160° C.

Developing Step

Figure 1E:
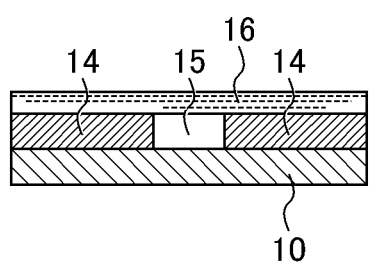
FIG. 1E is a view showing the removal of the unexposed section in the resist film by performing development by way of the developer liquid.
Figure 1F:
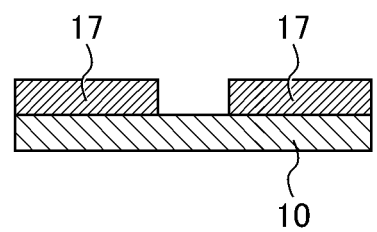
FIG. 1F is a view showing the resist pattern formed on the substrate.

The developing step is explained in view of FIGS. 1E and 1F. The developing step is a step of forming a resist pattern 17 by developing the resist film 11 after light exposure is developed with a developer liquid 16 containing an organic solvent. As described above, the exposed section 14 in the resist film 11 has lowered solubility in the developer liquid containing an organic solvent while the unexposed section 15 is easily dissolved in the developer liquid containing an organic solvent. For such reasons, by contacting the resist film 11 after light exposure with the developer liquid 16, the unexposed section 15 is dissolved in the developer liquid 16 while the exposed section 14 is developed as the resist pattern 17 without being dissolved in the developer liquid 16.

It is desirable that the organic solvent contained in the developer liquid 16 can dissolve the unexposed section 15 (the component (A) before light exposure), and it may be appropriately selected from known organic solvents. Specifically, a polar solvent like a ketone solvent, an ester solvent, an alcohol solvent, an amide solvent, and an ether solvent, or a hydrocarbon solvent can be used.

The ketone solvent is an organic solvent which contains C—C(=O)—C in the structure. The ester solvent is an organic solvent which contains C—C(=O)—O—C in the structure. The alcohol solvent is an organic solvent which contains an alcoholic hydroxyl group in the structure and the expression "alcoholic hydroxyl group" means a hydroxyl group bonded to the carbon atom of an aliphatic hydrocarbon group. The amide solvent is an organic solvent which contains an amide group in the structure. The ether solvent is an organic solvent which contains C—O—C in the structure. In the organic solvent, an organic solvent having in the structure two or more functional groups which characterize each solvent is also present. For such case, it is treated as any kind of solvent which has the functional group contained in the organic solvent. For example, diethylene glycol monomethyl ether is treated as both the alcohol solvent and the ether solvent among the classifications described above. Further, the hydrocarbon solvent indicates a hydrocarbon solvent consisting of hydrocarbons without any substituent group (i.e., no group or atom other than a hydrogen atom and a hydrocarbon group).

Specific examples of each solvent are as follows. Examples of the ketone solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and γ-butyrolactone.

Examples of the ester solvent include, as a chain type ester solvent, methyl acetate, butyl acetate, ethyl acetate, isopropyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxy propionate, ethyl 2-hydroxy propionate, methyl-3-methoxypropionate, ethyl-3-methoxypropionate, ethyl-3-ethoxypropionate, and propyl-3-methoxypropionate. Further, examples of the cyclic ester solvent include lactones like γ-butyrolactone.

As for the ester solvent, the solvent represented by the following formula (S1) or the solvent represented by the following formula (S2) is preferably used. The solvent represented by the following formula (S1) is more preferably used. Alkyl acetate is particularly preferably used. Butyl acetate is most preferably used.

Examples of the alcohol solvent include a monohydric alcohol like methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, and 3-methoxy-1-butanol; a glycol solvent like ethylene glycol, diethylene glycol, and triethylene glycol; and a glycol ether solvent containing a hydroxyl group like ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Of these, the glycol ether solvent is preferable.

Examples of the ether solvent include a glycol ether solvent containing the aforementioned hydroxyl group; a glycol ether solvent containing no hydroxyl group like propylene glycol dimethyl ether, propylene glycol diethyl ether, diethylene glycol dimethyl ether, and diethylene glycol diethyl ether; and dioxane, tetrahydrofuran, anisole, perfluoro-2-butyl tetrahydrofuran, perfluorotetrahydrofuran, and 1,4-dioxane. Of these, a glycol ether solvent including a glycol ether solvent containing a hydroxyl group and a glycol ether solvent containing no hydroxyl group is preferable.

Examples of the amide solvent include N-methyl-2-pyrrolidone, N,N-dimethyl acetamide, N,N-dimethyl formamide, hexamethyl phosphorictriamide, and 1,3-dimethyl-2-imidazolidonone.

Examples of the hydrocarbon solvent include an aliphatic hydrocarbon solvent like pentane, hexane, octane, decane, 2,2,4-trimethylpentane, 2,2,3-trimethylhexane, perfluorohexane, and perfluoroheptane; and an aromatic hydrocarbon solvent like toluene, xylene, ethylbenzene, propylbenzene, 1-methyl propylbenzene, 2-methyl propylbenzene, dimethylbenzene, diethylbenzene, ethyl methylbenzene, trimethylbenzene, ethyl dimethylbenzene, and dipropylbenzene. Of these, the aromatic hydrocarbon solvent is preferable.

The organic solvent may be used alone, or two or more kinds thereof may be used in combination. Further, it may be used as a mixture with water or an organic solvent other than those described above.

The organic solvent used for the organic developer liquid is preferably a solvent represented by the following formula (S1) or (S2).

$$R^{00}\text{---}C(\!=\!O)\text{---}O\text{---}R^{01} \quad (S1)$$

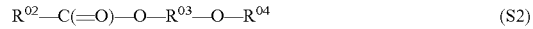

$$R^{02}\text{---}C(\!=\!O)\text{---}O\text{---}R^{03}\text{---}O\text{---}R^{04} \quad (S2)$$

[in the formula (S1), $R^{00}$ and $R^{01}$ each independently represent a hydrogen atom, an alkyl group, an alkoxy group, an alkoxycarbonyl group, a carboxy group, a hydroxyl group, a cyano group, or a halogen atom, and $R^{00}$ and $R^{01}$ may bind to each other to form a ring. In the formula (S2), $R^{02}$ and $R^{04}$ each independently represent a hydrogen atom, an alkyl group, an alkoxy group, an alkoxycarbonyl group, a carboxy group, a hydroxyl group, a cyano group, or a halogen atom, $R^{02}$ and $R^{04}$ may bind to each other to form a ring, and $R^{03}$ represents an alkylene group].

The alkyl group for $R^{00}$ and $R^{01}$ in the formula (S1) is any one of a linear, branched, or cyclic type. The linear or branched type is preferable, and the carbon atom number thereof is preferably from 1 to 5. The alkyl group may have a substituent group. Examples of the substituent group include a hydroxyl group, a carboxy group, and a cyano group.

Examples of the alkyl group in the alkoxy group or alkoxycarbonyl group are the same as the alkyl group described above.

Examples of the halogen atom include a fluorine atom, a chlorine atom, a bromine atom, and an iodine atom. A fluorine atom is preferable.

It is preferable that $R^{00}$ and $R^{01}$ each are a hydrogen atom or an alkyl group.

Specific examples of the solvent represented by the formula (S1) (herein below, it may be also referred to as the solvent (S1)) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxy propionate, ethyl 2-hydroxy propionate, and γ-butyrolactone.

Among the solvents described above, a solvent in which $R^{00}$ and $R^{01}$ are an unsubstituted alkyl group is preferable as the solvent (S1). Alkyl acetate is more preferable. Butyl acetate is particularly preferable.

$R^{02}$ and $R^{04}$ in the formula (S2) each are the same as $R^{00}$ and $R^{01}$ described above.

The alkylene group for $R^{03}$ may be any one of a linear, branched, or cyclic type. The linear or branched type is preferable, and the carbon atom number thereof is preferably from 1 to 5. The alkylene group may have a substituent group. Examples of the substituent group include a hydroxyl group, a carboxy group, and a cyano group. Further, when the alkylene group has the carbon atom number of 2 or more, an oxygen atom (—O—) may be present between carbon atoms of the alkylene group.

Specific examples of the solvent represented by the formula (S2) (herein below, it may be also referred to as the solvent (S2)) include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxy acetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, and 4-methyl-4-methoxypentyl acetate.

Any one of the solvents (S1) and (S2) may be used, or two or more thereof are used as a mixture. Further, the solvents (S1) and (S2) may be used alone, or two or more kinds thereof may be used in combination. Further, at least one selected from the solvents (S1) and (S2) may be mixed with other solvent and used.

Other solvent is not specifically limited if it can be admixed with the solvent (S1) or (S2) without separation. It can be appropriately selected from an ester solvent, a ketone solvent, an alcohol solvent, an amide solvent, an ether solvent, and a hydrocarbon solvent described above, for example. Of these, a glycol ether solvent like a glycol ether solvent containing a hydroxyl group and a glycol ether solvent containing no hydroxyl group (herein below, it may be also referred to as solvent (S3)) is preferable. A glycol ether solvent containing a hydroxyl group like propylene glycol monomethyl ether is more preferable.

When the solvent (S1) and the solvent (S2) are admixed with each other, the weight ratio of (S1)/(S2) is preferably 99/1 to 50/50, more preferably 95/5 to 60/40, and still more preferably 90/10 to 70/30.

When the solvent (S1) and the solvent (S3) are admixed with each other, the weight ratio of (S1)/(S3) is preferably 99/1 to 50/50, more preferably 95/5 to 60/40, and still more preferably 90/10 to 70/30.

When the solvent (S1), the solvent (S2), and the solvent (S3) are admixed with one another, the weight ratio of (S1)/(S2)/(S3) is preferably 90/0.1/9.9 to 50/15/35, more preferably 85/0.5/14.5 to 60/10/30, and still more preferably 80/1/19 to 70/5/25.

When two or more kinds of the solvent (S1) are mixed, it is preferable to mix a chain type ester solvent and a cycle type ester solvent. For such case, the weight ratio (chain type/cycle type) is preferably 99.9/0.1 to 80/20, more preferably 99/1 to 85/15, and still more preferably 98/2 to 90/10.

As for the organic solvent used for the developer liquid 16, an organic solvent containing no halogen atom is preferably used from the viewpoint of lowering the cost for a solvent used for development. Content of an organic solvent containing no halogen atom in the total weight of the organic developer liquid is 60% by weight or more, preferably 80% by weight or more, more preferably 90% by weight or more, and it may be 100% by weight. Boiling point of the organic solvent used for the organic developer liquid is preferably 50° C. or higher and lower than 250° C. The ignition point of the organic solvent used for the organic developer liquid is preferably 200° C. or higher.

In the developer liquid 16, a known additive may be added, if necessary. Examples of the additive include a surface active agent. The surface active agent is not specifically limited, and examples thereof that can be used include an ionic or non-ionic fluorine and/or silicon surface active agent.

Examples of the commercially available surface active agent that can be used include a fluorine surface active agent or a silicon surface active agent including EFTOP EF301 and EF303 (trade names, manufactured by SHINAKIDA KASEI), FLORADO FC430 and 431 (trade names, manufactured by Sumitomo 3M Limited), MEGAFAC F171, F173, F176, F189, and R08 (trade names, manufactured by DIC Corporation), SURFLON S-382, SC101, 102, 103, 104, 105, and 106 (trade names, manufactured by ASAHI GLASS CO., LTD.), and TROYSOL S-366 (trade names, manufactured by Troy Chemical Co.). Further, the polysiloxane polymer KP-341 (trade name, manufactured by Shin-Etsu Chemical Co., Ltd.) can be also used as a silicon surface active agent.

Further, as a surface active agent, a surface active agent in which a polymer having a fluoroaliphatic group that is derived from a fluoroaliphatic compound produced by telomerization method (also referred to as telomer method) or oligomerization method (also referred to as oligomer method) may be also used in addition to those well known in the field as described above.

Preferred examples of the polymer having a fluoroaliphatic group include a copolymer of a monomer having a fluoroaliphatic group and (poly(oxyalkylene))acrylate and/or (poly (oxyalkylene))methacrylate, and it may have a random distribution or block copolymerization. Further, examples of the poly(oxyalkylene) group include poly(oxyethylene) group, a poly(oxypropylene) group, and a poly(oxybutylene) group. It may be also a unit with alkylene having different chain length in a chain with the same chain length like poly(block conjugate of oxyethylene and oxypropylene and oxyethylene) or poly(block conjugate of oxyethylene and oxypropylene) group. Further, copolymer of a monomer having a fluoroaliphatic group and (poly(oxyalkylene))acrylate (or methacrylate) may be a ternary or higher copolymer which is obtained by simultaneous copolymerization of two or more different types of a monomer having a fluoroaliphatic group or two or more different types of (poly(oxyalkylene))acrylate (or methacrylate) as well as a binary copolymer.

Examples of the commercially available surface active agent include MEGAFAC F178, F-470, F-473, F-475, F-476, and F-472 (trade names, manufactured by DIC Corporation). Further examples include a copolymer of acrylate (or methacrylate) having a $C_6F_{13}$ group and (poly(oxyalkylene))acrylate (or methacrylate), a copolymer of acrylate (or methacrylate) having a $C_6F_{13}$ group and (poly(oxyethylene))acrylate (or methacrylate) and (poly(oxypropylene))acrylate (or methacrylate), a copolymer of acrylate (or methacrylate) having a $C_8F_{17}$ group and (poly(oxyalkylene))acrylate (or methacrylate), a copolymer of acrylate (or methacrylate) having a $C_8F_{17}$ group and (poly(oxyethylene))acrylate (or methacrylate) and (poly(oxypropylene))acrylate (or methacrylate).

As for the surface active agent, a non-ionic surface active agent is preferable. A fluorine-based surface active agent or a silicon surface active agent is more preferable.

When the surface active agent is added, the addition amount is typically 0.001 to 5% by weight, preferably 0.005 to 2% by weight, and more preferably 0.01 to 0.5% by weight per the total weight of the developer liquid 16.

The method for developing the resist pattern 17 by using the developer liquid 16 is not specifically limited, and it may be carried out after appropriately selected from known developing methods. Preferred developing methods include a method of dipping the substrate 10 having the resist film 11, which obtained after light exposure, in the developer liquid 16 for a certain period of time (dipping method), a method of accumulating the developer liquid 16 on a surface of the resist film 11 obtained after light exposure by taking advantage of surface tension and keeping it for a certain period of time (paddle method), a method of spraying the developer liquid on a surface of the resist film 11 obtained after light exposure (spray method), and a method of applying continuously the developer liquid 16 to the substrate 10 rotating at a constant speed while scanning a nozzle for applying the developer liquid at a constant speed to the resist film 11 obtained after light exposure (dynamic dispenser method).

Further, after the developing step, it is also possible to carry out a step of terminating the development while the developer liquid 16 is replaced with other solvent.

After the developing step, the resist pattern 17 may be cleaned with a rinse liquid containing an organic solvent.

The rinse liquid used for the rinsing step is not specifically limited if it does not dissolve the resist pattern, and a solution containing a common organic solvent may be used. Examples of the organic solvent which is usable as a rinse liquid are the same as the organic solvent that may be contained in the developer liquid 16. The rinse liquid may contain plural organic solvents and also contain an additional organic solvent other than those described above.

Water content ratio in the rinse liquid is preferably 10% by weight or less, more preferably 5% by weight or less, and particularly preferably 3% by weight or less. By having the water content ratio of 10% by weight or less, favorable development characteristics can be obtained.

To the rinse liquid, an appropriate amount of a surface active agent may be added, and used.

For the rinsing step, the resist pattern 17 on the substrate 10 obtained after development is subjected to a cleaning treatment which uses the rinse liquid containing the aforementioned organic solvent. The method for cleaning treatment is not specifically limited, and it may be carried out in the same manner as the development using the developer liquid 16.

Coating Film Forming Step

Figure 1G:
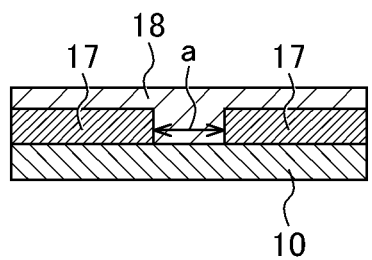
FIG. 1G is a view showing the coating film formed on the resist pattern.

The coating film forming step is explained in view of FIGS. 1F and 1G. According to the coating film forming step, the coating agent for fining a pattern containing (D) a resin (herein below, also described as "component (D)") and ($C^2$) a solvent composed of an organic solvent only (herein below, also described as "component ($C^2$)") is coated on the resist pattern 17, so as to form a coating film 18.

By forming the coating film 18 on the resist pattern 17 using a coating agent for pattern fining containing the component (D) and the component ($C^2$) and performing a below-described pattern narrowing step on the resist pattern 17 having the coating film 18 formed thereon, favorable fining of the resist pattern 17 can be achieved.

Since the coating agent for pattern fining contains the component ($C^2$), which is a solvent composed of an organic solvent only, even when the aforementioned resist film forming step, developing step, or coating of a coating agent for pattern fining is performed using the same cup, precipitation of a resin or the like caused by mixing a developer liquid in which the resist composition is dissolved with a coating agent for pattern fining is unlikely to occur within the cup. For such reasons, developing of a resist pattern and coating of a resist pattern using a coating agent for pattern fining can be performed by using the same cup, and therefore through-put can be improved.

Further, as the coating agent contains a solvent composed of ($C^2$) an organic solvent only and an organic solvent has relatively small latent heat of evaporation compared to water, it can be easily evaporated within a short time. As such, when a coating film 18 is heated during the pattern narrowing step, the coating film can be shrunken within a short time. Narrowing of a resist pattern 17 during the pattern narrowing step is a result of deformation of a resist pattern, which is caused by internal stress occurring in the coating film 18 in accordance with shrinking of the coating film 18. In such case, the internal stress may be generated in the coating film 18 within a short time, and thus high force is easily applied to the resist pattern 17, and as a result, the resist pattern 17 can be narrowed well.

Hereinafter, the component (D) and the component ($C^2$) will be described in order.

[Component (D)]

The resin as the component (D) is not particularly limited, if it is dissolved well in a solvent composed of an organic solvent only as the component ($C^2$) and can form a homogeneous solution.

Specific examples of the resin which may be used as the component (D) include polyolefin such as polyethylene and polypropylene; novolac resin; polyester; polycarbonate; polyamide; polyurethane; and polyether sulfone.

Further, a resin composed of one or more constituent units selected from a constituent unit (a1) derived from an acrylic acid ester containing an acid-degradable group, which is a constituent unit contained in an acrylic acid ester derived resin (that is, resin (a)) which is useful as a resin included in the aforementioned resist composition as the component (A), a constituent unit (a0) derived from an acrylic acid ester, which contains a —$SO_2$— moiety-containing cyclic group, a constituent unit (a2) derived from an acrylic acid ester, which contains a lactone-containing cyclic group, a constituent unit (a3) derived from an acrylic acid ester containing a polar group-containing aliphatic hydrocarbon group, a constituent unit (a4) derived from hydroxystyrene or a derivative thereof, and a constituent unit (a5) derived from styrene or a derivative thereof may be also preferably used as the component (D).

Among those resins, from the viewpoint of obtaining good film forming property and good pattern fining effect of a coating agent for pattern fining, a resin composed of one or more constituent units selected from a group consisting of the constituent units (a4) and (a5), a resin composed of one or more constituent units selected from the constituent unit (a3), and a novolac resin are preferable.

Preferred examples of the resin composed of one or more constituent units selected from a group consisting of the constituent units (a4) and (a5) include a resin composed of a constituent unit derived from polystyrene or p-hydroxystyrene and a constituent unit derived from styrene. In the resin composed of a constituent unit derived from p-hydroxystyrene and a constituent unit derived from styrene, ratio of each constituent unit is not specifically limited if the purpose of the invention is not negatively affected. However, it is preferable that the ratio of the constituent unit derived from p-hydroxystyrene is 50% by mol or less, and more preferably 30% by mol or less.

Preferred examples of the resin composed of one or more constituent units selected from the constituent unit (a3) include a resin composed of the constituent unit represented by the following formula (a3-3) and the constituent unit represented by the following formula (a3-5). In the formulae (a3-3) and (a3-5), R is a hydrogen atom, an alkyl group having 1 to 5 carbon atoms, or a halogenoalkyl group having 1 to 5 carbon atoms, j is an integer of from 1 to 3, t' is an integer of from 1 to 3, l' is an integer of from 1 to 5, and s' is an integer of from 1 to 3.

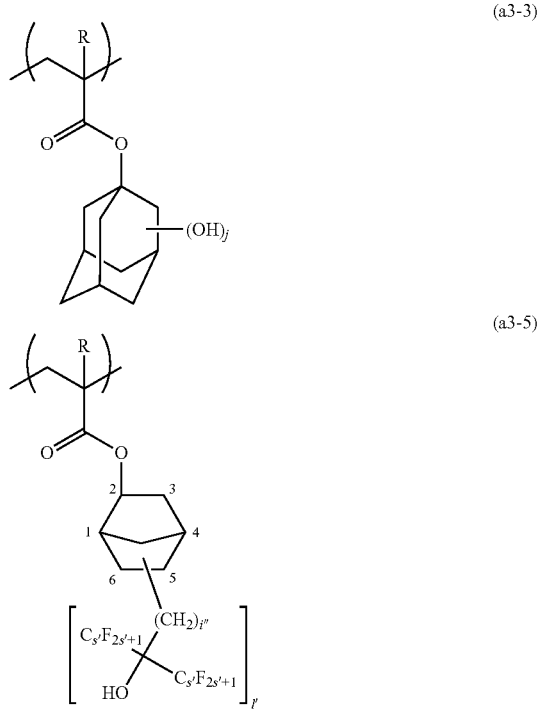

Novolac resin is not particularly limited and a resin obtained by reacting one or more compounds selected from an aromatic compound having a phenolic hydroxy group and aldehydes such as formaldehyde according to a common method can be used. Specific examples of the aromatic compound having a phenolic hydroxy group include phenol, m-cresol, p-cresol, 3,5-xylenol, resorcinol, catechol, bisphenol A, 1-naphthol, and 2-naphthol.

Among the novolac resins, from the viewpoint of solubility in the component ($C^2$), a novolac resin obtained from one or more phenol compounds selected from phenol, m-cresol, p-cresol, and 3,5-xylenol is preferable. A novolac resin obtained from m-cresol and p-cresol is more preferable.

Content of a resin as the component (D) in the coating agent for pattern fining is not particularly limited, if the resin as the component (D) is fully dissolved in an organic solvent as the component ($C^2$) and a coating film can be formed well on a resist film. Typically, content of the resin as the component (D) in the coating film forming agent is preferably 0.1 to 30% by mass, and more preferably 1 to 20% by mass per the mass of the coating film forming agent.

[Component ($C^2$)]

The component ($C^2$) is a solvent composed of an organic solvent only and it is not particularly limited if it can homogeneously dissolve the resin as the component (D). As for the component ($C^2$), one organic solvent may be used singly, or two or more types of organic solvent may be used in combination. Among the organic solvents used as the component ($C^2$), from the viewpoint of easily obtaining a coating agent for pattern fining which allows good pattern fining, a polar solvent such as a ketone solvent, an ester solvent, an alcohol solvent, an amide solvent, and an ether solvent, or a hydrocarbon solvent can be preferably used.

Preferred examples of a ketone solvent, an ester solvent, an alcohol solvent, an amide solvent, and an ether solvent are the same as the solvents that are specifically exemplified above as a solvent for a developer liquid used for the developing step. Among the solvents, from the viewpoint of having good film forming property and easily obtaining a coating agent for pattern fining which allows favorable pattern fining, ethyl acetate, butyl acetate, n-hexyl alcohol, and 2-heptanone are more preferable.

As described above, by homogeneously dissolving the resin as the component (D) in an organic solvent as the component ($C^2$), a coating agent for pattern fining can be obtained. Further, within the range that the purpose of the invention is not negatively affected, a surface active agent, a plasticizer, a stabilizer, a colorant, or the like may be included in the coating agent for pattern fining in addition to the component (D) and the component ($C^2$).

The method for forming the coating film 18 by coating a coating agent for pattern fining on the resist pattern 17 is not particularly limited as long as a coating film with predetermined film thickness can be formed. Specific examples of the method of forming the coating film 18 by using the coating agent for pattern fining include a spin coating method, a spray method, a roller coating method, and a dipping method. A spin coating method is more preferable.

After forming the coating film 18 on the resist pattern 17, pre-baking may be performed.

Pattern Narrowing Step

Figure 1H:
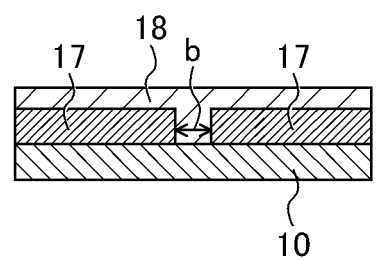
FIG. 1H is a view showing the narrowing of the resist pattern by heating the coating film.

The coating film forming step is explained in view of FIGS. 1G and 1H. According to the pattern narrowing step, the resist pattern 17 having the coating film 18 as illustrated in FIG. 1G is heated, so that the resist pattern 17 is narrowed as shown in FIG. 1H. Specifically, according to heat shrinking activity of the coating film 18, the resist pattern 17 in contact with the coating film 18 is broadened as much as the shrinkage of the coating film 18, and as a result, the resist pattern 17 becomes closer to each other, yielding narrowed pattern width. For such reasons, the space width a, which corresponds to a gap between resist patterns shown in FIG. 1G, becomes smaller than the space width b illustrated in FIG. 1H.

As for the pattern narrowing step, the temperature for heating the resist pattern 17 is not particularly limited, as long as it is a temperature at which the resist pattern 17 is not thermally deteriorated and also the resist pattern 17 can be narrowed to a desired level. Typically, the temperature for heating the resist pattern 17 is preferably 60 to 250° C. and more preferably 80 to 200° C. Further, the temperature for heating the resist pattern 17 is preferably higher than the boiling point of the organic solvent, which is the component ($C^2$) contained in the coating agent for pattern fining. More preferably, it is the temperature higher than the boiling point of the component ($C^2$). The temperature which is at least 5° C. higher than the boiling point of the component ($C^2$) is particularly preferable.

Meanwhile, the boiling point of the organic solvent is not based on consideration of boiling point increase in the coating agent for pattern fining. Instead, it is a boiling point of an organic solvent which is in a state of not containing any solute. Further, when two or more organic solvents are contained in the component ($C^2$), the boiling point of the organic solvent which has the highest boiling point among the organic solvents contained in the component ($C^2$) is taken as the boiling point of the component ($C^2$).

As for the pattern narrowing step, time for heating the resist pattern 17 is not particularly limited, as long as the resist pattern 17 is narrowed to a desired level. The heating time may vary depending on types of the component (D) and the component ($C^2$) contained in the coating agent for pattern fining. However, typically, it is preferably from 10 to 600 seconds, and more preferably 30 to 300 seconds.

As for the pattern narrowing step, heating the resist pattern 17 may be performed either at the constant temperature or by varying the temperature. From the viewpoint of easily suppressing deviation in narrowing, it is preferable that heating of the resist pattern 17 be performed at the constant temperature. Further, the expression "heating at the constant temperature" means that, except the temperature increase at the start of the heating and temperature decrease at the end of the heating, the resist pattern 17 is heated at the constant temperature. Further, in a case in which an unavoidable minor temperature change such as a change within the range of ±5° C. from the predetermined heating temperature occurs is also considered as the constant heating temperature.

Coating Film Removing Step

Figure 1I:
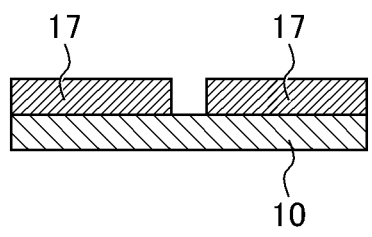
FIG. 1I is a view showing the resist pattern narrowed by the pattern narrowing step.

The coating film forming step is explained in view of FIGS. 1H and 1I. As illustrated in FIG. 1H, the resist pattern 17 narrowed by the pattern narrowing step has a shrunken coating film 18 on the surface thereof. As illustrated in FIG. 1G, the shrunken coating film 18 is, if necessary, removed from the surface of the resist pattern 17 during the coating film removing step. The method for removing the coating film 18 is not particularly limited. However, from the viewpoint of easy removal process, a method of dissolving the coating film 18 in the ($C^3$) organic solvent is preferable.

The ($C^3$) organic solvent used for the coating film removing step is not particularly limited, as long as it can dissolve well the coating film 18. Preferred examples of the ($C^3$) organic solvent are the same as the organic solvent as the component ($C^2$) which is contained in the coating agent for pattern fining. Further, as for the ($C^3$) organic solvent, two or more types of organic solvent may be used in combination.

The ($C^3$) organic solvent may be an organic solvent which is the same or different from the component ($C^2$) contained in the coating agent for pattern fining. However, the ($C^3$) organic solvent is preferably the same organic solvent as the component ($C^2$) that is contained in the coating agent for pattern fining.

Removing the coating film 18 by using the ($C^3$) organic solvent may be performed according to the same method as the aforementioned developing step.

EXAMPLES

Herein below, the present invention is explained in greater detail in view of the Examples, but it is evident that the present invention is not limited to the Examples.

Herein below, the components contained in the resist composition and the coating agent for pattern fining that are used in the Examples are explained.

Component (A)

As for the component (A) contained in the resist composition, a resin composed of the following constituent units was used. The number described in each constituent unit represents mol % of each constituent unit per total constituent units contained in the resin. Further, the weight average molecular weight of the resin composed of the following constituent units was 7000 and the polydispersity of the resin was 1.66.

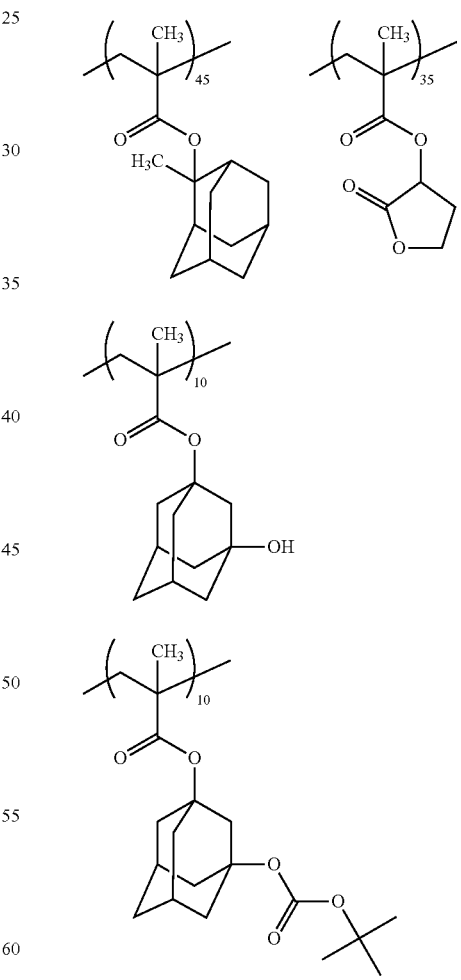

Component (B)

As for the photo-acid generator which is included as the component (B) in the resist composition, the compound with the following formula was used.

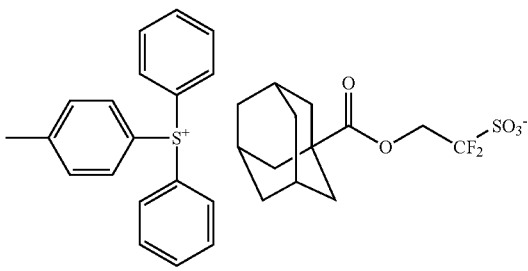

Component (C¹)

As for the solvent which is included as the component (C¹) in the resist composition, a mixture solvent of propylene glycol monomethyl ether acetate (PGMEA) and cyclohexanone (CH) in which content of PGMEA is 90% by weight and content of CH is 10% by weight was used.

Component (D)

As for the quencher which is included as the component (D) in the resist composition, the compound with the following formula was used.

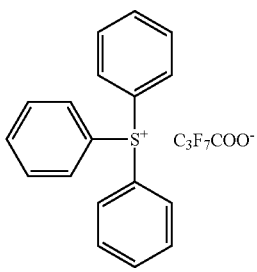

Component (E)

As for the organic carboxylic acid which is included as the component (E) in the resist composition, salicylic acid was used.

Component (F)

As for the resin containing a base-dissociable group which is the component (F) contained in the resist composition, a resin composed of the following constituent units was used. The number described in each constituent unit represents mol % of each constituent unit per total constituent units contained in the resin. Further, the weight average molecular weight of the resin composed of the following constituent units was 23000 and the polydispersity of the resin was 1.30.

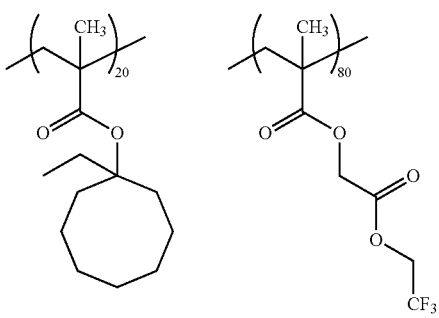

Further, as a component other than those described above, gamma butyrolactone was added to the resist composition. Composition of each component in the resist composition used for the Examples 1 to 7 and Reference example 1 is shown in the following Table 1.

TABLE 1

| Component | Amount used (Parts by weight) |
| --- | --- |
| Component (A) | 100 |
| Component (B) | 5 |
| Component (C) | 2580 |
| Component (D) | 3.5 |
| Component (E) | 0.1 |
| Component (F) | 4 |
| Gamma butyrolactone | 100 |

As a coating forming agent for pattern fining, a solution composed of 2% by weight of the resin listed in Table 2 and 98% by weight of the solvent listed in Table 2 was used. Type and weight average molecular weight of the resin listed in Table 2 are given as follows.

Resin A: novolac resin (m-cresol:p-cresol:3,5-xylenol=43 mol:24.5 mol:32.5 mol, weight average molecular weight: 2850)

Resin B: novolac resin (m-cresol:p-cresol=60 mol:40 mol, weight average molecular weight: 7600)

Resin C: novolac resin (m-cresol:p-cresol=60 mol:40 mol, weight average molecular weight: 12000)

Resin D: novolac resin (m-cresol:p-cresol=36 mol:64 mol, weight average molecular weight: 5000)

Resin E: polystyrene (weight average molecular weight: 2500)

Resin F: polystyrene (weight average molecular weight: 8000)

Resin G: p-hydroxystyrene-styrene copolymer (p-hydroxystyrene:styrene=20 mol:80 mol, weight average molecular weight 2500)

Resin H: p-hydroxystyrene-styrene copolymer (p-hydroxystyrene:styrene=25 mol:75 mol, weight average molecular weight 2500)

Resin I: acrylic acid ester copolymer with the following structural formula (weight average molecular weight: 7000)

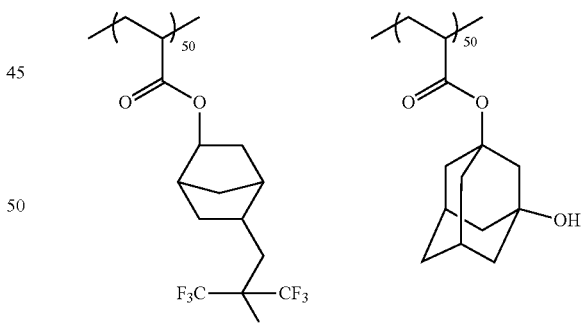

Examples 1 to 14

On a silicon wafer on which an anti-reflection film of ARC29A (trade name, manufactured by Brewer Science, Inc.) with film thickness of 82 nm was formed, the aforementioned resist composition was coated using a spinner followed by baking treatment for 60 seconds at 105° C. to form a resist film with film thickness of 100 nm. After that, thus-obtained photoresist film was subjected to light exposure to have a predetermined pattern through a mask having space width of 130 nm and pitch width of 260 nm using an exposure device (trade name: NSR-S302A, manufactured by Nikon Corporation) followed by heating treatment for 60 seconds at 95° C. Subsequently, the developing treatment was carried out for 16 seconds at 23° C. by using butyl acetate to form a line and space pattern.

Subsequently, on the line and space pattern, the coating agent for pattern fining consisting of 2% by weight of the resin listed in Table 2 and 98% by weight of a solvent was coated using a spinner to form the coating film with film thickness of 100 nm. The pattern on which the coating film is formed was heated for 60 seconds at 140° C. for shrinking the coating film. As a result, narrowing of the resist pattern was performed. Subsequently, the shrunken coating film was subjected to the treatment for 16 seconds at 23° C. by using a solvent for removing the coating film as listed in Table 2 to remove the coating film from the resist pattern. For each Example, the amount of decrease in pattern space width after removing the coating film relative to the pattern space width after the developing step was obtained. The evaluation results are given in Table 2.

TABLE 2

| | Coating agent for pattern fining | | Solvent used for removing | Amount of decrease of space width in the |
|---|---|---|---|---|
| | Resin | Solvent | coating film | pattern (nm) |
| Example 1 | A | Butyl acetate | Butyl acetate | 2.8 |
| Example 2 | B | Butyl acetate | Butyl acetate | 11.2 |
| Example 3 | C | Butyl acetate | Butyl acetate | 10.8 |
| Example 4 | D | Butyl acetate | Butyl acetate | 8.6 |
| Example 5 | E | Butyl acetate | Butyl acetate | 7.2 |
| Example 6 | F | Butyl acetate | Butyl acetate | 7.5 |
| Example 7 | G | Butyl acetate | Butyl acetate | 11.7 |
| Example 8 | H | Butyl acetate | Butyl acetate | 9.8 |
| Example 9 | I | Butyl acetate | Butyl acetate | 9.1 |
| Example 10 | B | Butyl acetate | n-Hexylalcohol | 12.0 |
| Example 11 | B | Butyl acetate | 2-Heptanone | 9.3 |
| Example 12 | B | 2-Heptanone | Butyl acetate | 6.5 |
| Example 13 | B | n-Hexylalcohol | Butyl acetate | 7.8 |
| Example 14 | B | Ethyl acetate | Butyl acetate | 5.0 |

According to Examples 1 to 9, it is found that favorable fining of the resist pattern can be achieved when a coating agent for pattern fining containing a resin and a solvent composed of an organic solvent only is coated on a resist pattern, which is formed by a predetermined process using a resist composition containing a base material having a solubility in a developer liquid containing an organic solvent that is decreased according to an action of an acid, a compound which generates an acid when irradiated with actinic rays or radiation, and an organic solvent, to form a coating film and the resist pattern having a coating film formed thereon is heated.

In addition, it is also found according to Examples 1 to 9 that, when various resins are used for the coating agent for pattern fining, favorable fining of the resist pattern can be achieved.

It is also found according to Examples 2, 10 and 11 that, when the coating agent is removed by using an organic solvent after fining the resist pattern, favorable fining of the resist pattern can be achieved regardless of the type of the organic solvent.

It is also found according to Examples 2, and 12 to 14 that, when various organic solvents are used for the coating agent for pattern fining, favorable fining of the resist pattern can be achieved.

What is claimed is:

1. A method for forming a fine pattern, comprising:
    forming a resist film by applying, on a substrate, a resist composition comprising (A) a base material having a solubility, in a developer liquid including an organic solvent, that decreases according to an action of an acid, (B) a compound which generates an acid when irradiated with actinic rays or radiation, and ($C^1$) an organic solvent;
    exposing the resist film;
    developing the exposed resist film using the developer liquid to form a resist pattern;
    forming a coating film by applying a coating agent on the resist pattern, the coating agent comprising (D) a resin and ($C^2$) a solvent composed of an organic solvent only, wherein no water is added to the coating agent; and
    narrowing the resist pattern by heating the resist pattern having a coating film formed thereon.

2. The method for forming the fine pattern according to claim 1, wherein ($C^2$) the organic solvent is at least one selected from the group consisting of a ketone solvent, an ester solvent, an alcohol solvent, an amide solvent, an ether solvent and a hydrocarbon solvent.

3. The method for forming the fine pattern according to claim 1, further comprising removing the coating film from the resist pattern after heating.

4. The method for forming a fine pattern according to claim 3, wherein the coating film is removed using ($C^2$) the organic solvent.

* * * * *